United States Patent
Kaihovirta et al.

(10) Patent No.: US 9,543,521 B2
(45) Date of Patent: Jan. 10, 2017

(54) ORGANIC SEMICONDUCTOR DEVICE AND PROCESS FOR ITS PRODUCTION

(71) Applicant: BASF SE, Ludwigshafen (DE)

(72) Inventors: Nikolai Kaihovirta, Umea (SE); Tero Mustonen, Binningen (CH); Subramanian Vaidyanathan, Basel (CH); Jean-Luc Budry, Courroux (CH)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 14/357,014

(22) PCT Filed: Nov. 14, 2012

(86) PCT No.: PCT/IB2012/056400
§ 371 (c)(1),
(2) Date: May 8, 2014

(87) PCT Pub. No.: WO2013/072853
PCT Pub. Date: May 23, 2013

(65) Prior Publication Data
US 2014/0306212 A1    Oct. 16, 2014

Related U.S. Application Data

(60) Provisional application No. 61/559,734, filed on Nov. 15, 2011.

(30) Foreign Application Priority Data

Nov. 15, 2011    (EP) .................................... 11189102

(51) Int. Cl.
C07D 209/48    (2006.01)
H01L 51/00    (2006.01)
(Continued)

(52) U.S. Cl.
CPC .......... *H01L 51/0036* (2013.01); *C08K 5/005* (2013.01); *C08K 5/132* (2013.01); *C08K 5/17* (2013.01);
(Continued)

(58) Field of Classification Search
CPC .................................................... C09B 57/004
(Continued)

(56) References Cited

U.S. PATENT DOCUMENTS 3,681,431 A    8/1972    Dexter et al.
4,619,956 A    10/1986    Susi
(Continued)

FOREIGN PATENT DOCUMENTS

DE    31 35 810 A1    4/1982
EP    0 057 160 A1    8/1982
(Continued)

OTHER PUBLICATIONS

International Search Report issued Apr. 4, 2013 in PCT/IB2012/056400.
(Continued)

*Primary Examiner* — Shane Fang
(74) *Attorney, Agent, or Firm* — Oblon, McClelland, Maier & Neustadt, L.L.P.

(57) ABSTRACT

An organic semiconductor device selected from organic diodes, organic field effect transistors, and devices comprising an organic diode and/or organic field effect transistor and a method of producing such a device are provided. The organic semiconductor device comprises at least one semiconducting layer based on a diketopyrrolopyrrole (DPP) polymer. The semiconducting layer may effectively be protected against degradation by radiation and/or oxidation by adding at least one stabilizing agent selected from hydroxybenzophenones, hydroxyphenyl benzotriazoles, oxalic acid
(Continued)

anilides, hydroxyphenyl triazines, hindered phenols and/or merocyanines to the DPP polymer layer. The stabilization is effective both during production and during usage of the device, while the device's electronic properties are retained. The stabilizing agent is preferably a UV absorbing agent or an antioxidant or anti-radical agent known from the field of organic polymer technology.

20 Claims, 7 Drawing Sheets

(51) Int. Cl.

| | |
|---|---|
| C08K 5/00 | (2006.01) |
| C08K 5/132 | (2006.01) |
| C08K 5/17 | (2006.01) |
| C08K 5/20 | (2006.01) |
| C08K 5/34 | (2006.01) |
| C08L 65/00 | (2006.01) |
| H01L 51/05 | (2006.01) |

(52) U.S. Cl.
CPC . C08K 5/20 (2013.01); C08K 5/34 (2013.01); H01L 51/0035 (2013.01); H01L 51/0043 (2013.01); C08G 2261/3223 (2013.01); C08G 2261/344 (2013.01); C08G 2261/592 (2013.01); C08G 2261/594 (2013.01); C08G 2261/596 (2013.01); C08G 2261/92 (2013.01); C08G 2261/95 (2013.01); C08L 65/00 (2013.01); H01L 51/0566 (2013.01)

(58) Field of Classification Search
USPC .......... 257/40, E51.012; 427/331; 528/367.8
See application file for complete search history.

(56) References Cited

U.S. PATENT DOCUMENTS

| | | | |
|---|---|---|---|
| 4,740,542 A | 4/1988 | Susi et al. | |
| 5,281,730 A | 1/1994 | Zambounis | |
| 5,464,697 A | 11/1995 | Zambounis | |
| 5,736,597 A | 4/1998 | Birbaum et al. | |
| 6,184,375 B1* | 2/2001 | Huglin et al. | 544/116 |
| 6,451,459 B1 | 9/2002 | Tieke et al. | |
| 2005/0255391 A1* | 11/2005 | Adam et al. | 430/7 |
| 2006/0252857 A1* | 11/2006 | Schafer et al. | 524/100 |
| 2008/0265216 A1 | 10/2008 | Hartmann et al. | |
| 2009/0302311 A1* | 12/2009 | Turbiez et al. | 257/40 |
| 2010/0222471 A1 | 9/2010 | Lorenzetti et al. | |
| 2011/0200540 A1 | 8/2011 | Wagner et al. | |
| 2011/0215313 A1 | 9/2011 | Dueggeli et al. | |
| 2011/0240981 A1 | 10/2011 | Dueggeli et al. | |
| 2012/0059140 A1 | 3/2012 | Hayoz et al. | |
| 2013/0200336 A1 | 8/2013 | Vaidyanathan et al. | |
| 2013/0306151 A1 | 11/2013 | Mustonen et al. | |

FOREIGN PATENT DOCUMENTS

| | | |
|---|---|---|
| EP | 0 200 190 A2 | 11/1986 |
| EP | 0 323 408 A1 | 7/1989 |
| EP | 0 434 608 A1 | 6/1991 |
| EP | 0 860 820 A1 | 8/1998 |
| EP | 1 596 445 | 11/2005 |
| EP | 1 979 406 A0 | 10/2008 |
| GB | 1 336 391 A | 11/1973 |
| WO | WO 96/28431 A1 | 9/1996 |
| WO | WO 03/052841 A1 | 6/2003 |
| WO | WO 2005/049695 A1 | 6/2005 |
| WO | WO 2007/088114 A1 | 8/2007 |
| WO | WO 2007/113107 A1 | 10/2007 |
| WO | WO 2008/000664 A1 | 1/2008 |
| WO | WO 2008/138580 A1 | 11/2008 |
| WO | WO 2009/003455 A1 | 1/2009 |
| WO | WO 2009/027258 A2 | 3/2009 |
| WO | WO 2009/084548 A1 | 7/2009 |
| WO | WO 2010/049321 A1 | 5/2010 |
| WO | WO 2010/049323 A1 | 5/2010 |
| WO | WO 2010/063609 A2 | 6/2010 |
| WO | WO 2010/108873 A1 | 9/2010 |
| WO | WO 2010/115767 A1 | 10/2010 |
| WO | WO 2010/136352 A1 | 12/2010 |
| WO | WO 2010/136353 A1 | 12/2010 |
| WO | WO 2011/078248 A1 | 6/2011 |
| WO | WO 2011/144566 A2 | 11/2011 |
| WO | WO 2011/161078 A1 | 12/2011 |
| WO | WO 2012/095796 A1 | 7/2012 |
| WO | WO 2013/113389 A1 | 8/2013 |

OTHER PUBLICATIONS

European Search Report issued Apr. 2, 2012 in Patent Application No. EP 11 18 9102.
International Preliminary Report on Patentability and Written Opinion issued May 20, 2014 in PCT/IB2012/056400.
Extended European Search Report issued Aug. 13, 2015 in Patent Application No. 12848955.6.

* cited by examiner

Fig. 3 (a, b)
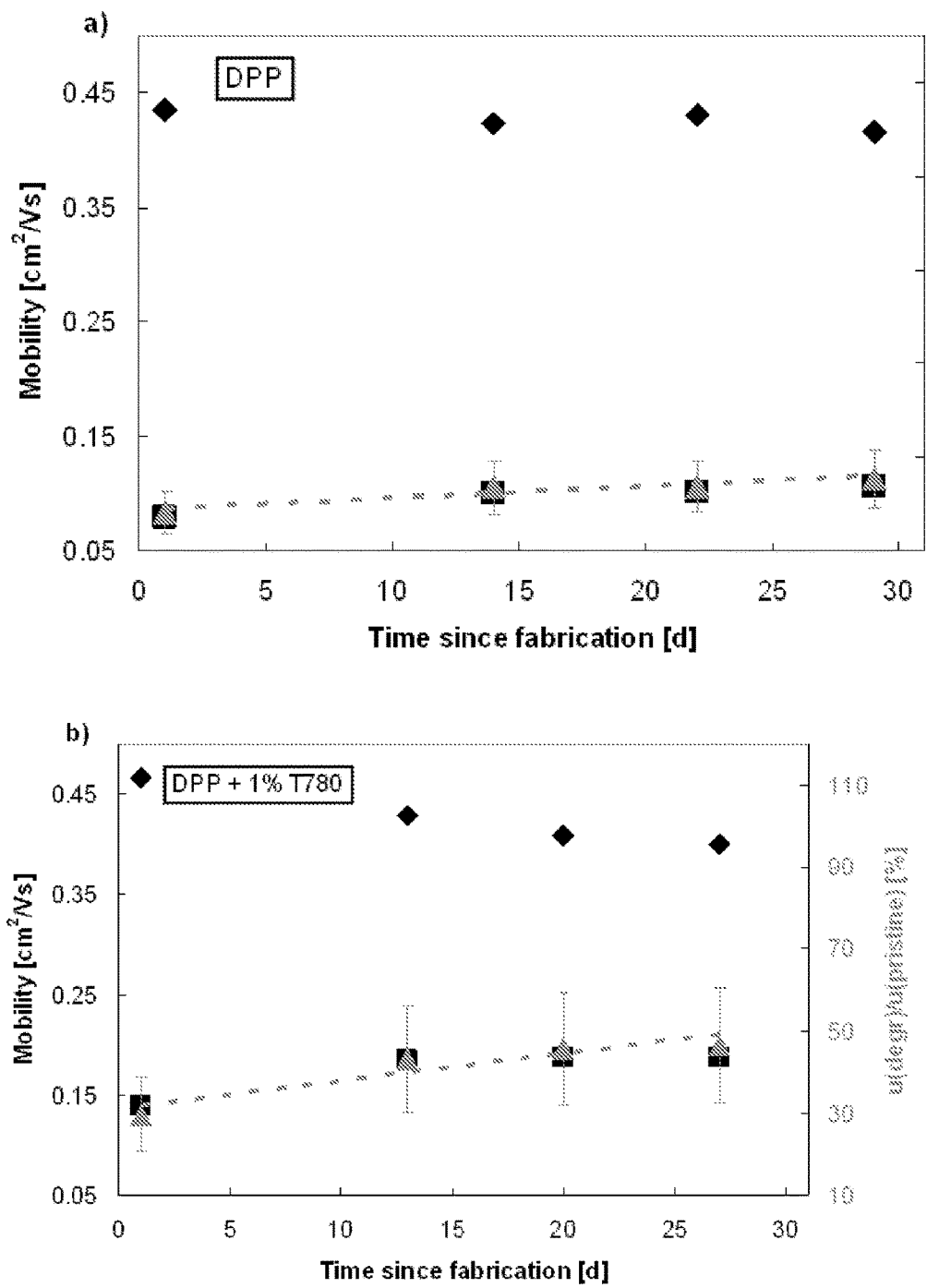

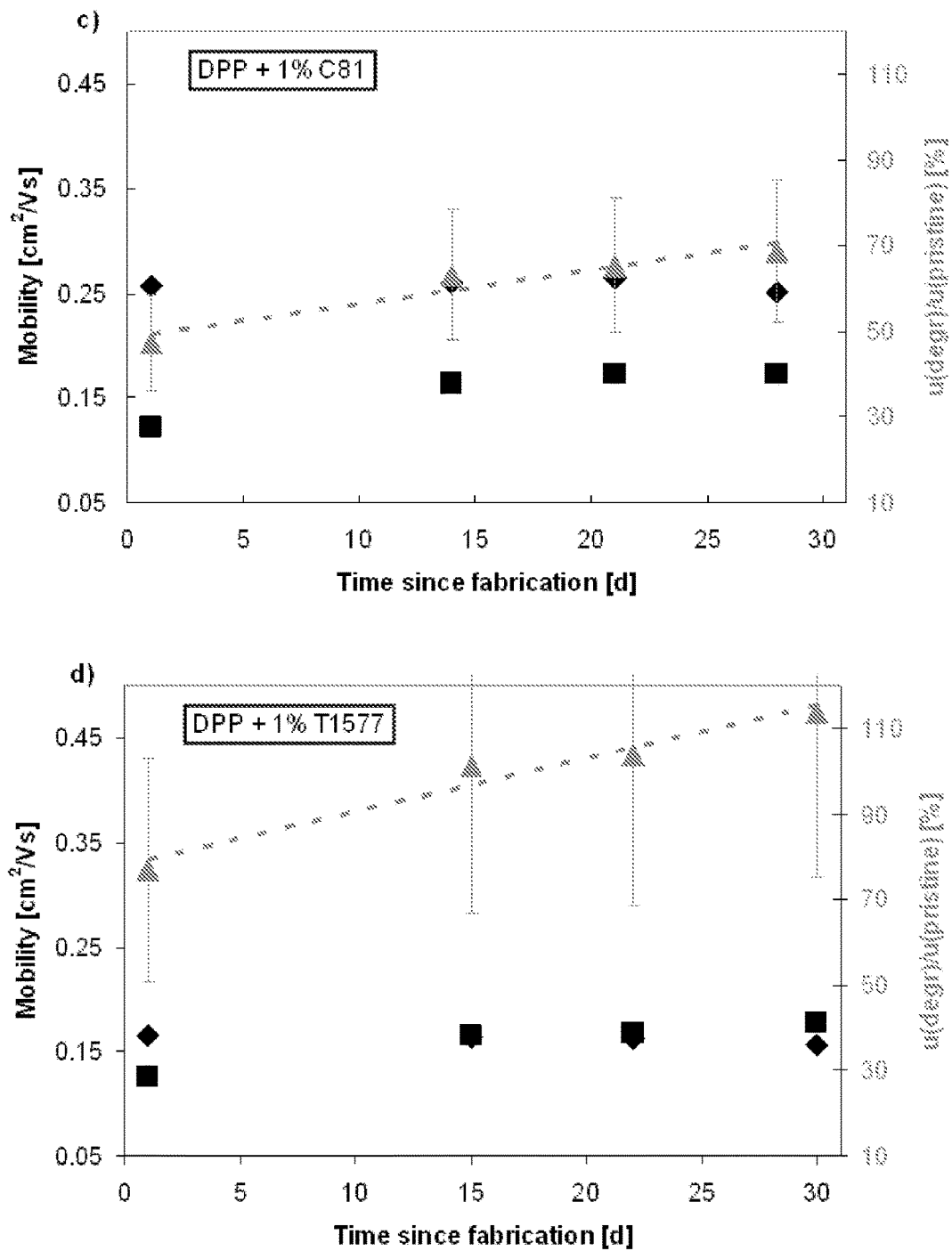
Fig. 3 (c, d)

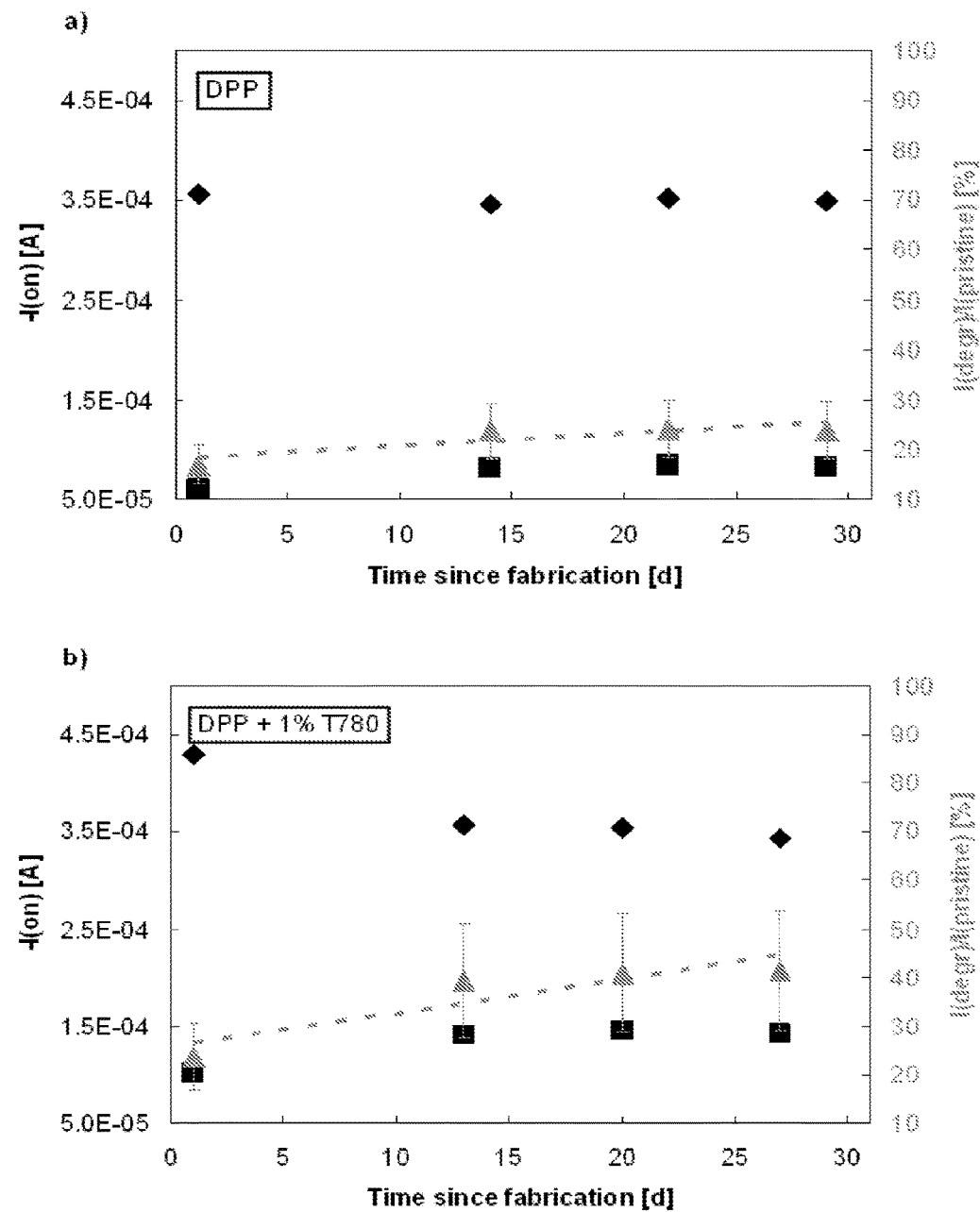
Fig. 4 (a, b)

Fig. 4 (c, d)
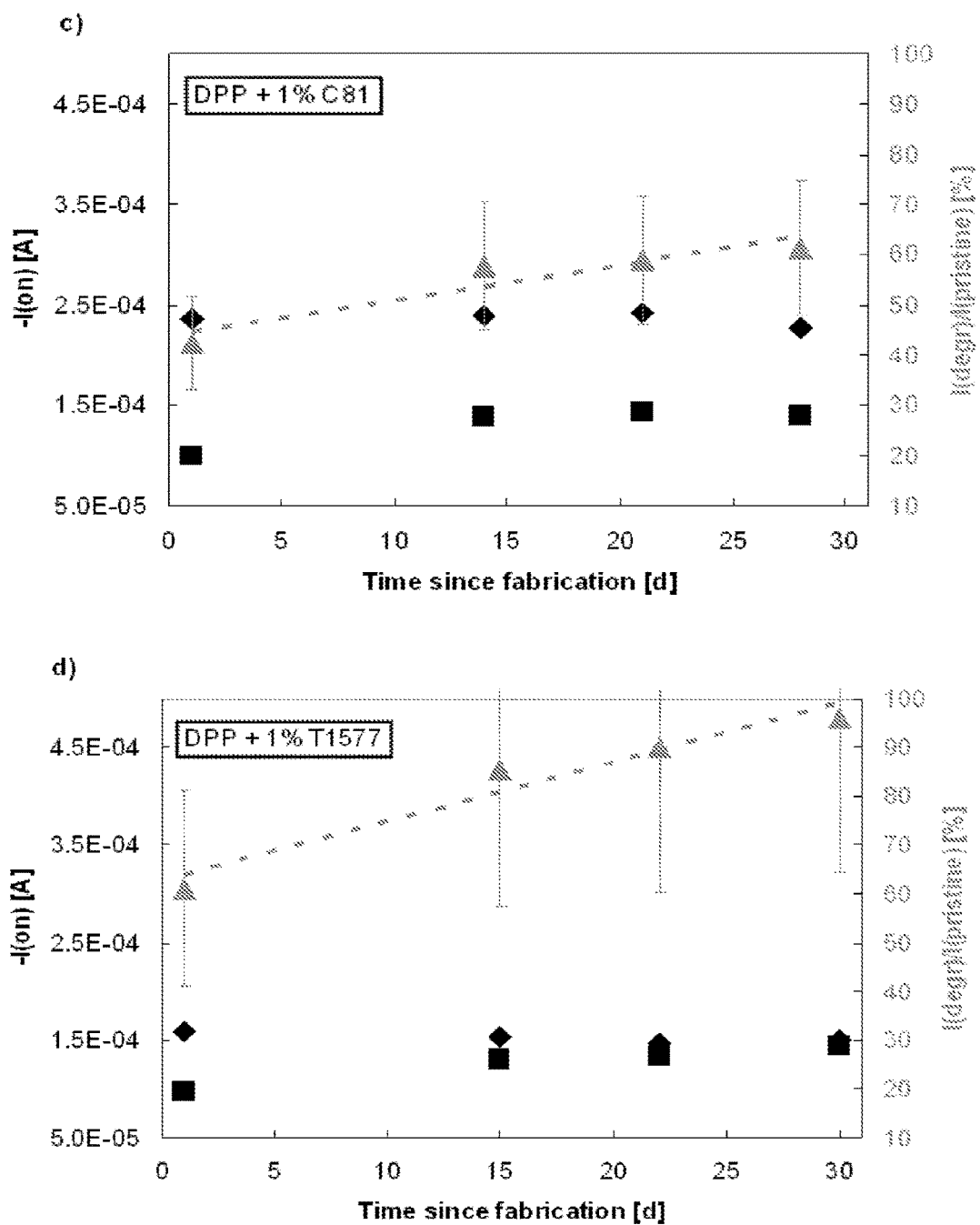

ORGANIC SEMICONDUCTOR DEVICE AND PROCESS FOR ITS PRODUCTION

CROSS REFERENCE TO RELATED APPLICATIONS

The present application is a 35 U.S.C. §371 national stage patent application of International patent application PCT/IB2012/056400, filed on Nov.14, 2012, published as WO/2013/072853on May 23, 2013, the text of which is incorporated by reference, and claims the benefit of the filing date of US provisional application no. 61/559,734, filed on Nov. 15, 2011, and European application no. 11189102.4, filed on Nov. 15, 2011, the text of each of which is also incorporated by reference.

The present invention relates to an organic diode and/or organic field effect transistor device comprising at least one semiconducting layer based on a diketopyrrolopyrrole (DPP) polymer, wherein said layer further contains a stabilizing agent such as a UV absorber, antioxidant and/or anti-radical agent, and further to the preparation of these devices, and to the use of a mixture of DPP polymer and stabilizing agent for the preparation of said devices as well as for improving the performance and increasing the product lifetime of the device.

A common problem of organic electronic devices which contain an organic semiconductor layer as part of an organic diode and/or organic field effect transistor is the degradation of said layer due to, for example, the direct contact with light and/or oxygen during preparation of use of the device. In order to prevent this organic semiconductor layer from degradation, it is a usual method to apply a suitable protecting material onto said organic semiconductor layer. However, the conditions under which such protecting material are applied onto such organic semiconductor layer or device assemblies may be harsh with considerable risk to damage the organic semiconductor material and thus to loose at least partially the semiconducting properties, or the protecting material itself provides incomplete protection (as in case of encapsulation by plastic films).

As far as said organic semiconductor materials are concerned, DPP polymers exhibit excellent characteristics such as high efficiency in energy conversion, field effect mobility, good on/off current ratios, and stability. Moreover, these polymers have an excellent solubility in organic solvents and also excellent film-forming properties. Therefore, it is an object of the invention to provide an organic diode and/or organic field effect transistor device which, on one hand, exhibits an excellent product life and, on the other hand, allows for a convenient and reliable device production.

According to the present invention, it was found that a semiconducting layer comprising or consisting of a DPP polymer, and a corresponding organic diode and/or organic field effect transistor, or device containing such a layer as part of an organic diode and/or organic field effect transistor, surprisingly may be protected against degradation by radiation and/or oxidation in that at least one stabilizing agent is admixed to the DPP polymer, while the device's electronic properties are retained. Thus, a mixture of at least one stabilizing agent and at least one DPP polymer may be used at least as component of a semiconducting layer of an organic diode and/or organic field effect transistor device.

Therefore, the present invention relates to an organic diode and/or organic field effect transistor device comprising at least one semiconducting layer, said layer comprising a mixture which comprises at least one diketopyrrolopyrrole (DPP) polymer and at least one stabilizing agent.

Further, the present invention relates to a process for the production of an organic diode and/or organic field effect transistor device, said process comprising the steps of (aa) providing at least one diketopyrrolopyrrole (DPP) polymer, at least one stabilizing agent;
(bb) providing a substrate onto which an electrode and optionally, onto the electrode, a smoothing layer has been applied;
(cc) mixing the compounds provided in (aa) with at least one suitable solvent;
(dd) applying the mixture obtained from (cc) onto the electrode, optionally onto the smoothing layer.

Yet further, the present invention relates to the use of a mixture comprising at least one stabilizing agent which is preferably a UV absorbing agent or an antioxidant or anti-radical agent, and at least one diketopyrrolopyrrole (DPP) polymer for increasing the product life of an organic organic diode and/or organic field effect transistor device containing the mixture in at least one semiconducting layer.

Still further, the present invention relates to the use of a mixture comprising at least one stabilizing agent which is preferably a UV absorbing agent or an anti-radical agent, and at least one diketopyrrolopyrrole (DPP) polymer for preventing the at least one DPP polymer from degradation during production and/or operation of an organic diode and/or organic field effect transistor device containing the mixture in at least one semiconducting layer.

The Stabilizing Agent

The term "stabilizing agent" has the meaning commonly known in the field of organic polymer technology and generally stands for an agent providing protection against degradation by irradiation and/or oxidation. As far as the at least one stabilizing agent used according to the present invention is concerned, no specific restrictions exist with the proviso that the desired stabilization of the at least one DPP polymer is achieved. The stabilizing agent itself generally has no conducting, semiconducting, photoelectric properties. The stabilizing agents usually are classified as light stabilizers (generally denoted as UV absorbers or UV absorbing agents, and anti-radical agents or radical scavengers; see Plastics Additives Handbook, H. Zweifel (ed), 5$^{th}$ edition, Hanser 2001, pp 141 ff) and antioxidants (see Plastics Additives Handbook, H. Zweifel (ed), 5$^{th}$ edition, Hanser 2001, pp 1 ff). UV absorbers generally possess a high extinction coefficient (usually higher than the one of the material to be protected) and are not degraded during their action since the absorbed radiation energy is transformed into heat. Antioxidants, such as hindered phenols, mainly act as reducing agents (H-donors), which get oxidized themselves during their activity. Anti-radical agents (radical-trapping agents, radical scavengers), such as hindered amine light stabilizers (HALS), show further effects: alike UV absorbers, HALS generally retain their activity over several cycles. Stabilizing agents thus useful in the present semiconducting layers typically are UV absorbers of the classes of the hydroxybenzophenones, hydroxyphenyl benzotriazoles, oxalic acid anilides, hydroxyphenyl triazines, merocyanines; hindered phenols; and/or anti-radical agents from the class of the hindered amine light stabilizers (HALS). Preferably, the stabilizing agent is selected from the group consisting of HALS and UV absorbers of the classes of the hydroxybenzophenones, hydroxyphenyl benzotriazoles, oxalic acid anilides, hydroxyphenyl triazines, merocyanines; most preferred stabilizing agents are hydroxybenzophenones, oxalic acid anilides, and especially hydroxyphenyl triazines and hindered amine light stabilizers.

The anti-radical agents typically are selected from hindered amine light stabilizers (HALS) which include hindered nitroxyl compounds or hindered hydroxylamine compounds or salts thereof and generally conform to the structures

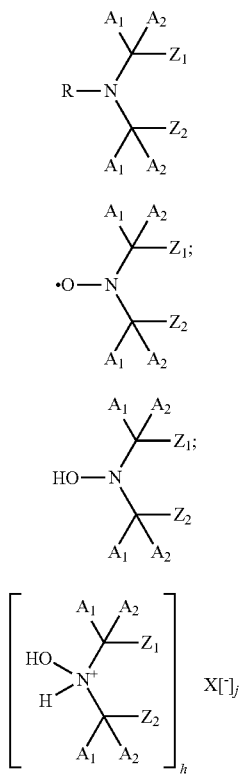

wherein, for example, R is H or an organic residue such as alkyl or alkoxy (e.g. of 1 to 20 carbon atoms); $A_1$ and $A_2$ are independently alkyl of 1 to 4 carbon atoms or are together pentamethylene, $Z_1$ and $Z_2$ are, for example, each methyl, or $Z_1$ and $Z_2$ together form a linking moiety which may additionally be substituted by an ester, ether, hydroxy, oxo, cyanohydrin, amide, amino, carboxy or urethane group, h is the number of positive charges and j is the number of negative charges, X is an inorganic or organic anion, and where the total charge of cations h is equal to the total charge of anions j. Typical HALS are, for example, of the formula

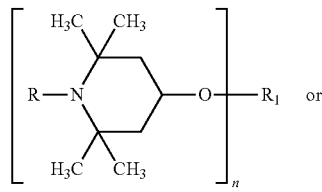

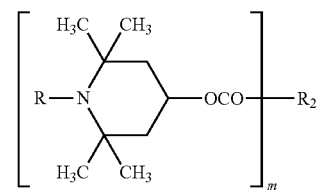

wherein R is H or an organic residue such as alkyl or alkoxy (e.g. of 1 to 20 carbon atoms or preferably 1 to 12 carbon atoms), m is 1 or 2, n is 1 or 2,
R1, when n is 1, is hydrogen, alkyl of 1 to 18 carbon atoms, alkenyl of 2-18 carbon atoms, propargyl, glycidyl, alkyl of 2 to 20 carbon atoms interrupted by oxygen and/or substituted by hydroxy, or $R_1$ is alkyl of 1 to 4 carbon atoms substituted by a carboxy group or by —COOZ where Z is hydrogen, alkyl of 1 to 4 carbon atoms or phenyl, when n is 2, $R_1$ is alkylene of 1 to 12 carbon atoms, alkenylene of 4 to 12 carbon atoms, xylylene, or alkylene of 1 to 20 carbon atoms interrupted by oxygen and/or substituted by hydroxy or phenyl, which phenyl is substituted by hydroxy and/or one to four alkyl groups of 1 to 4 carbon atoms; or $R_1$ is CO;

when m is 1, $R_2$ is alkyl of 1 to 18 carbon atoms, alkyl of 3 to 18 carbon atoms interrupted by —COO—, or $R_2$ is —CH$_2$(OCH$_2$CH$_2$)$_p$OCH$_3$ where p is 1 to 12, or $R_2$ is cycloalkyl of 5 to 12 carbon atoms, phenyl or said phenyl substituted by one to four alkyl groups of 1 to 4 carbon atoms, or $R_2$ is —NHR$_3$ where $R_3$ is alkyl of 1 to 18 carbon atoms, cycloalkyl of 5 to 12 carbon atoms, phenyl or said phenyl substituted by one to four alkyl of 1 to 4 carbon atoms, or $R_2$ is —N(R$_3$)$_2$ where $R_3$ is as defined above, and when m is 2, $R_2$ is a direkt bond, alkylene of 1 to 12 carbon atoms, alkenylene of 4 to 12 carbon atoms, O-alkylene-0 of 2 to 12 carbon atoms xylylene, alkylene of 2 to 12 carbon atoms interrupted by —COO—, or $R_2$ is —CH$_2$(OCH$_2$CH$_2$)$_n$OCH$_2$— where n is 1 to 12, or $R_2$ is cycloalkylene of 5 to 12 carbon atoms, phenylalkylene of 7 to 15 carbon atoms or phenylene, or $R_2$ is —NHR$_4$NH— where $R_4$ is alkylene of 2 to 18 carbon atoms, cycloalkylene of 5 to 12 carbon atoms, phenylalkylene of 8 to 15 carbon atoms or phenylene, or $R_2$ is —N(R$_3$)R$_4$N(R$_3$)— where $R_3$ and $R_4$ are as defined above, or $R_2$ is —NH—;

or the HALS is selected from 2,2,6,6-tetramethylpiperidine, its N-substituted derivatives according to the above formulae, and di- and polymers thereof linked in 4-position of the piperidine ring (i.e. compounds of the above formulae (a)-(d) wherein $A_1$ and $A_2$ each are methyl, $Z_1$ and $Z_2$ together are a bridging group CH$_2$—Z$_3$—CH$_2$ where $Z_3$ is CH$_2$, CHOH, CO, or CH—Z$_4$—(Z$_5$)$_x$ with $Z_4$ being an organic bridging group of valency x+1, such as a residue of an organic polyamine with valency x+1, a residue of a dicarboxylic acid like 0° C.—(CH$_2$)$_y$—COO, i.e.

with y typically ranging from 0 to 8 and R being H or an organic residue such as alkyl or alkoxy (e.g. of 1 to 20 carbon atoms or preferably 1 to 12 carbon atoms), etc.

Examples of useful HALS compounds include 2,2,6,6-tetramethylpiperidine, 2,2,6,6-tetramethyl-4-hydroxy-piperidine, 2,2,6,6-tetramethyl-4-oxo-piperidine, 1-oxyl-2,2,6,6-tetramethylpiperidine (TEMPO), 1-oxyl-2,2,6,6-tetramethyl-4-hydroxy-piperidine (TEMPOL), bis(2,2,6,6-tetramethyl-4-piperidyl)sebacate, bis(2,2,6,6-tetramethyl-4-piperidyl)succinate, bis(1,2,2,6,6-pentamethyl-4-piperidyl) sebacate, bis(1-octyloxy-2,2,6,6-tetramethyl-4-piperidyl) sebacate, bis(1,2,2,6,6-pentamethyl-4-piperidyl) n-butyl-3, 5-di-tert-butyl-4-hydroxybenzylmalonate, the condensate of 1-(2-hydroxyethyl)-2,2,6,6-tetramethyl-4-hydroxypiperidine and succinic acid, linear or cyclic condensates of N,N'-bis(2,2,6,6-tetramethyl-4-piperidyl)hexamethylenediamine and 4-tert-octylamino-2,6-dichloro-1,3,5-triazine, tris(2,2,6,6-tetramethyl-4-piperidyl)nitrilotriacetate, tetrakis(2,2,6,6-tetramethyl-4-piperidyl)-1,2,3,4-butane-tetracarboxylate, 1,1'-(1,2-ethanediyl)-bis(3,3,5,5-tetramethylpiperazinone), 4-benzoyl-2,2,6,6-tetramethylpiperidine, 4-stearyloxy-2,2,6,6-tetramethylpiperidine, bis(1,2,2,6,6-pentamethylpiperidyl)-2-n-butyl-2-(2-hydroxy-3,5-di-tert-butylbenzyl)malonate, 3-n-octyl-7,7,9,9-tetramethyl-1,3,8-triazaspiro[4.5]decane-2,4-dione, bis(1-octyloxy-2,2,6,6-tetramethylpiperidyl)sebacate, bis(1-octyloxy-2,2,6,6-tetramethylpiperidyl)succinate, linear or cyclic condensates of N,N'-bis-(2,2,6,6-tetramethyl-4-piperidyl)hexamethylenediamine and 4-morpholino-2,6-dichloro-1,3,5-triazine, the condensate of 2-chloro-4,6-bis(4-n-butylamino-2,2,6,6-tetramethylpiperidyl)-1,3,5-triazine and 1,2-bis(3-aminopropylamino)ethane, the condensate of 2-chloro-4,6-di-(4-n-butylamino-1,2,2,6,6-pentamethylpiperidyl)-1,3,5-triazine and 1,2-bis-(3-aminopropylamino)ethane, 8-acetyl-3-dodecyl-7,7,9,9-tetramethyl-1,3,8-triazaspiro[4.5]decane-2,4-dione, 3-dodecyl-1-(2,2,6,6-tetramethyl-4-piperidyl)pyrrolidine-2,5-dione, 3-dodecyl-1-(1,2,2,6,6-pentamethyl-4-piperidyl)pyrrolidine-2,5-dione, a mixture of 4-hexadecyloxy- and 4-stearyloxy-2,2,6,6-tetramethylpiperidine, a condensation product of N,N'-bis(2,2,6,6-tetramethyl-4-piperidyl)hexamethylenediamine and 4-cyclohexylamino-2,6-dichloro-1,3,5-triazine, a condensation product of 1,2-bis(3-aminopropylamino)ethane and 2,4,6-trichloro-1,3,5-triazine as well as 4-butylamino-2,2,6,6-tetramethylpiperidine (CAS Reg. No. [136504-96-6]); a condensation product of 1,6-hexanediamine and 2,4,6-trichloro-1,3,5-triazine as well as N,N-dibutylamine and 4-butylamino-2,2,6,6-tetramethylpiperidine (CAS Reg. No. [192268-64-7]); N-(2,2,6,6-tetramethyl-4-piperidyl)-n-dodecylsuccinimide, N-(1,2,2,6,6-pentamethyl-4-piperidyl)-n-dodecylsuccinimide, 2-undecyl-7,7,9,9-tetramethyl-1-oxa-3,8-diaza-4-oxo-spiro[4,5]decane, a reaction product of 7,7,9,9-tetramethyl-2-cycloundecyl-1-oxa-3,8-diaza-4-oxospiro-[4,5]decane aund epichlorohydrin, 1,1-bis(1,2,2,6,6-pentamethyl-4-piperidyloxycarbonyl)-2-(4-methoxyphenyl)ethene, N,N'-bis-formyl-N,N'-bis(2,2,6,6-tetramethyl-4-piperidyl)hexamethylenediamine, a diester of 4-methoxy-methylene-malonic acid with 1,2,2,6,6-pentamethyl-4-hydroxypiperidine, poly[methylpropyl-3-oxy-4-(2,2,6,6-tetramethyl-4-piperidyl)]siloxane, a reaction product of maleic acid anhydride-α-olefin-copolymer with 2,2,6,6-tetramethyl-4-aminopiperidine or 1,2,2,6,6-pentamethyl-4-aminopiperidine. Particularly preferred anti-radical agents include the compounds N,N-bis(2,2,6,6-tetramethyl-piperid-4-yl-hexamethylenediamine, bis(2,2,6,6-tetramethylpiperid-4-yl)sebacate, 2,2,6,6-tetra-methylpiperidin-4-one, and 2,2,6,6-tetramethylpiperidin-4-ol.

Useful UV absorbing agents are, for example, suitable benzophenone derivatives like 2-hydroxybenzophenone derivatives, suitable benzotriazole derivatives like 2-hydroxyphenyl benzotriazole derivatives, or suitable hydroxyphenyltriazine derivatives like 2-hydroxyphenyltriazine derivatives.

Useful antioxidants include the hindered phenols, which are explained in more detail below.

Preferably, according to the present invention, the stabilizing agent is selected from the group consisting of UV absorbing agents, antioxidants and anti-radical agents. More preferably, the stabilizing agent is a hindered amine (HALS) and/or a UV absorber.

Some specifically preferred stabilizing agents, including certain UV absorbers, hindered phenols and hindered amine light stabilizers (HALS), are listed in the examples further below.

According to one preferred embodiment of the present invention, the mixture comprising at least one diketopyrrolopyrrole (DPP) polymer and at least one stabilizing agent is free of a phenolic antioxidant, preferably free of a hindered phenol, said mixture being comprised in the at least one semiconducting layer comprised in the organic diode and/or organic field effect transistor device.

UV Absorbing Agent

Preferred UV absorbing agents used according to the present invention are selected from the group consisting of hydroxybenzophenone derivatives, hydroxyphenyl benzotriazole derivatives, oxalic acid anilide derivatives, hydroxyphenyl triazine derivatives, and mixtures of two or more thereof. More preferably, the UV absorbing agents used according to the present invention are selected from the group consisting of hydroxybenzophenone derivatives, hydroxyphenyl benzotriazole derivatives, hydroxyphenyl triazine derivatives, and mixtures of two or more thereof. Even more preferably, the UV absorbing agents used according to the present invention are selected from the group consisting of 2-hydroxybenzophenone derivatives, 2-hydroxyphenyl benzotriazole derivatives, 2-hydroxyphenyl triazine derivatives, and mixtures of two or more thereof.

Therefore, the present invention relates to above-described organic diode and/or organic field effect transistor device wherein the UV absorbing agent is a 2-hydroxybenzophenone of formula I

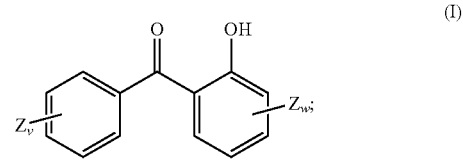

a 2-hydroxyphenylbenzotriazole of formula IIa, IIb or IIc

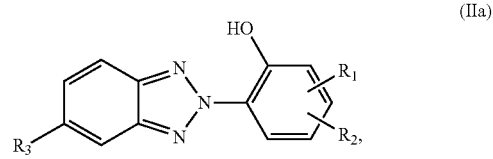

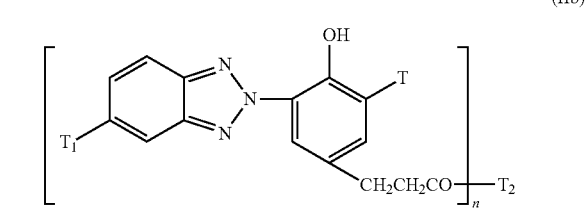

-continued

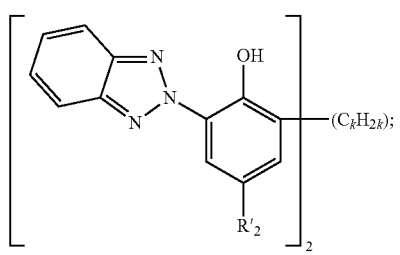

(IIc)

a 2-hydroxyphenyltriazine of formula III

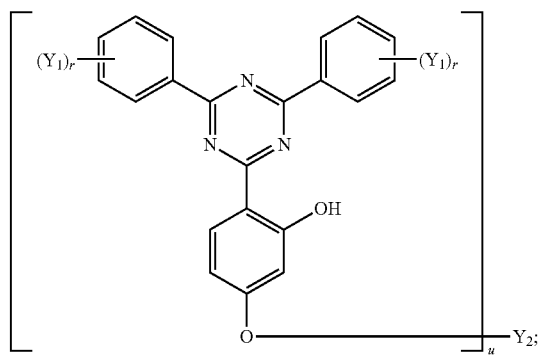

(III)

an oxanilide of formula IV

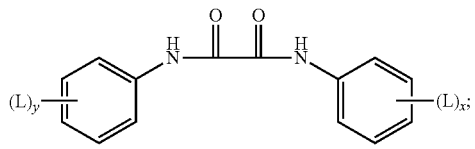

(IV)

wherein
in the compounds of the formula I,
v is an integer from 1 to 3 and w is 1 or 2 and the substituents Z independently of one another are hydrogen, halogen, hydroxyl or alkoxy having 1 to 12 carbon atoms;
in the compounds of the formula IIa,
$R_1$ is hydrogen, alkyl having 1 to 24 carbon atoms, phenylalkyl having 1 to 4 carbon atoms in the alkyl moiety, cycloalkyl having 5 to 8 carbon atoms or a radical of the formula

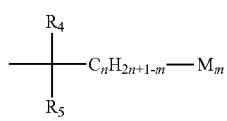

in which
$R_4$ and $R_5$ independently of one another are alkyl having in each case 1 to 5 carbon atoms, or $R_4$, together with the radical $C_nH_{2n+1-m}$, forms a cycloalkyl radical having 5 to 12 carbon atoms,
m is 1 or 2, n is an integer from 2 to 20 and
M is a radical of the formula —COOR$_6$ in which
$R_6$ is hydrogen, alkyl having 1 to 12 carbon atoms, alkoxyalkyl having in each case 1 to 20 carbon atoms in the alkyl moiety and in the alkoxy moiety or phenylalkyl having 1 to 4 carbon atoms in the alkyl moiety,
$R_2$ is hydrogen, halogen, alkyl having 1 to 18 carbon atoms, alkyl of 2 to 4 carbon atoms substituted by $C_2$-$C_6$alkanoyloxy or $C_3$-$C_6$alkenoyloxy, and phenylalkyl having 1 to 4 carbon atoms in the alkyl moiety, and
$R_3$ is hydrogen, halogen, alkyl or alkoxy having in each case 1 to 4 carbon atoms or —COOR$_6$ in which $R_6$ is as defined above, at least one of the radicals $R_1$ and $R_2$ being other than hydrogen;
in the compounds of the formula IIb,
T is hydrogen or alkyl having 1 to 6 carbon atoms,
$T_1$ is hydrogen, chloro or alkyl or alkoxy having in each case 1 to 4 carbon atoms,
n is 1 or 2 and,
if n is 1,
$T_2$ is chloro or a radical of the formula —OT$_3$ or

and,
if n is 2, $T_2$ is a radical of the formula

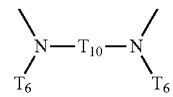

or —O-T$_9$-O—;
in which
$T_3$ is hydrogen, alkyl which has 1 to 18 carbon atoms and is unsubstituted or substituted by 1 to 3 hydroxyl groups or by —OCOT$_6$, alkyl which has 3 to 18 carbon atoms, is interrupted once or several times by —O— or —NT$_6$- and is unsubstituted or substituted by hydroxyl or —OCOT$_6$, cycloalkyl which has 5 to 12 carbon atoms and is unsubstituted or substituted by hydroxyl and/or alkyl having 1 to 4 carbon atoms, alkenyl which has 2 to 18 carbon atoms and is unsubstituted or substituted by hydroxyl, phenylalkyl having 1 to 4 carbon atoms in the alkyl moiety, or a radical of the formula
—CH$_2$CH(OH)-T$_7$ or

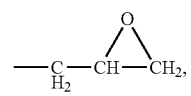

$T_4$ and $T_5$ independently of one another are hydrogen, alkyl having 1 to 18 carbon atoms, alkyl which has 3 to 18 carbon atoms and is interrupted once or several times by —O— or —NT$_6$-, cycloalkyl having 5 to 12 carbon atoms, phenyl, phenyl which is substituted by alkyl having 1 to 4 carbon atoms, alkenyl having 3 to 8 carbon atoms, phenylalkyl having 1 to 4 carbon atoms in the alkyl moiety or hydroxyalkyl having 2 to 4 carbon atoms,
$T_6$ is hydrogen, alkyl having 1 to 18 carbon atoms, cycloalkyl having 5 to 12 carbon atoms, alkenyl having 3 to 8 carbon atoms, phenyl, phenyl which is substituted by alkyl having 1 to 4 carbon atoms, phenylalkyl having 1 to 4 carbon atoms in the alkyl moiety, $T_7$ is hydrogen, alkyl having 1 to 18 carbon atoms, phenyl which is unsubstituted or substituted by hydroxyl, phenylalkyl having 1 to 4 carbon atoms in the alkyl moiety, or —$CH_2OT_8$, $T_8$ is alkyl having 1 to 18 carbon atoms, alkenyl having 3 to 8 carbon atoms, cycloalkyl having 5 to 10 carbon atoms, phenyl, phenyl which is substituted by alkyl having 1 to 4 carbon atoms, or phenylalkyl having 1 to 4 carbon atoms in the alkyl moiety, $T_9$ is alkylene having 2 to 8 carbon atoms, alkenylene having 4 to 8 carbon atoms, alkynylene having 4 carbon atoms, cyclohexylene, alkylene which has 2 to 8 carbon atoms and is interrupted once or several times by —O—, or a radical of the formula —$CH_2CH(OH)CH_2OT_{11}OCH_2CH(OH)CH_2$— or —$CH_2$—$C(CH_2OH)_2$—$CH_2$—, $T_{10}$ is alkylene which has 2 to 20 carbon atoms and can be interrupted once or several times by —O—, or cyclohexylene, $T_{11}$ is alkylene having 2 to 8 carbon atoms, alkylene which has 2 to 18 carbon atoms and is interrupted once or several times by —O—, 1,3-cyclohexylene, 1,4-cyclohexylene, 1,3-phenylene or 1,4-phenylene, or $T_{10}$ and $T_6$, together with the two nitrogen atoms, are a piperazine ring;

in the compounds of formula IIc, $R'_2$ is $C_1$-$C_{12}$alkyl and k is a number from 1 to 4;

in the compounds of the formula III, u is 1 or 2 and r is an integer from 1 to 3, the substituents $Y_1$ independently of one another are hydrogen, hydroxyl, phenyl or halogen, halogenomethyl, alkyl having 1 to 12 carbon atoms, alkoxy having 1 to 18 carbon atoms, alkoxy having 1 to 18 carbon atoms which is substituted by a group —$COO(C_1$-$C_{18}$alkyl);

if u is 1, $Y_2$ is alkyl having 1 to 18 carbon atoms, phenyl which is unsubstituted or substituted by hydroxyl, halogen, alkyl or alkoxy having 1 to 18 carbon atoms;

alkyl which has 1 to 12 carbon atoms and is substituted by —COOH, —$COOY_8$, —$CONH_2$, —$CONHY_9$, —$CONY_9Y_{10}$, —$NH_2$, —$NHY_9$, —$NY_9Y_{10}$, —$NHCOY_{11}$, —CN and/or —$OCOY_{11}$;

alkyl which has 4 to 20 carbon atoms, is interrupted by one or more oxygen atoms and is unsubstituted or substituted by hydroxyl or alkoxy having 1 to 12 carbon atoms, alkenyl having 3 to 6 carbon atoms, glycidyl, cyclohexyl which is unsubstituted or substituted by hydroxyl, alkyl having 1 to 4 carbon atoms and/or —$OCOY_{11}$, phenylalkyl which has 1 to 5 carbon atoms in the alkyl moiety and is unsubstituted or substituted by hydroxyl, chlorine and/or methyl, —$COY_{12}$ or —$SO_2Y_{13}$, or, if u is 2, $Y_2$ is alkylene having 2 to 16 carbon atoms, alkenylene having 4 to 12 carbon atoms, xylylene, alkylene which has 3 to 20 carbon atoms, is interrupted by one or more —O—atoms and/or is substituted by hydroxyl, —$CH_2CH(OH)CH_2$—O—$Y_{15}$—$OCH_2CH(OH)CH_2$, —CO—$Y_{16}$—CO—, —CO—NH—$Y_{17}$—NH—CO— or —$(CH_2)_m$—$CO_2$—$Y_{18}$—$OCO$—$(CH_2)_m$, in which m is 1, 2 or 3, $Y_8$ is alkyl having 1 to 18 carbon atoms, alkenyl having 3 to 18 carbon atoms, alkyl which has 3 to 20 carbon atoms, is interrupted by one or more oxygen or sulfur atoms or —$NT_6$- and/or is substituted by hydroxyl, alkyl which has 1 to 4 carbon atoms and is substituted by —P(O)($OY_{14})_2$, —$NY_9Y_{10}$ or —$OCOY_{11}$ and/or hydroxyl, alkenyl having 3 to 18 carbon atoms, glycidyl, or phenylalkyl having 1 to 5 carbon atoms in the alkyl moiety, $Y_9$ and $Y_{10}$ independently of one another are alkyl having 1 to 12 carbon atoms, alkoxyalkyl having 3 to 12 carbon atoms, dialkylaminoalkyl having 4 to 16 carbon atoms or cyclohexyl having 5 to 12 carbon atoms, or $Y_9$ and $Y_{10}$ together are alkylene, oxaalkylene or azaalkylene having in each case 3 to 9 carbon atoms, $Y_{11}$ is alkyl having 1 to 18 carbon atoms, alkenyl having 2 to 18 carbon atoms or phenyl, $Y_{12}$ is alkyl having 1 to 18 carbon atoms, alkenyl having 2 to 18 carbon atoms, phenyl, alkoxy having 1 to 12 carbon atoms, phenoxy, alkylamino having 1 to 12 carbon atoms or phenylamino, $Y_{13}$ is alkyl having 1 to 18 carbon atoms, phenyl or alkylphenyl having 1 to 8 carbon atoms in the alkyl radical, $Y_{14}$ is alkyl having 1 to 12 carbon atoms or phenyl, $Y_{15}$ is alkylene having 2 to 10 carbon atoms, phenylene or a group -phenylene-M-phenylene- in which M is —O—, —S—, —$SO_2$—, —$CH_2$— or —$C(CH_3)_2$—, $Y_{16}$ is alkylene, oxaalkylene or thiaalkylene having in each case 2 to 10 carbon atoms, phenylene or alkenylene having 2 to 6 carbon atoms, $Y_{17}$ is alkylene having 2 to 10 carbon atoms, phenylene or alkylphenylene having 1 to 11 carbon atoms in the alkyl moiety, and $Y_{18}$ is alkylene having 2 to 10 carbon atoms or alkylene which has 4 to 20 carbon atoms and is interrupted once or several times by oxygen;

in the compounds of the formula IV x is an integer from 1 to 3 and the substituents L independently of one another are hydrogen, alkyl, alkoxy or alkylthio having in each case 1 to 22 carbon atoms, phenoxy or phenylthio;

Further important UV absorbing agents are merocyanines such as disclosed in US-2011/200540 and further references cited therein; see especially sections [0015]-[0047], [0072]-[0078], [0079]-[0084], compounds of table 1 in section [0085], sections [0247]-[0256] (example A1), which passages of US-2011/200540 are hereby incorporated by reference. Thus, merocyanines useful in the present invention include compounds of the formula V

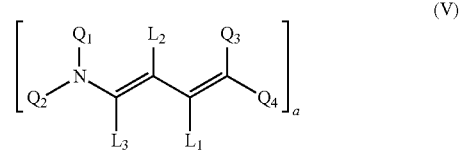

including E,E-, E,Z- and Z,Z-geometrical isomers thereof, wherein $Q_1$ and $Q_2$ independently of each other are hydrogen; $C_1$-$C_{22}$alkyl; $C_2$-$C_{22}$ alkenyl, $C_2$-$C_{22}$alkinyl, $C_3$-$C_{12}$cycloalkyl, $C_3$-$C_{12}$cycloalkenyl, $C_7$-$C_{20}$aralkyl, $C_1$-$C_{20}$heteroalkyl, $C_3$-$C_{12}$cycloheteroalkyl, $C_5$-$C_{11}$heteroaralkyl, $C_6$-$C_{20}$aryl, $C_4$-$C_9$heteroaryl, $COQ_{13}$ or $CONQ_{13}Q_{14}$;

$Q_3$ is CN; —$COOQ_5$; —$CONHQ_5$; —$COQ_5$; —$SO_2Q_5$; —$CONQ_5Q_6$; $C_6$-$C_{20}$aryl; or $C_4$-$C_9$ heteroaryl;

$Q_4$ is CN; —COO$Q_7$; —CONH$Q_7$; —CO$Q_7$; —SO$_2Q_7$; —CON$Q_7Q_8$; $C_1$-$C_{22}$ alkyl; $C_2$-$C_{22}$alkenyl; $C_2$-$C_{22}$ alkinyl; $C_3$-$C_{12}$cycloalkyl; $C_3$-$C_{12}$cycloalkenyl; $C_7$-$C_{20}$aralkyl; $C_1$-$C_{20}$heteroalkyl; $C_3$-$C_{12}$cycloheteroalkyl; $C_5$-$C_{11}$ heteroaralkyl; $C_6$-$C_{20}$ aryl; or $C_4$-$C_9$ heteroaryl;

$Q_5$, $Q_6$, $Q_7$ and $Q_8$ independently of each other are hydrogen; $C_1$-$C_{22}$alkyl; $C_2$-$C_{22}$alkenyl; $C_2$-$C_{22}$ alkinyl; $C_3$-$C_{12}$cycloalkyl; $C_3$-$C_{12}$cycloalkenyl; $C_7$-$C_{20}$aralkyl; $C_1$-$C_{20}$heteroalkyl, $C_3$-$C_{12}$cycloheteroalkyl; $C_5$-$C_{11}$heteroaralkyl; $C_6$-$C_{20}$aryl; $C_4$-$C_9$heteroaryl; Si$Q_{15}Q_{16}Q_{17}$; Si(O$Q_{15}$)(O$Q_{16}$)(O$Q_{17}$); Si$Q_{15}$(O$Q_{16}$)(O$Q_{17}$); Si$Q_{15}Q_{16}$(O$Q_{17}$); or a radical —XS;

$L_1$, $L_2$ or $L_3$ independently of each other are hydrogen, $C_1$-$C_{22}$alkyl; $C_2$-$C_{22}$alkenyl, $C_2$-$C_{22}$alkinyl; $C_3$-$C_{12}$cycloalkyl; $C_3$-$C_{12}$cycloalkenyl; $C_7$-$C_{20}$aralkyl; $C_1$-$C_{20}$heteroalkyl; $C_3$-$C_{12}$cycloheteroalkyl; $C_5$-$C_{11}$heteroaralkyl; $C_6$-$C_{20}$ aryl; $C_4$-$C_9$heteroaryl; CN; OH; O$Q_9$; or COO$Q_9$;

$Q_9$ is hydrogen; $C_1$-$C_{22}$alkyl; $C_2$-$C_{22}$alkenyl; $C_2$-$C_{22}$alkinyl; $C_3$-$C_{12}$cycloalkyl; $C_3$-$C_{12}$cycloalkenyl; $C_7$-$C_{20}$aralkyl; $C_1$-$C_{20}$heteroalkyl; $C_3$-$C_{12}$cycloheteroalkyl; $C_5$-$C_{11}$hetero-aralkyl; $C_6$-$C_{20}$ aryl; or $C_4$-$C_9$heteroaryl;

$L_1$ and $L_2$, $L_1$ and $L_3$, $L_2$ and $L_3$, $L_1$ and $Q_4$, $L_2$ and $Q_4$, $L_1$ and $Q_1$, $L_2$ and $Q_1$, $L_3$ and $Q_1$, $L_3$ and $Q_5$, $Q_3$ and $Q_4$, $Q_1$ and $Q_2$, $Q_7$ and $Q_8$, $Q_5$ and $Q_6$ may be linked together to form 1, 2, 3 or 4 carbocyclic or N, O and/or S-heterocyclic rings, which may be further fused with other aromatic rings;

$Q_{10}$ represents $Q_{13}$; CO$Q_{13}$; COO$Q_{13}$; CONH$_2$; CONH$Q_{13}$; or CON$Q_{13}Q_{14}$;

$Q_{11}$ represents halogen; OH; NH$_2$; NH$Q_{15}$; N$Q_{15}Q_{16}$; N$Q_{15}$O$Q_{16}$; O-$Q_{15}$; O—CO-$Q_{15}$; S-$Q_{15}$; CO-$Q_{15}$; oxo; thiono; CN; COOH; CONH$_2$; COO$Q_{15}$; CONH$Q_{15}$; CON$Q_{15}Q_{16}$; SO$_2$NH$_2$; SO$_2$NH$Q_{15}$; SO$_2$N$Q_{15}Q_{16}$; SO$_2Q_{15}$; SO$_3Q_{15}$; Si$Q_{15}Q_{16}Q_{17}$; SiO$Q_{15}$(O$Q_{16}$)(O$Q_{17}$); Si$Q_{15}$(O$Q_{16}$)(O$Q_{17}$), Si$Q_{15}Q_{16}$(O$Q_{17}$); O—Si-$Q_{15}Q_{16}Q_{17}$; O—Si—O$Q_{15}$(O$Q_{16}$)(O$Q_{17}$); O—Si-$Q_{15}Q_{16}$(O$Q_{17}$), O—Si$Q_{15}$(O$Q_{16}$)(O$Q_{17}$); PO(O$Q_{15}$)(O$Q_{16}$), or a radical *—XS;

$Q_{12}$ represents halogen, CN, SH, OH, CHO, $Q_{18}$; O$Q_{18}$; S$Q_{18}$; C($Q_{18}$)=C$Q_{19}Q_{20}$; O—CO-$Q_{19}$, NH$Q_{19}$; N$Q_{18}Q_{19}$; CONH$_2$; CONH$Q_{18}$; CON$Q_{18}Q_{19}$; SO$_2$NH$_2$; SO$_2$NH$Q_{18}$; SO$_2$N$Q_{18}Q_{19}$; SO$_2Q_{18}$; COOH; COO$Q_{18}$; OCOO$Q_{18}$; NHCO$Q_{18}$; N$Q_{18}$CO$Q_{19}$; NHCOO$Q_{19}$; N$Q_{19}$COO$Q_{20}$; Si$Q_{15}Q_{16}Q_{17}$; SiO$Q_{15}$(O$Q_{16}$)(O$Q_{17}$); Si$Q_{15}$(O$Q_{16}$)(O$Q_{17}$); Si$Q_{15}Q_{16}$(O$Q_{17}$); OSi $Q_{15}Q_{16}Q_{17}$; OSiO$Q_{15}$(O$Q_{16}$)(O$Q_{17}$); OSi$Q_{15}Q_{16}$(O$Q_{17}$); OSi$Q_{15}$(O$Q_{16}$)(O$Q_{17}$); P(=O)O$Q_{19}$O$Q_{20}$; P(=O)$Q_{19}$O$Q_{20}$; P(=O)$Q_{19}Q_{20}$; or a radical —XS; or is selected from the group consisting of $C_1$-$C_{22}$alkyl; $C_3$-$C_{12}$cycloalkyl; $C_1$-$C_{12}$alkenyl; $C_3$-$C_{12}$cycloalkenyl; $C_1$-$C_{12}$alkylthio; $C_3$-$C_{12}$cycloalkylthio; $C_1$-$C_{12}$alkenylthio; $C_3$-$C_{12}$cycloalkenylthio; $C_1$-$C_{12}$alkoxy; $C_3$-$C_{12}$cycloalkoxy; $C_1$-$C_{12}$alkenyloxy; or $C_3$-$C_{12}$cycloalkenyloxy, which may be unsubstituted or substituted by one or more, identical or different $Q_{11}$;

$Q_{13}$, $Q_{14}$, $Q_{15}$, $Q_{16}$, $Q_{17}$, $Q_{18}$, $Q_{19}$ and $Q_{20}$ independently of each other are $C_1$-$C_{22}$alkyl; $C_3$-$C_{12}$cycloalkyl; $C_2$-$C_{12}$alkenyl; $C_3$-$C_{12}$cycloalkenyl; $C_6$-$C_{14}$aryl; $C_4$-$C_{12}$heteroaryl; $C_7$-$C_{18}$aralkyl or $C_5$-$C_{16}$heteroaralkyl; or $Q_{13}$ and $Q_{14}$, $Q_{15}$ and $Q_{16}$, $Q_{16}$ and $Q_{17}$ and/or $Q_{18}$ and $Q_{19}$ may be linked together to form unsubstituted or with $C_1$-$C_4$alkyl substituted pyrrolidine, piperidine, piperazine or morpholine;

X represents a linker;
S signifies a silane-, oligosiloxane- or polysiloxane-moiety;
the term "oligosiloxane" denotes a group of the general formula Si($Q_{15}$)$_m$[OSi($Q_{16}$)]$_o$
wherein
m has a value of 0, 1 or 2,
o has a value of 3, 2 or 1; and m+o have a value of 3 or refers to groups of the general formula

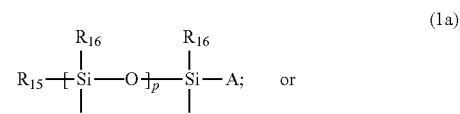

(1a)

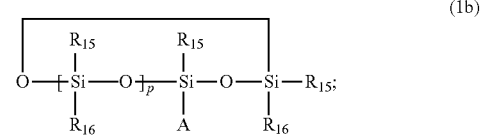

(1b)

wherein
A represents a bond to the linker X; and
p has a value of 1 to 9;
the term "polysiloxane" refers in this context to groups of the general formula

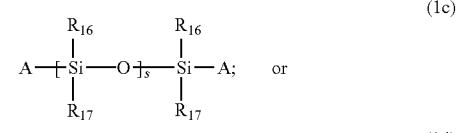

(1c)

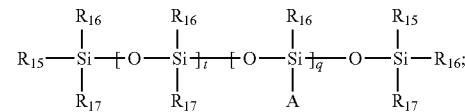

(1d)

wherein
A represents a bond to the linker X;
s has a value of 4 to 250;
t has a value of 5 to 250;
q has a value of 1 to 30;
n is 1 or integer;
n is from 1 to 6;
when n=2, $Q_1$, $Q_5$ or $Q_4$ is a bivalent alkyl group; or $Q_1$ and $Q_2$ together with the 2 nitrogen atoms linking them form a unsubstituted or alkyl-substituted

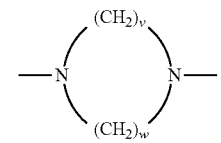

-ring;
v is from 1 to 4,
w is from 1 to 4;
when n=3, $Q_1$, $Q_5$ or $Q_4$ is a trivalent alkyl group;
when n=4, $Q_1$, $Q_5$ or $Q_4$ is a tetravalent alkyl group; and
$Q_1$ and $Q_2$ in formula V are not simultaneously hydrogen.

Any alkyl such as $C_1$-$C_{18}$alkyl may be linear or branched. Examples of alkyl having up to 18 carbon atoms are methyl, ethyl, propyl, isopropyl, n-butyl, sec-butyl, isobutyl, tert-butyl, 2-ethylbutyl, n-pentyl, isopentyl, 1-methylpentyl, 1,3-dimethylbutyl, n-hexyl, 1-methylhexyl, n-heptyl, isoheptyl, 1,1,3,3-tetramethylbutyl, 1-methylheptyl, 3-methylheptyl, n-octyl, 2-ethylhexyl, 1,1,3-trimethylhexyl, 1,1,3,3-tetramethylpentyl, nonyl, decyl, undecyl, 1-methylundecyl, dodecyl, 1,1,3,3,5,5-hexamethylhexyl, tridecyl, tetradecyl, pentadecyl, hexadecyl, heptadecyl and octadecyl.

In the compounds of the formula (IIa) $R_1$ can be hydrogen or alkyl having 1 to 24 carbon atoms, such as methyl, ethyl, propyl, butyl, hexyl, octyl, nonyl, dodecyl, tetradecyl, hexadecyl, octadecyl, nonadecyl and eicosyl and also corresponding branched isomers. Furthermore, in addition to phenylalkyl having 1 to 4 carbon atoms in the alkyl moiety, for example benzyl, $R_1$ can also be cycloalkyl having 5 to 8 carbon atoms, for example cyclopentyl, cyclohexyl and cyclooctyl, or a radical of the formula

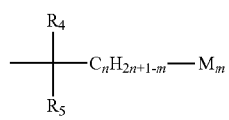

in which $R_4$ and $R_5$ independently of one another are alkyl having in each case 1 to 5 carbon atoms, in particular methyl, or $R_4$, together with the $C_nH_{2n+1-m}$ radical, forms a cycloalkyl radical having 5 to 12 carbon atoms, for example cyclohexyl, cyclooctyl and cyclodecyl. M is a radical of the formula —$COOR_6$ in which $R_6$ is not only hydrogen but also alkyl having 1 to 12 carbon atoms or alkoxyalkyl having 1 to 20 carbon atoms in each of the alkyl and alkoxy moieties. Suitable alkyl radicals $R_6$ are those enumerated for $R_1$. Examples of suitable alkoxyalkyl groups are —$C_2H_4OC_2H_6$, —$C_2H_4OC_8H_{17}$ and —$C_4H_8OC_4H_9$. As phenylalkyl having 1 to 4 carbon atoms, $R_6$ is, for example, benzyl, cumyl, alpha-methylbenzyl or phenylbutyl.

In addition to hydrogen and halogen, such as chloro and bromo, $R_2$ can also be alkyl having 1 to 18 carbon atoms. Examples of such alkyl radicals are indicated in the definitions of $R_1$. $R_2$ can also be phenylalkyl having 1 to 4 carbon atoms in the alkyl moiety, for example benzyl, alpha-methylbenzyl and cumyl.

Halogen as a substituent means fluoro, chloro, bromo or iodo, in formulae relating to stabilizing agents preferably chloro or bromo and more preferably chloro.

At least one of the radicals $R_1$ and $R_2$ must be other than hydrogen.

In addition to hydrogen or chlorine, $R_3$ is also alkyl or alkoxy having in each case 1 to 4 carbon atoms, for example methyl, butyl, methoxy and ethoxy, and also —$COOR_6$.

In the compounds of the formula (IIb) T is hydrogen or alkyl having 1 to 6 carbon atoms, such as methyl and butyl, $T_1$ is not only hydrogen or chlorine, but also alkyl or alkoxy having in each case 1 to 4 carbon atoms, for example methyl, methoxy and butoxy, and, if n is 1, $T_2$ is chlorine or a radical of the formula —$OT_3$ or —$NT_4T_5$. $T_3$ is here hydrogen or alkyl having 1 to 18 carbon atoms (cf. the definition of $R_1$). These alkyl radicals can be substituted by 1 to 3 hydroxyl groups or by a radical —$OCOT_6$. Furthermore, $T_3$ can be alkyl having 3 to 18 carbon atoms (cf. the definition of $R_1$) which is interrupted once or several times by —O— or —$NT_6$- and is unsubstituted or substituted by hydroxyl or —$OCOT_6$. Examples of $T_3$ as cycloalkyl are cyclopentyl, cyclohexyl or cyclooctyl. $T_3$ can also be alkenyl having 2 to 18 carbon atoms. Suitable alkenyl radicals are derived from the alkyl radicals enumerated in the definitions of $R_1$. These alkenyl radicals can be substituted by hydroxyl. Examples of $T_3$ as phenylalkyl are benzyl, phenylethyl, cumyl, alpha-methylbenzyl or benzyl. $T_3$ can also be a radical of the formula —$CH_2CH(OH)$-$T_7$ or

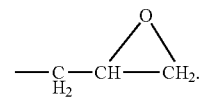

Like $T_3$, $T_4$ and $T_5$ can, independently of one another, be not only hydrogen but also alkyl having 1 to 18 carbon atoms or alkyl which has 3 to 18 carbon atoms and is interrupted once or several times by —O— or —$NT_6$-. $T_4$ and $T_5$ can also be cycloalkyl having 5 to 12 carbon atoms, for example cyclopentyl, cyclohexyl and cyclooctyl. Examples of $T_4$ and $T_5$ as alkenyl groups can be found in the illustrations of $T_3$. Examples of $T_4$ and $T_5$ as phenylalkyl having 1 to 4 carbon atoms in the alkyl moiety are benzyl or phenylbutyl. Finally, these substituents can also be hydroxyalkyl having 1 to 3 carbon atoms.

If n is 2, $T_2$ is a divalent radical of the formula

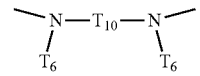

or —O-$T_9$-O—.

In addition to hydrogen, $T_6$ (see above also) is alkyl, cycloalkyl, alkenyl, aryl or phenylalkyl; examples of such radicals have already been given above.

In addition to hydrogen and the phenylalkyl radicals and long-chain alkyl radicals mentioned above, $T_7$ can be phenyl or hydroxyphenyl and also —$CH_2OT_8$ in which Tg can be one of the alkyl, alkenyl, cycloalkyl, aryl or phenylalkyl radicals enumerated.

The divalent radical $T_9$ can be alkylene having 2 to 8 carbon atoms, and such radicals can also be branched. This also applies to the alkenylene and alkynylene radicals $T_9$. As well as cyclohexylene, $T_9$ can also be a radical of the formula —$CH_2CH(OH)CH_2OT_{11}OCH_2CH(OH)CH_2$— or —$CH_2$—$C(CH_2OH)_2$—$CH_2$—.

$T_{10}$ is a divalent radical and, in addition to cyclohexylene, is also alkylene which has 2 to 20 carbon atoms and which can be interrupted once or several times by —O—. Suitable alkylene radicals are derived from the alkyl radicals mentioned in the definitions of $R_1$.

$T_{11}$ is also an alkylene radical. It contains 2 to 8 carbon atoms or, if it is interrupted once or several times by —O—, 4 to 10 carbon atoms. $T_{11}$ is also 1,3-cyclohexylene, 1,4-cyclohexylene, 1,3-phenylene or 1,4-phenylene.

Together with the two nitrogen atoms, $T_6$ and $T_{10}$ can also be a piperazine ring.

Examples of alkyl, alkoxy, phenylalkyl, alkylene, alkenylene, alkoxyalkyl and cycloalkyl radicals and also alkylthio, oxaalkylene or azoalkylene radicals in the compounds of the formulae (I), (IIa), (IIb), (IIc), (III) and IV) can be deduced from the above statements.

According to the present invention, the compounds of formulae (IIa), (IIb), and (IIc) as well as (III) are preferred.

Within the benzotriazole UV-absorbers those according to formula (IIa) are in general preferred.

The UV absorbers of the formulae (I), (IIa), (IIb), (IIc), (III) and (IV) are known per se and are described, together with their preparation in, for example, WO 96/28431 A1, EP 0 323 408 A1, EP 0 057 160 A1, U.S. Pat. No. 5,736,597, EP 0 434 608 A1, U.S. Pat. No. 4,619,956, DE 31 35 810 A1, GB 1 336 391A. Preferred meanings of substituents and individual compounds can be deduced from the documents mentioned.

According to an even more preferred embodiment, the present invention relates to above-described device wherein the 2-hydroxybenzophenone is selected from group consisting of the 4-hydroxy, 4-methoxy, 4-octyloxy, 4-decyloxy, 4-dodecyloxy, 4-benzyloxy, and 2'-hydroxy-4,4'-dimethoxy derivative of the hydroxybenzophenone;

the 2-hydroxyphenylbenzotriazole is selected from the group consisting of 2-(2'-hydroxy-5'-methylphenyl)-benzotriazole, 2-(3',5'-di-tert-butyl-2'-hydroxyphenyl)benzotriazole, 2-(5'-tert-butyl-2'-hydroxyphenyl)benzotriazole, 2-(2'-hydroxy-5'-(1,1,3,3-tetramethylbutyl)phenyl)benzotriazole, 2-(3',5'-di-tert-butyl-2'-hydroxyphenyl)-5-chloro-benzotriazole, 2-(3'-tert-butyl-2'-hydroxy-5'-methylphenyl)-5-chloro-benzotriazole, 2-(3'-sec-butyl-5'-tert-butyl-2'-hydroxyphenyl)benzotriazole, 2-(2'-hydroxy-4'-octyloxyphenyl)benzotriazole, 2-(3',5'-di-tert-amyl-2'-hydroxyphenyl)benzotriazole, 2-(3',5'-bis-(alpha,alpha-dimethylbenzyl)-2'-hydroxyphenyl)benzotriazole, 2-(3'-tert-butyl-2'-hydroxy-5'-(2-octyloxycarbonylethyl)phenyl)-5-chloro-benzotriazole, 2-(3'-tert-butyl-5'-[2-(2-ethylhexyloxy)-carbonylethyl]-2'-hydroxyphenyl)-5-chloro-benzotriazole, 2-(3'-tert-butyl-2'-hydroxy-5'-(2-methoxycarbonylethyl)phenyl)-5-chloro-benzotriazole, 2-(3'-tert-butyl-2'-hydroxy-5'-(2-methoxycarbonylethyl)phenyl)benzotriazole, 2-(3'-tert-butyl-2'-hydroxy-5'-(2-octyloxycarbonylethyl)phenyl)benzotriazole, 2-(3'-tert-butyl-5'-[2-(2-ethylhexyloxy)carbonylethyl]-2'-hydroxyphenyl)benzotriazole, 2-(3'-dodecyl-2'-hydroxy-5'-methylphenyl)benzotriazole, 2-(3'-tert-butyl-2'-hydroxy-5'-(2-isooctyloxycarbonylethyl) phenylbenzotriazole, 2,2'-methylene-bis[4-(1,1,3,3-tetramethylbutyl)-6-benzotriazole-2-yl-phenol]; the transesterification product of 2-[3'-tert-butyl-5'-methoxycarbonylethyl)-2'-hydroxyphenyl]-2H-benzotriazole with polyethylene glycol 300;

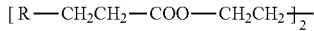

where R=3'-tert-butyl-4'-hydroxy-5'-2H-benzotriazol-2-ylphenyl, 2-[2'-hydroxy-3'-(alpha,alpha-dimethylbenzyl)-5'-(1,1,3,3-tetramethylbutyl)-phenyl]-benzotriazole; 5-trifluoromethyl-2-(2-hydroxy-3-alpha-cumyl-5-tert-octylphenyl)-2H-benzotriazole; and 2-[2'-hydroxy-3'-(1,1,3,3-tetramethylbutyl)-5'-(alpha,alpha-dimethylbenzyl)-phenyl]benzotriazole;

the 2-hydroxyphenyltriazine is selected from the group consisting of 2,4,6-tris(2-hydroxy-4-octyloxyphenyl)-1,3,5-triazine, 2-(2-hydroxy-4-octyloxyphenyl)-4,6-bis(2,4-dimethylphenyl)-1,3,5-triazine, 2-(2,4-dihydroxyphenyl)-4,6-bis(2,4-dimethylphenyl)-1,3,5-triazine, 2,4-bis(2-hydroxy-4-propyloxyphenyl)-6-(2,4-dimethylphenyl)-1,3,5-triazine, 2-(2-hydroxy-4-octyloxyphenyl)-4,6-bis(4-methylphenyl)-1,3,5-triazine, 2-(2-hydroxy-4-dodecyloxyphenyl)-4,6-bis(2,4-dimethylphenyl)-1,3,5-triazine, 2-(2-hydroxy-4-tridecyloxyphenyl)-4,6-bis(2,4-dimethylphenyl)-1,3,5-triazine, 2-[2-hydroxy-4-(2-hydroxy-3-butyloxy-propoxy)phenyl]-4,6-bis(2,4-dimethylphenyl)-1,3,5-triazine, 2-[2-hydroxy-4-(2-hydroxy-3-octyloxy-propyloxy)phenyl]-4,6-bis(2,4-dimethylphenyl)-1,3,5-triazine, 2-[4-(3-dodecyloxytridecyloxy-2-hydroxypropoxy)-2-hydroxyphenyl]-4,6-bis(2,4-dimethylphenyl)-1,3,5-triazine, 2-[2-hydroxy-4-(2-hydroxy-3-dodecyloxy-propoxy)phenyl]-4,6-bis(2,4-dimethylphenyl)-1,3,5-triazine, 2-(2-hydroxy-4-hexyloxy)phenyl-4,6-diphenyl-1,3,5-triazine, 2-(2-hydroxy-4-methoxyphenyl)-4,6-diphenyl-1,3,5-triazine, 2,4,6-tris[2-hydroxy-4-(3-butoxy-2-hydroxy-propoxy)phenyl]-1,3,5-triazine, 2-(2-hydroxyphenyl)-4-(4-methoxyphenyl)-6-phenyl-1,3,5-triazine, 2-{2-hydroxy-4-[3-(2-ethylhexyl-1-oxy)-2-hydroxypropyloxy]phenyl}-4,6-bis(2,4-dimethylphenyl)-1,3,5-triazine, 2-(2-hydroxy-4-(2-ethylhexyl)oxy)phenyl-4,6-di(4-phenyl)phenyl-1,3,5-triazine, 2,4-bis-[(4-(2-ethylhexyloxy)-2-hydroxyphenyl)]-6-(4-methoxyphenyl)-1,3,5-triazine), 2,4-bis-[(4-(2-hydroxyethyloxy)-2-hydroxyphenyl)]-6-(4-chlorophenyl)-1,3,5-triazine), 2,4-bis-(4-butyloxy-2-hydroxyphenyl)-6-(2,4-dibutyloxyphenyl)-1,3,5-triazine), 2-(2-hydroxy-4-[2-ethylhexyloxy]phenyl)-4,6-di(4-phenyl)phenyl-1,3,5-triazine, 2-(2-hydroxy-4-[1-octyloxycarbonyl-ethyl]oxy-phenyl)-4,6-di(4-phenyl)phenyl-1,3,5-triazine, 2,4-bis-(4-[1-octyloxycarbonyl]-ethyloxy-2-hydroxyphenyl)-6-(2,4-dihydroxyphenyl)-1,3,5-triazine), 2,4,6-tris-(4-[1-octyloxycarbonyl]-ethyloxy-2-hydroxyphenyl)-1,3,5-triazine), 2,4-bis-(4-[1-octyloxycarbonyl]-ethyloxy-2-hydroxyphenyl)-6-(4-[1-octyloxycarbonyl]-ethyloxy-2-hydroxyphenyl)-1,3,5-triazine).

Some specifically preferred UV absorbers are listed in the examples further below.

Antioxidant

Preferred antioxidants used according to the present invention are hindered phenols. More preferably, an antioxidant used according to the present invention is a compound of formula (1)

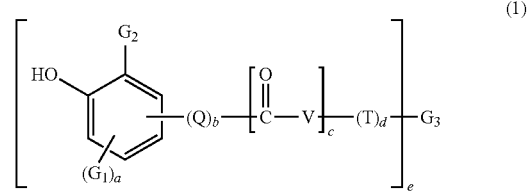

wherein
$G_1$ is hydrogen; $C_1$-$C_{22}$alkyl; $C_1$-$C_{22}$alkylthio; $C_2$-$C_{22}$alkylthioalkyl; $C_5$-$C_7$cycloalkyl; phenyl; $C_7$-$C_9$-phenylalkyl; or $SO_3M$;
$G_2$ is $C_1$-$C_{22}$alkyl; $C_5$-$C_7$cycloalkyl; phenyl; or $C_7$-$C_9$-phenylalkyl;
Q is —$C_mH_{2m}$—;

—$C_mH_{2m}$—NH; a radical of formula

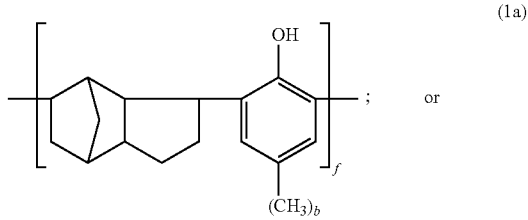

-continued (1b)
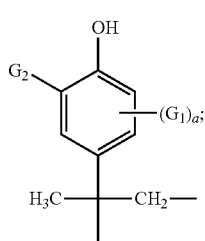

T is —$C_nH_{2n}$—; —$(CH_2)_n$—O—$CH_2$—; phenylene;

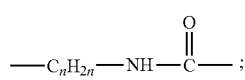

or a radical of formula (1c)

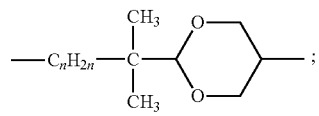

V is —O—; or —NH—;
a is 0; 1; or 2;
b, c, d and g are each independently of one another 0 or 1;
e is an integer from 1 to 4;
f is an integer from 1 to 3; and
m, n and p are each independently of one another an integer from 1 to 3;
q is 0 or an integer from 1 to 3;
if e=1,
$G_3$ is hydrogen; $C_1$-$C_{22}$alkyl; $C_5$-$C_7$cycloalkyl; $C_1$-$C_{22}$alkylthio; $C_2$-$C_{22}$alkylthioalkyl; $C_2$-$C_{18}$alkenyl; $C_1$-$C_{18}$phenylalkyl; M; $SO_3M$; a radical of formula (1d)
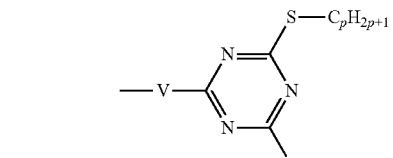

(1e)
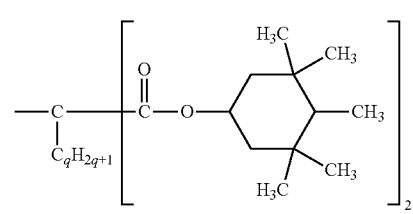

(1f)
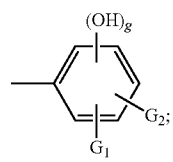

or $G_3$ is propyl substituted by OH and/or by $C_2$-$C_{22}$alkanoyloxy;

M is alkali; ammonium; H;
if e=2, then each of b and c independently is selected from 0 and 1;
$G_3$ is a direct bond; —$CH_2$—;

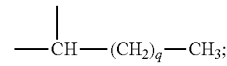

or —S—; or $G_3$ is propyl substituted by OH or $C_2$-$C_{22}$alkanoyloxy;
if e=3, then each of b and c independently is selected from 0 and 1;
$G_3$ is the radical of formula (1g)

(1h)
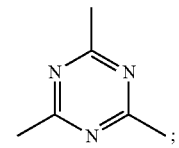

(1i)
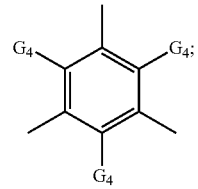

(1j)
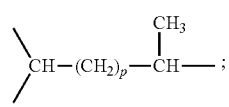

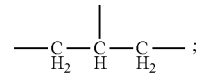

(1k)
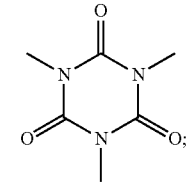

if e=4, then each of b and c independently is selected from 0 and 1;
$G_3$ is

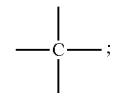

$G_4$ are each independently of the other hydrogen; or C1-C22alkyl.

Further examples for antioxidants include alkylated monophenols, for example 2,6-di-tert-butyl-4-methylphenol, 2-tert-butyl-4,6-di-methylphenol, 2,6-di-tert-butyl-4-ethyl phenol, 2,6-di-tert-butyl-4-n-butylphenol, 2,6-di-tert-butyl-4-isobutylphenol, 2,6-dicyclopentyl-4-methylphenol, 2-(α-methylcyclohexyl)-4,6-dimethylphenol, 2,6-dioctadecyl-4-methylphenol, 2,4,6-tricyclohexylphenol, 2,6-di-tertbutyl-4-meth-oxymethylphenol, nonylphenols which are linear or branched in the side chains, for example 2,6-dinonyl-4-methylphenol, 2,4-dimethyl-6-(1'-methylundec-1-yl)phenol, 2,4-dimethyl-6-(1'-methylheptadec-1'-yl)phenol, 2,4-dimethyl-6-(1'-methyltridec-1-yl)phenol and mixtures thereof; alkylthiomethylphenols, for example 2,4-dioctylthiomethyl-6-tert-butylphenol, 2,4-dioctyl-thiomethyl-6-methyl phenol, 2,4-dioctylthiomethyl-6-ethylphenol, 2,6-didodecylthiomethyl-4-nonylphenol; hydroquinones and alkylated hydroquinones, for example 2,6-di-tert-butyl-4-methoxyphenol, 2,5-di-tert-butylhydroquinone, 2,5-di-tert-amylhydroquinone, 2,6-diphenyl-4-octadecyloxyphenol, 2,6-di-tert-butyl hydroquinone, 2,5-di-tert-butyl-4-hydroxyanisole, 3,5-di-tert-butyl-4-hydroxyanisole, 3,5-di-tert-butyl-4-hydroxyphenyl stearate, bis(3,5-di-tert-butyl-4-hydroxyphenyl)adipate; tocopherols (vitamin E); ascorbic acid (vitamin C); hydroxylated thiodiphenyl ethers, for example 2,2'-thiobis(6-tert-butyl-4-methylphenol), 2,2'-thiobis(4-octylphenol), 4,4'-thiobis(6-tert-butyl-3-methylphenol), 4,4'-thiobis(6-tert-butyl-2-methylphenol), 4,4'-thiobis(3,6-di-sec-amylphenol), 4,4'-bis(2,6-dimethyl-4-hydroxyphenyl)-disulfide; alkylidenebisphenols, for example 2,2'-methylenebis(6-tert-butyl-4-methylphenol), 2,2'-methylenebis(6-tert-butyl-4-ethylphenol), 2,2'-methylenebis[4-methyl-6-(α-methylcyclohexyl)-phenol], 2,2'-methylenebis(4-methyl-6-cyclohexylphenol), 2,2'-methylenebis(6-nonyl-4-methyl-phenol), 2,2'-methylenebis(4,6-di-tert-butylphenol), 2,2'-ethylidenebis(4,6-di-tert-butylphenol), 2,2'-ethylidenebis(6-tert-butyl-4-isobutyl phenol), 2,2'-methylenebis[6-(α-methylbenzyl)-4-nonylphenol], 2,2'-methylenebis[6-(α,α-dimethylbenzyl)-4-nonylphenol], 4,4'-methylenebis(2,6-di-tert-butylphenol), 4,4'-methylenebis(6-tert-butyl-2-methylphenol), 1,1-bis(5-tert-butyl-4-hydroxy-2-methylphenyl)butane, 2,6-bis(3-tert-butyl-5-methyl-2-hydroxybenzyl)-4-methylphenol, 1,1,3-tris(5-tert-butyl-4-hydroxy-2-methylphenyl)butane, 1,1-bis(5-tert-butyl-4-hydroxy-2-methylphenyl)-3-n-dodecylmercaptobutane, ethylene glycol bis[3,3-bis(3'-tert-butyl-4'-hydroxyphenyl)butyrate], bis(3-tert-butyl-4-hydroxy-5-methyl-phenyl)dicyclopentadiene, bis[2-(3'-tert-butyl-2'-hydroxy-5'-methylbenzyl)-6-tert-butyl-4-methylphenyl]terephthalate, 1,1-bis-(3,5-dimethyl-2-hydroxyphenyl)butane, 2,2-bis(3,5-di-tert-butyl-4-hydroxyphenyl)propane, 2,2-bis-(5-tert-butyl-4-hydroxy2-methylphenyl)-4-n-dodecylmercaptobutane, 1,1,5,5-tetra(5-tert-butyl-4-hydroxy-2-methylphenyl)pentane; O-, N- and S-benzyl compounds, for example 3,5,3',5'-tetra-tert-butyl-4,4'-dihydroxydibenzyl ether, octadecyl-4-hydroxy-3,5-dimethylbenzylmercaptoacetate, tridecyl-4-hydroxy-3,5-di-tert-butylbenzylmercaptoacetate, tris(3,5-di-tert-butyl-4-hydroxybenzyl)amine, bis(4-tert-butyl-3-hydroxy-2,6-dimethylbenzyl)dithioterephthalate, bis(3,5-di-tert-butyl-4-hydroxybenzyl)sulfide, isooctyl-3,5-di-tert-butyl-4-hydroxybenzylmercaptoacetate; hydroxybenzylated malonates, for example dioctadecyl-2,2-bis(3,5-di-tert-butyl-2-hydroxybenzyl)malonate, di-octadecyl-2-(3-tert-butyl-4-hydroxy-5-methylbenzyl)malonate, di-do-decylmercaptoethyl-2,2-bis(3,5-di-tert-butyl-4-hydroxybenzyl)malonate, bis[4-(1,1,3,3-tetra-methylbutyl)phenyl]-2,2-bis(3,5-di-tert-butyl-4-hydroxybenzyl)malonate; aromatic hydroxybenzyl compounds, for example 1,3,5-tris(3,5-di-tert-butyl-4-hydroxybenzyl)-2,4,6-trimethylbenzene, 1,4-bis(3,5-di-tert-butyl-4-hydroxybenzyl)-2,3,5,6-tetramethylbenzene, 2,4,6-tris(3,5-di-tert-butyl-4-hydroxybenzyl)phenol; triazine compounds, for example 2,4-bis(octylmercapto)-6-(3,5-di-tert-butyl-4-hydroxyanilino)-1,3,5-triazine, 2-octylmercapto-4,6-bis(3,5-di-tert-butyl-4-hydroxyanilino)-1,3,5-triazine, 2-octylmercapto-4,6-bis(3,5-di-tert-butyl-4-hydroxyphenoxy)-1,3,5-triazine, 2,4,6-tris(3,5-di-tert-butyl-4-hydroxyphenoxy)-1,2,3-triazine, 1,3,5-tris(3,5-di-tert-butyl-4-hydroxybenzyl)isocyanurate, 1,3,5-tris(4-tert-butyl-3-hydroxy-2,6-di methylbenzyl)isocyanurate, 2,4,6-tris(3,5-di-tert-butyl-4-hydroxyphenylethyl)-1,3,5-triazine, 1,3,5-tris(3,5-di-tert-butyl-4-hydroxyphenylpropionyl)-hexahydro-1,3,5-triazine, 1,3,5-tris(3,5-dicyclohexyl-4-hydroxybenzypisocyanurate; benzylphosphonates, for example dimethyl-2,5-di-tert-butyl-4-hydroxybenzylphosphonate, diethyl-3,5-di-tert-butyl-4-hydroxybenzylphosphonate, dioctadecyl3,5-di-tert-butyl-4-hydroxybenzylphosphonate, dioctadecyl-5-tert-butyl-4-hydroxy-3-methylbenzylphosphonate, the calcium salt of the monoethyl ester of 3,5-di-tert-butyl-4-hydroxybenzylphosphonic acid; acylaminophenols, for example 4-hydroxylauranilide, 4-hydroxystearanilide, octyl N-(3,5-di-tert-butyl-4-hydroxyphenyl)carbamate; esters of β-(3,5-di-tert-butyl-4-hydroxyphenyl)propionic acid with mono- or polyhydric alcohols, e.g. with methanol, ethanol, n-octanol, i-octanol, octadecanol, 1,6-hexanediol, 1,9-nonanediol, ethylene glycol, 1,2-propanediol, neopentyl glycol, thiodiethylene glycol, diethylene glycol, triethylene glycol, pentaerythritol, tris(hydroxyethyl)isocyanurate, N,N'-bis(hydroxyethyl)oxamide, 3-thiaundecanol, 3-thiapentadecanol, trimethylhexanediol, trimethylolpropane, 4-hydroxymethyl-1-phospha-2,6,7-trioxabicyclo[2.2.2]octane; esters of β-(5-tert-butyl-4-hydroxy-3-methylphenyl)propionic acid with mono- or polyhydric alcohols, e.g. with methanol, ethanol, n-octanol, i-octanol, octadecanol, 1,6-hexanediol, 1,9-nonanediol, ethylene glycol, 1,2-propanediol, neopentyl glycol, thiodiethylene glycol, diethylene glycol, triethylene glycol, pentaerythritol, tris(hydroxyethyl)isocyanurate, N,N'-bis(hydroxyethyl)oxamide, 3-thiaundecanol, 3-thiapentadecanol, trimethylhexanediol, trimethyl-olpropane, 4-hydroxymethyl-1-phospha-2,6,7-trioxabicyclo[2.2.2]octane; 3,9-bis[2-{3-(3-tert-butyl-4-hydroxy-5-methylphenyl)propionyloxy}-1,1-dimethylethyl]-2,4,8,10-tetraoxaspiro[5.5]-undecane; esters of β-(3,5-dicyclohexyl-4-hydroxyphenyl)propionic acid with mono- or polyhydric alcohols, e.g. with methanol, ethanol, octanol, octadecanol, 1,6-hexanediol, 1,9-nonanediol, ethylene glycol, 1,2-propanediol, neopentyl glycol, thiodiethylene glycol, diethylene glycol, triethylene glycol, pentaerythritol, tris(hydroxyethyl)isocyanurate, N,N'-bis(hydroxyethyl)oxamide, 3-thiaundecanol, 3-thiapentadecanol, trimethylhexanediol, trimethylolpropane, 4-hydroxymethyl-1-phospha-2,6,7-trioxabicyclo[2.2.2]octane; esters of 3,5-di-tert-butyl-4-hydroxyphenyl acetic acid with mono- or polyhydric alcohols, e.g. with methanol, ethanol, octanol, octadecanol, 1,6-hexanediol, 1,9-nonanediol, ethylene glycol, 1,2-propanediol, neopentyl glycol, thiodiethylene glycol, diethylene glycol, triethylene glycol, pentaerythritol, tris(hydroxyethyl)isocyanurate, N,N'-bis(hydroxyethyl)oxamide, 3-thiaundecanol, 3-thiapentadecanol, trimethylhexanediol, trimethylolpropane, 4-hydroxymethyl-1-phospha-2,6,7-trioxabicyclo[2.2.2]octane; amides of β-(3,5-di-tert-butyl-4-hydroxyphenyl)propionic acid e.g. N,N'-bis(3,5-di-tert-butyl-4-hydroxyphenylpropionyl)hexamethylenediamide, N,N'-bis(3,5-di-tert-butyl-4-hydroxyphenylpropionyl)trimethylenediamide, N,N'-bis(3,5-di-tert-butyl-4-hydroxyphenyl-propionyl)hydrazide, N,N'-bis[2-(3-[3,5-di-tert-butyl-4-hydroxyphenyl]propionyloxy)ethyl]oxamide (Naugard®XL-1, supplied by Uniroyal); aminic antioxidants, for example N,N'-di-isopropyl-p-phenylenediamine, N,N'-di-sec-butyl-p-phenylenediamine, N,N'-bis(1,4-dimethylpentyl)-p-phenylenediamine, N,N'-bis(1-ethyl-3-methylpentyl)-p-phenylenediamine, N,N'-bis(1-methylheptyl)-p-phenylenediamine, N,N'-dicyclohexyl-p-phenylenediamine, N,N'-diphenyl-p-phenylenediamine, N,N'-bis(2-naphthyl)-p-phenylenediamine, N-isopropyl-N'-phenyl-p-phenylenediamine, N-(1,3-dimethylbutyl)-N'-phenyl-p-phenylenediamine, N-(1-methylheptyl)-N'-phenyl-p-phenylenediamine, N-cyclohexyl-N'-phenyl-p-phenylenediamine, 4-(p-toluenesulfamoyl)diphenylamine, N,N'-dimethyl-N,N'-di-sec-butyl-p-phenylenediamine, diphenylamine, N-allyldiphenylamine, 4-isopropoxydiphenylamine, N-phenyl-1-naphthylamine, N-(4-tert-octylphenyl)-1-naphthylamine, N-phenyl-2-naphthylamine, octylated diphenylamine, for example p,p'-di-tert-octyldiphenylamine, 4-n-butylaminophenol, 4-butyrylaminophenol, 4-nonanoylaminophenol, 4-dodecanoylaminophenol, 4-octadecanoylaminophenol, bis(4-methoxyphenyl)amine, 2,6-di-tert-butyl-4-dimethylaminomethylphenol, 2,4'-diaminodiphenylmethane, 4,4'-diaminodiphenylmethane, N,N,N',N'-tetramethyl-4,4'-diaminodiphenylmethane, 1,2-bis[(2-methylphenyl)amino]ethane, 1,2-bis(phenylamino)propane, (o-tolyl)biguanide, bis[4-(1,3'-dimethylbutyl)phenyl]amine, tert-octylated N-phenyl-1-naphthylamine, a mixture of mono- and dialkylated tert-butyltert-octyldiphenylamines, a mixture of mono- and dialkylated nonyldiphenylamines, a mixture of mono- and dialkylated dodecyldiphenylamines, a mixture of mono- and dialkylated isopropyl/isohexyldiphenylamines, a mixture of mono- and dialkylated tert-butyldiphenylamines, 2,3-dihydro-3,3-dimethyl-4H-1,4-benzothiazine, phenothiazine, a mixture of mono- and dialkylated tert-butyl/tert-octylphenothiazines, a mixture of mono- and dialkylated tert-octylphenothiazines, N-allylphenothiazine, N,N,N',N'-tetraphenyl-1,4-diaminobut-2-ene.

Preferred antioxidants include compounds listed in the following Table 1:

TABLE 1

Preferred antioxidants compound of formula (7)

(8)

(10)

(11)

TABLE 1-continued

Preferred antioxidants compound of formula (12)

(13) R = —CH$_2$—[3,5-di-tert-butyl-4-hydroxyphenyl]

(14) R = HO—[3,5-di-tert-butylphenyl]—(CH$_2$)$_2$—C(=O)—O—(CH$_2$)$_2$—

(15)

TABLE 1-continued
Preferred antioxidants
compound of formula
(16) 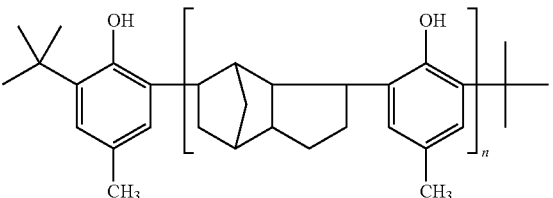
n = 1-3
(17) 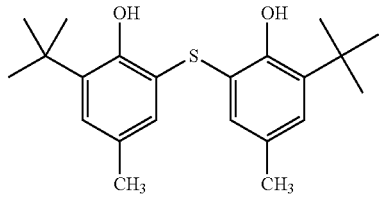 [SMILES: Cc1cc(Sc2cc(C)cc(C(C)(C)C)c2O)c(O)c(C(C)(C)C)c1]
(18) 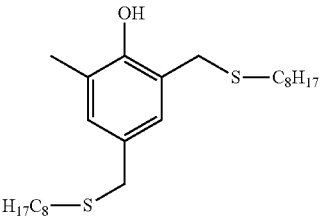
(19) 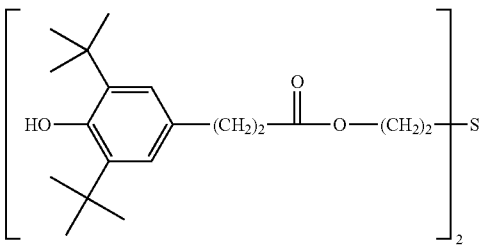
(20) 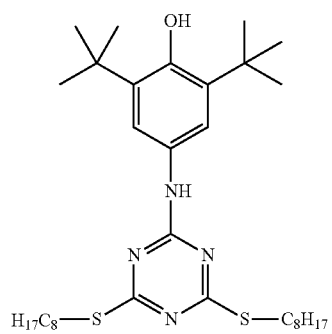
(21) 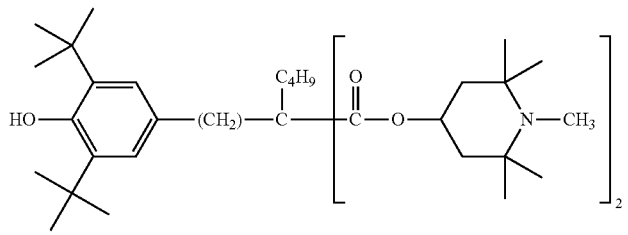

TABLE 1-continued

Preferred antioxidants compound of formula

(22) 3,5-di-tert-butyl-4-hydroxybenzoic acid hexadecyl ester

(23) 2,4-di-tert-butylphenyl 3,5-di-tert-butyl-4-hydroxybenzoate

(24) N,N'-bis[3-(3,5-di-tert-butyl-4-hydroxyphenyl)propanoyl] derivative (bis-amide)

(25) bis[2-(3-(3,5-di-tert-butyl-4-hydroxyphenyl)propanoyloxy)ethyl]amide dimer

(26) bis[2-(3-(3,5-di-tert-butyl-4-hydroxyphenyl)propanoyloxy)ethyl]amide dimer

(27) 4,4'-thiobis(2-tert-butyl-5-methylphenol)

TABLE 1-continued
Preferred antioxidants
compound of formula
(28)
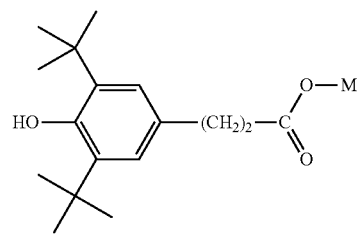
M = H, ammonium, alkali
(29)
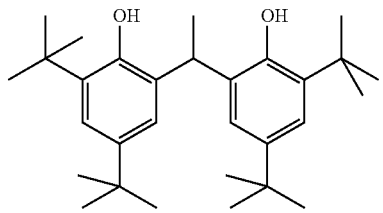 [SMILES: CC(c1cc(C(C)(C)C)cc(C(C)(C)C)c1O)c1cc(C(C)(C)C)cc(C(C)(C)C)c1O]
(30)
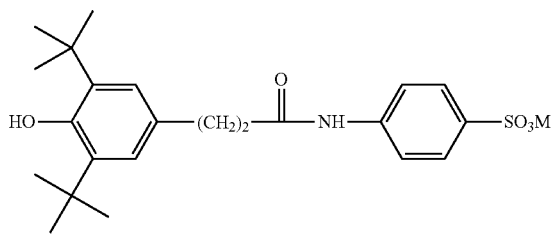
M = H, Na
(31)
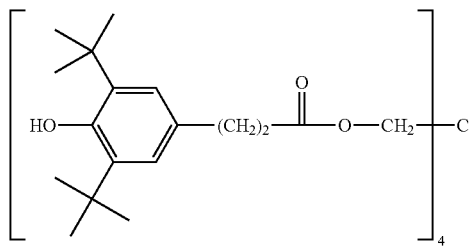
(32)
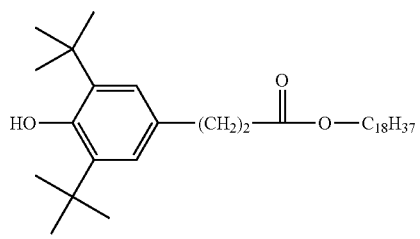

TABLE 1-continued

Preferred antioxidants compound of formula (33)

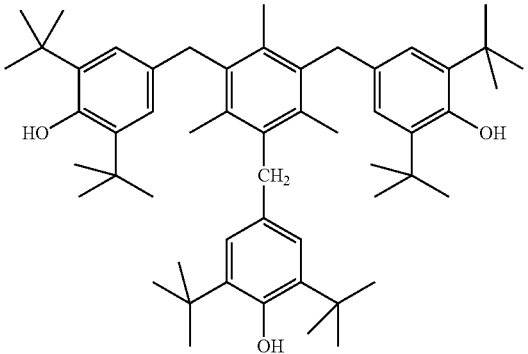 [SMILES: Cc1c(Cc2cc(C(C)(C)C)c(O)c(C(C)(C)C)c2)c(C)c(Cc2cc(C(C)(C)C)c(O)c(C(C)(C)C)c2)c(C)c1Cc1cc(C(C)(C)C)c(O)c(C(C)(C)C)c1]

An important class of antioxidants are compounds of formula (1) as defined above where both $G_1$ and $G_2$ are tert-butyl, and wherein a=1. More preferred are compounds of formula (I) as defined above where both $G_1$ and $G_2$ are tert-butyl, wherein a=1, and wherein V is O. Still more preferred are compounds of formula (I) as defined above where both $G_1$ and $G_2$ are tert-butyl, wherein a=1, and wherein V is O, and wherein e=1, such as the compound of formula (23) which is commercially available as Tinuvin® 120.

the Diketopyrrolopyrrole Polymer (DPP Polymer)

As far as the DPP polymer used as component of the semiconducting layer according to the present invention is concerned, no specific restrictions exist with the proviso that the DPP polymer is suitable for use as semiconductor material in an organic diode and/or organic field effect transistor.

Suitable DPP polymers contain one or more DPP moieties in the repeating unit, which moieties are represented by the following formula:

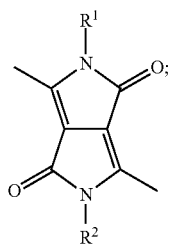

wherein $R^1$ and $R^2$ are the same or different from each other and are selected from the group consisting of hydrogen; a $C_1$-$C_{100}$ alkyl group; —COOR$^{106}$; a $C_1$-$C_{100}$ alkyl group which is substituted by one or more halogen atoms, hydroxyl groups, nitro groups, —CN, or $C_6$-$C_{18}$ aryl groups and/or interrupted by —O—, —COO—, —OCO—, or —S—; a $C_7$-$C_{100}$ arylalkyl group; a carbamoyl group; a $C_5$-$C_{12}$ cycloalkyl group which can be substituted one to three times with a $C_1$-$C_8$ alkyl group and/or a $C_1$-$C_8$ alkoxy group; a $C_6$-$C_{24}$ aryl group, in particular phenyl or 1- or 2-naphthyl which can be substituted one to three times with a $C_1$-$C_8$ alkyl group, a $C_1$-$C_{25}$ thioalkoxy group, and/or a $C_1$-$C_{25}$ alkoxy group; and pentafluorophenyl; with $R^{106}$ being a $C_1$-$C_{50}$ alkyl group, preferably a $C_4$-$C_{25}$ alkyl group.

Examples of DPP polymers and their synthesis are, for example, described in U.S. Pat. No. 6,451,459B1, WO05/049695, WO2008/000664, WO2010/049321, WO2010/049323, WO2010/108873, WO2010/115767, WO2010/136353, PCT/EP2011/060283, WO2010/136352; and especially PCT/EP2011/057878.

The DPP polymer usually stands for a polymer comprising at least one diketo-pyrrolopyrrole repeating unit of the formula

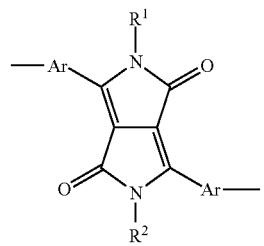

wherein $R^1$ and $R^2$ independently are selected from hydrogen, a $C_1$-$C_{100}$ alkyl group, such as a $C_6$-$C_{24}$ alkyl group; said alkyl group which is substituted by one or more halogen atoms, hydroxyl groups, nitro groups, —CN, $C_6$-$C_{18}$ aryl groups and/or is interrupted by —O—, —COO—, —OCO—, or —S—; COO—$C_1$-$C_{50}$ alkyl; a $C_7$-$C_{100}$ arylalkyl group; a carbamoyl group; $C_5$-$C_{12}$ cycloalkyl which can be substituted one to three times with $C_1$-$C_6$ alkyl and/or $C_1$-$C_8$ alkoxy; $C_6$-$C_{24}$ aryl, in particular phenyl or 1- or 2-naphthyl which can be substituted one to three times with $C_1$-$C_8$ alkyl, $C_1$-$C_8$ thioalkoxy, and/or $C_1$-$C_8$ alkoxy, or pentafluorophenyl; and Ar independently of each other are a group of formula

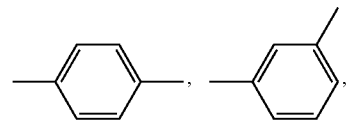

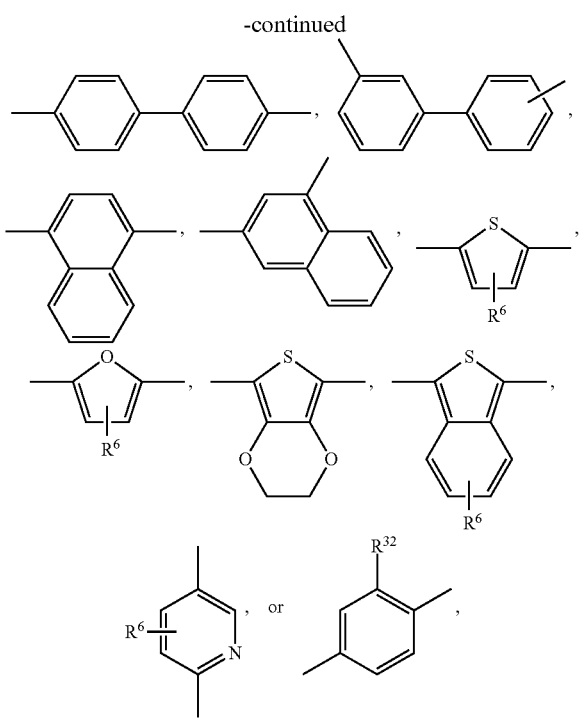

wherein $R^6$ is hydrogen, $C_1$-$C_{18}$alkyl, or $C_1$-$C_{18}$alkoxy, and $R^{32}$ is methyl, Cl, or methoxy.

$R^1$ and $R^2$ preferably are optionally branched $C_8$-$C_{36}$alkyl groups in the DPP polymers used according to the invention. Further in the above formula, Ar independently stands for a divalent residue selected from 2,5-thienylene and 2,5-furylene, each of which may be unsubstituted or substituted by $R^{3'}$, or for a divalent thiophene or thiazole moiety of the formula

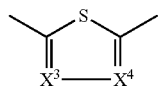

or for a divalent pyrrol moiety of the formula

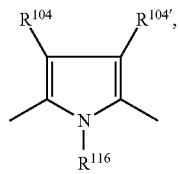

wherein one of $X^3$ and $X^4$ is N and the other is CH or $CR^{3'}$, and $R^{3'}$ independently stands for halogen such as fluoro, or a $C_1$-$C_{25}$alkyl group, $C_7$-$C_{25}$arylalkyl, or $C_1$-$C_{25}$alkoxy, especially for a $C_4$-$C_{25}$alkyl group, which may optionally be interrupted by one or more oxygen or sulphur atoms;

$R^{104}$ and $R^{104'}$ independently are hydrogen or are as defined for $R^{3'}$; and $R^{116}$ is hydrogen, $C_6$-$C_{18}$aryl; $C_6$-$C_{18}$aryl which is substituted by $C_1$-$C_{18}$alkyl, $C_1$-$C_{18}$perfluoroalkyl, or $C_1$-$C_{18}$alkoxy; $C_1$-$C_{26}$alkyl or COO—$C_1$-$C_{26}$alkyl each of which is unsubstituted or substituted in its alkyl part by CN, halogen, $C_6$-$C_{18}$aryl, and/or, in case that its alkyl part comprises 2 or more carbon atoms, may be interrupted by CO—, —COO—, —CONR$^{112}$—, —O—, —NR$^{112}$—, or —S—; where $R^{112}$ is H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_2$-$C_{18}$alkyl which is interrupted by —O—.

The term polymer comprises oligomers as well as polymers. The oligomers of this invention have a weight average molecular weight of <4,000 Daltons. The polymers of this invention preferably have a weight average molecular weight of 4,000 Daltons or greater, especially 4,000 to 2,000,000 Daltons, more preferably 10,000 to 1,000,000 and most preferably 10,000 to 100,000 Daltons. Molecular weights are determined according to high-temperature gel permeation chromatography (HT-GPC) using polystyrene standards.

A preferred class of DPP polymers for use in the present layers of organic diodes and/or organic field effect transistors and for combination with the stabilizing agent in accordance with the present invention are those disclosed in the patent application No. PCT/EP2011/060283.

For example, the DPP polymer used according to the present invention is selected from polymers of formula

 (Ia)

copolymers of formula

 (Ib)

copolymers of formula

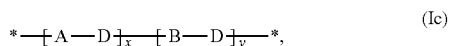 (Ic)

copolymers of formula

 (Id)

wherein
x=0.995 to 0.005, y=0.005 to 0.995, especially x=0.2 to 0.8, y=0.8 to 0.2, and wherein x+y=1;
r=0.985 to 0.005, s=0.005 to 0.985, t=0.005 to 0.985, u=0.005 to 0.985, and wherein r+s+t+u=1;
n is 4 to 1000, especially 4 to 200, very especially 5 to 100,
A is a group of formula

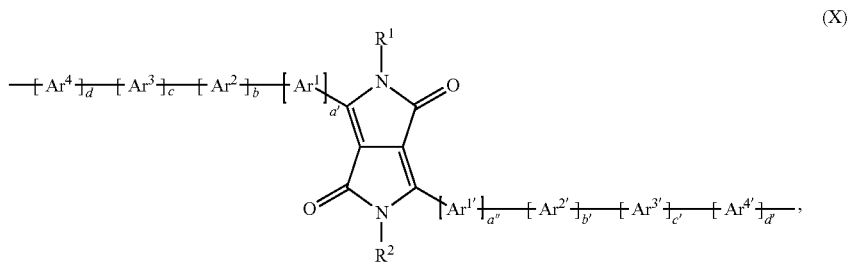 (X)

wherein a' is 1, 2, or 3; a" is 0, 1, 2, or 3; b is 0, 1, 2, or 3; b' is 0, 1, 2, or 3; c is 0, 1, 2, or 3; c' is 0, 1, 2, or 3; d is 0, 1, 2, or 3; d' is 0, 1, 2, or 3; with the proviso that b' is not 0, if a" is 0;

$R^1$ and $R^2$ may be the same or different and are selected from hydrogen, a $C_1$-$C_{100}$alkyl group, —COOR$^{106"}$ a $C_1$-$C_{100}$alkyl group which is substituted by one or more halogen atoms, hydroxyl groups, nitro groups, —CN, or $C_6$-$C_{18}$aryl groups and/or interrupted by —O—, —COO—, —OCO—, or —S—;

a $C_7$-$C_{100}$arylalkyl group, a carbamoyl group, $C_5$-$C_{12}$cycloalkyl, which can be substituted one to three times with $C_1$-$C_8$alkyl and/or $C_1$-$C_8$alkoxy, a $C_6$-$C_{24}$aryl group, in particular phenyl or 1- or 2-naphthyl which can be substituted one to three times with $C_1$-$C_8$alkyl, $C_1$-$C_{25}$thioalkoxy, and/or $C_1$-$C_{25}$alkoxy, or pentafluorophenyl, $R^{106"}$ is $C_1$-$C_{50}$alkyl, especially $C_4$-$C_{25}$alkyl;

$Ar^1$, $Ar^{1'}$, $Ar^2$, $Ar^{2'}$, $Ar^3$, $Ar^{3'}$, $Ar^4$ and $Ar^{4'}$ are independently of each other heteroaromatic, or aromatic rings, which optionally can be condensed and/or substituted, especially

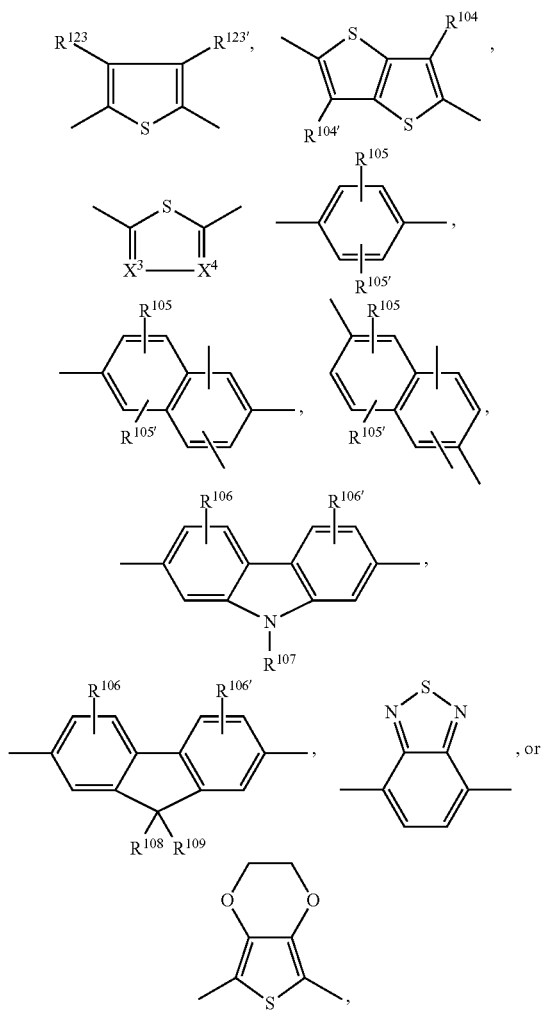

wherein
one of $X^3$ and $X^4$ is N and the other is $CR^{99}$,
$R^{99}$, $R^{104}$, $R^{104'}$, $R^{123}$ and $R^{123'}$ are independently of each other hydrogen, halogen, especially F, or a $C_1$-$C_{25}$alkyl group, especially a $C_4$-$C_{25}$alkyl, which may optionally be interrupted by one or more oxygen or sulphur atoms, $C_7$-$C_{25}$arylalkyl, or a $C_1$-$C_{25}$alkoxy group, $R^{105}$, $R^{105'}$, $R^{106}$ and $R^{106'}$ are independently of each other hydrogen, halogen, $C_1$-$C_{25}$alkyl, which may optionally be interrupted by one or more oxygen or sulphur atoms; $C_7$-$C_{25}$arylalkyl, or $C_1$-$C_{18}$alkoxy, $R^{107}$ is $C_7$-$C_{25}$arylalkyl, $C_6$-$C_{18}$aryl; $C_6$-$C_{18}$aryl which is substituted by $C_1$-$C_{18}$alkyl, $C_1$-$C_{18}$ perfluoroalkyl, or $C_1$-$C_{18}$alkoxy; $C_1$-$C_{18}$alkyl; $C_1$-$C_{18}$alkyl which is interrupted by —O—, or —S—; or —COOR$^{124}$;

$R^{124}$ is $C_1$-$C_{25}$alkyl group, especially a $C_4$-$C_{25}$alkyl, which may optionally be interrupted by one or more oxygen or sulphur atoms, $C_7$-$C_{25}$arylalkyl, $R^{108}$ and $R^{109}$ are independently of each other H, $C_1$-$C_{25}$alkyl, $C_1$-$C_{25}$alkyl which is substituted by E' and/or interrupted by D', $C_7$-$C_{25}$arylalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E' and/or interrupted by D', or $C_7$-$C_{25}$aralkyl, or $R^{108}$ and $R^{109}$ together form a group of formula =CR$^{110}$R$^{111}$ wherein $R^{110}$ and $R^{111}$ are independently of each other H, $C_1$-$C_{18}$alkyl, $C_1$-$C_{18}$alkyl which is substituted by E' and/or interrupted by D', $C_6$-$C_{24}$aryl, $C_6$-$C_{24}$aryl which is substituted by G, or $C_2$-$C_{20}$heteroaryl, or $C_2$-$C_{20}$heteroaryl which is substituted by G, or $R^{108}$ and $R^{109}$ together form a five or six membered ring, which optionally can be substituted by $C_1$-$C_{18}$alkyl, $C_1$-$C_{18}$alkyl which is substituted by E' and/or interrupted by D', $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E' and/or interrupted by D', or $C_7$-$C_{25}$aralkyl, D' is —CO—, —COO—, —S—, —O—, or NR$^{112}$—,
E' is $C_1$-$C_8$thioalkoxy, $C_1$-$C_8$alkoxy, CN, —NR$^{112}$R$^{113}$, —CONR$^{112}$R$^{113}$, or halogen,
G is E', or $C_1$-$C_{18}$alkyl, and
$R^{112}$ and $R^{113}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O— and B, D and E are independently of each other a group of formula

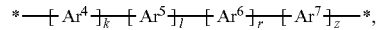

or formula X, with the proviso that in case B, D and E are a group of formula X, they are different from A, wherein
k is 1,
l is 0, or 1,
r is 0, or 1,
z is 0, or 1, and
$Ar^4$, $Ar^5$, $Ar^6$ and $Ar^7$ are independently of each other a group of formula

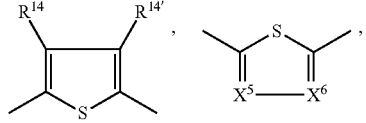

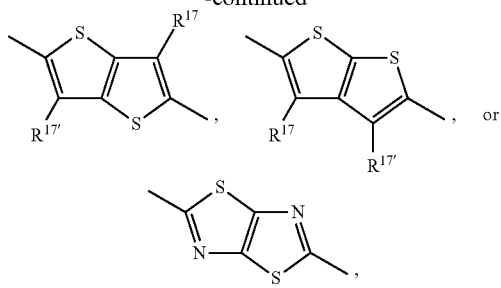

wherein one of $X^5$ and $X^6$ is N and the other is $CR^{14}$, $R^{14}$, $R^{14'}$, $R^{17}$ and $R^{17'}$ are independently of each other H, or a $C_1$-$C_{25}$alkyl group, especially a $C_6$-$C_{25}$alkyl, which may optionally be interrupted by one or more oxygen atoms.

Further preferred polymers are described in WO2010/049321.

$Ar^1$ and $Ar^{1'}$ are especially

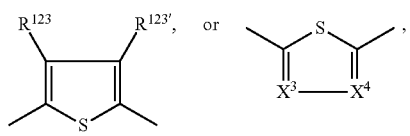

very especially

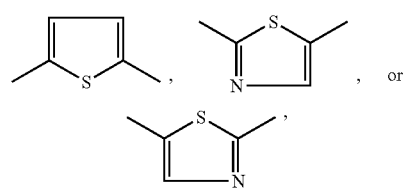

wherein

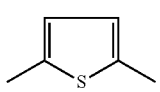

is most preferred.

$Ar^2$, $Ar^{2'}$, $Ar^3$, $Ar^{3'}$, $Ar^4$ and $Ar^{4'}$ are especially

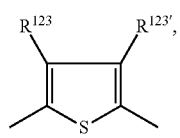

very especially

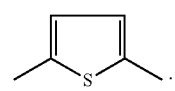

Additional preferred polymers are described in WO2010/108873.

$Ar^1$ and $Ar^{1'}$ are especially

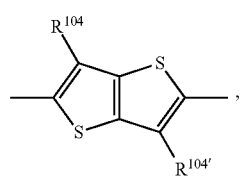

very especially

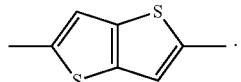

$Ar^2$, $Ar^{2'}$, $Ar^3$, $Ar^{3'}$, $Ar^4$ and $Ar^{4'}$ are especially

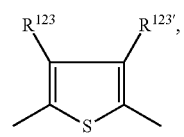

very especially

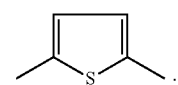

The group of formula $$*\mathrm{-\!\!\!-\!\!\!-}[Ar^4]_k[Ar^5]_l[Ar^6]_r[Ar^7]_z\mathrm{-\!\!\!-\!\!\!-}*$$

is preferably

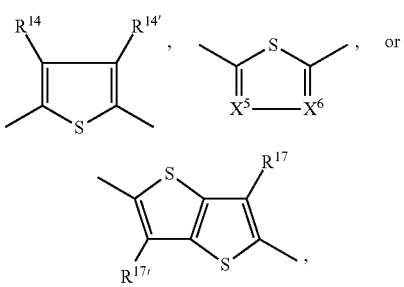

more preferably

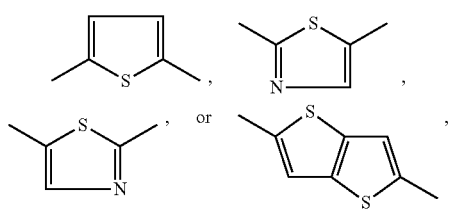

most preferred

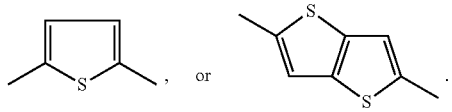

$R^1$ and $R^2$ may be the same or different and are preferably selected from hydrogen, a $C_1$-$C_{100}$alkyl group, especially a $C_8$-$C_{36}$alkyl group.

A is preferably selected from
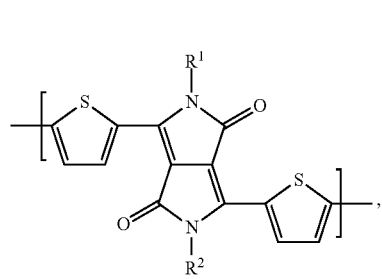 (Xa)
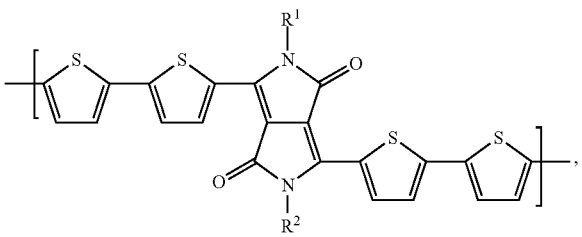 (Xb)
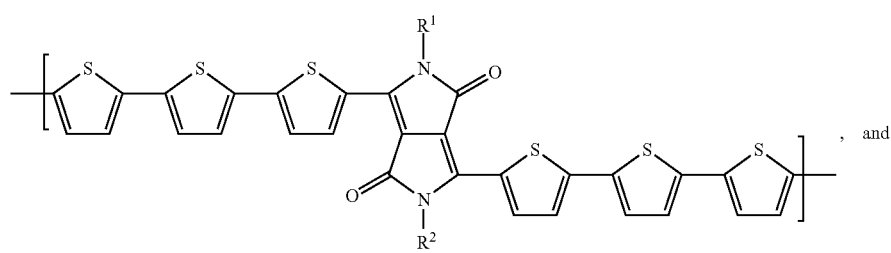 (Xc)
, and
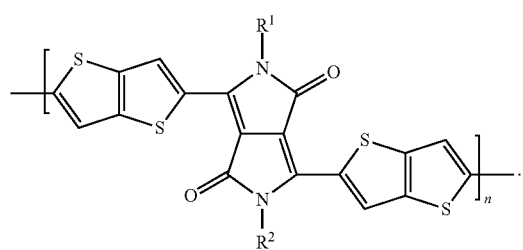 (Xd)
The group of formula
is preferably a group of formula
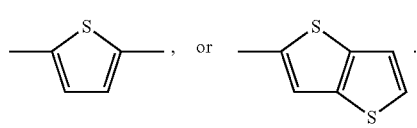
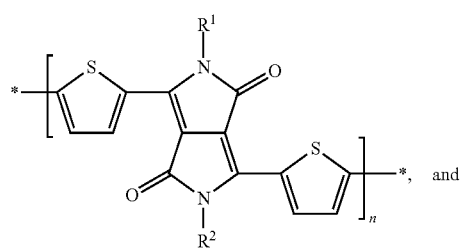 (Ia-1)
, and
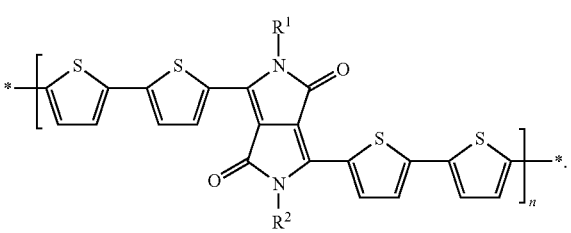 (Ia-2)
Examples of preferred DPP polymers of formula Ia are shown below:

Examples of preferred DPP polymers of formula Ib are shown below:
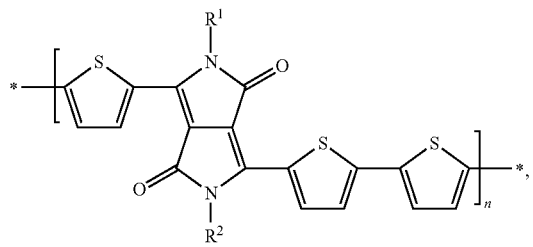
(Ib-1)
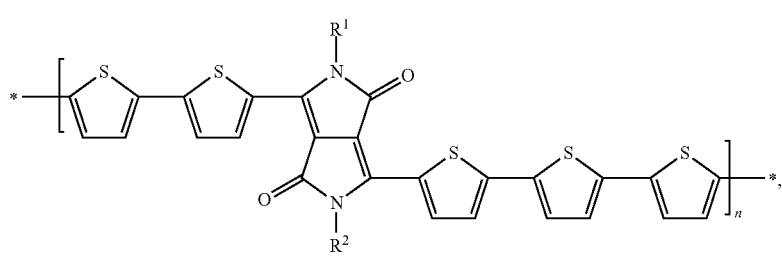
(Ib-2)
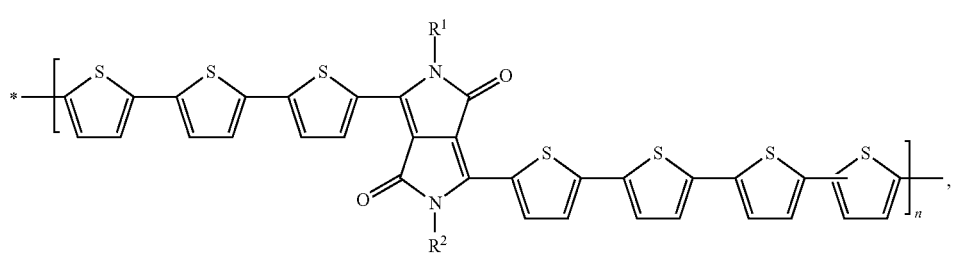
(Ib-3)
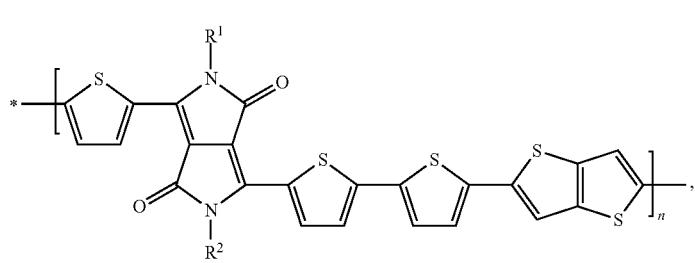
(Ib-4)
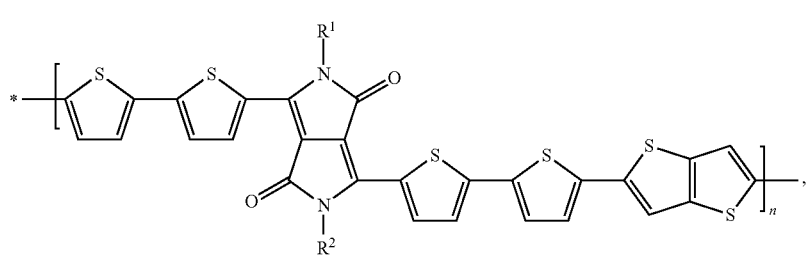
(Ib-5)
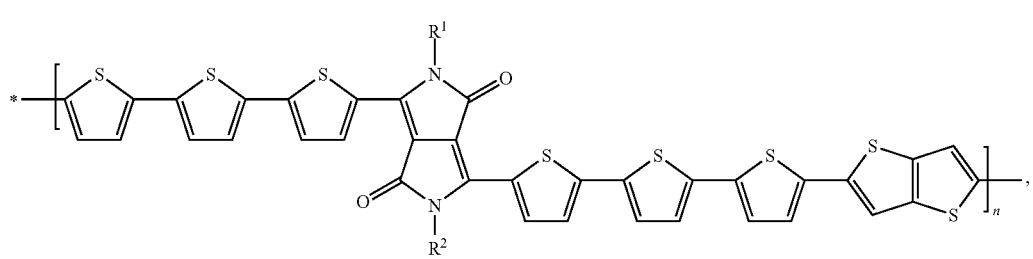
(Ib-6)

-continued

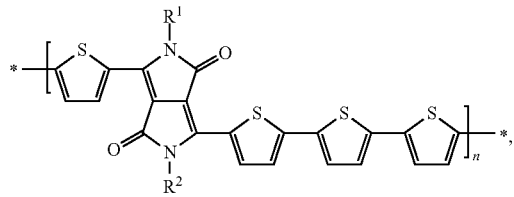
(Ib-7)

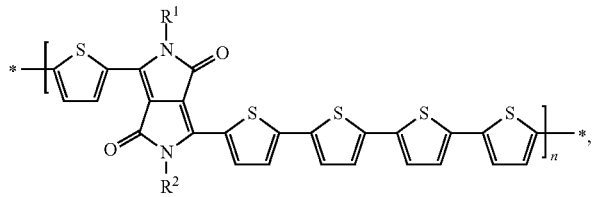
(Ib-8)

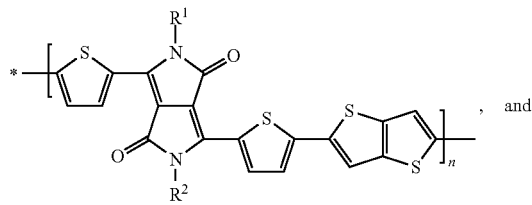
(Ib-9)

, and

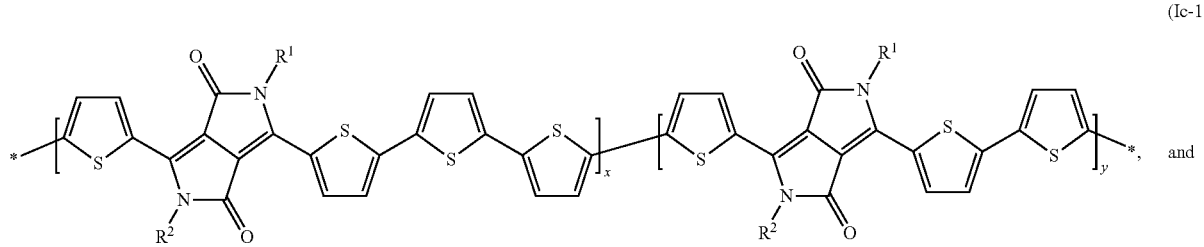
(Ib-10)

$R^1$ and $R^2$ area $C_1$-$C_{36}$alkyl group, especially a $C_8$-$C_{36}$alkyl group. n is 4 to 1000, especially 4 to 200, very especially 5 to 100.

Examples of preferred DPP polymers of formula Ic are shown below:

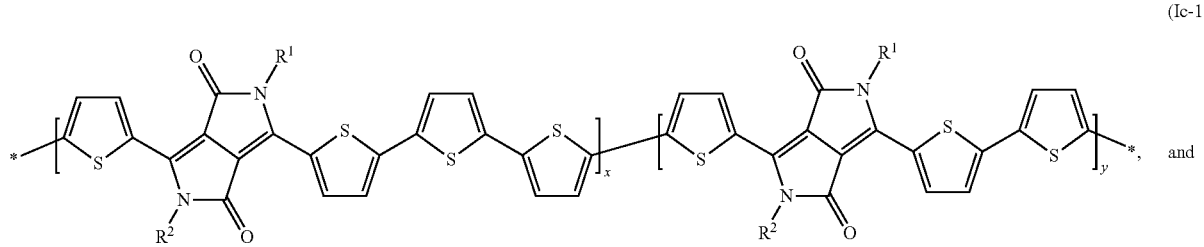
(Ic-1)

, and

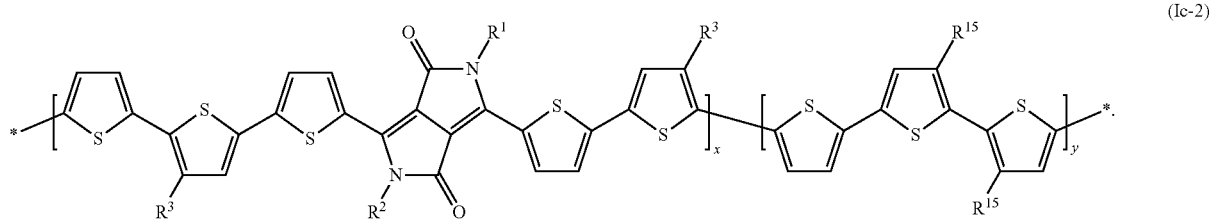
(Ic-2)

$R^1$ and $R^2$ area $C_1$-$C_{36}$alkyl group, especially a $C_8$-$C_{36}$alkyl group. $R^3$ is a $C_1$-$C_{18}$alkyl group. $R^{15}$ is a $C_4$-$C_{18}$alkyl group. x=0.995 to 0.005, y=0.005 to 0.995, especially x=0.4 to 0.9, y=0.6 to 0.1, and wherein x+y=1. Polymers of formula Ic-1 are more preferred than polymers of formula Ic-2. The polymers preferably have a weight average molecular weight of 4,000 Daltons or greater, especially 4,000 to 2,000,000 Daltons, more preferably 10,000 to 1,000,000 and most preferably 10,000 to 100,000 Daltons.

Polymers of formula Ib-1 are particularly preferred. Reference is, for example made to Example 1 of WO2010/049321:

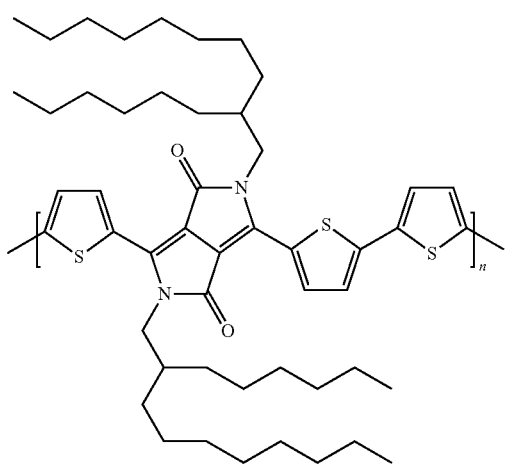

(Mw = 39'500, Polydispersity = 2.2 (measured by HT-GPC)).

In a particularly preferred embodiment of the present invention, the DPP polymer is represented by formula

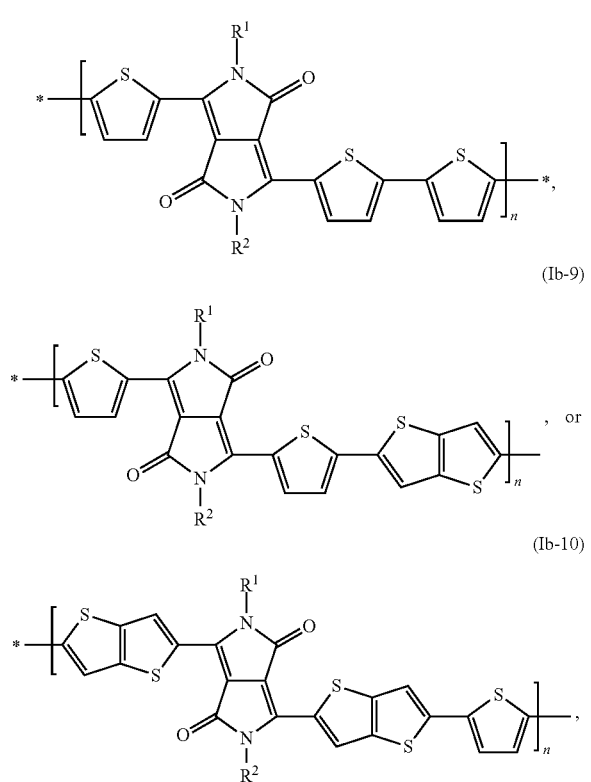

wherein n is 5 to 100 and $R^1$ and $R^2$ are a $C_1$-$C_{36}$alkyl group, especially a $C_8$-$C_{36}$alkyl group.

General Definitions

Halogen is fluorine, chlorine, bromine and iodine, especially fluorine.

$C_1$-$C_{25}$alkyl (such as $C_1$-$C_{18}$alkyl) is typically linear or branched, where possible. Examples are methyl, ethyl, n-propyl, isopropyl, n-butyl, sec.-butyl, isobutyl, tert.-butyl, n-pentyl, 2-pentyl, 3-pentyl, 2,2-dimethylpropyl, 1,1,3,3-tetramethylpentyl, n-hexyl, 1-methylhexyl, 1,1,3,3,5,5-hexamethylhexyl, n-heptyl, isoheptyl, 1,1,3,3-tetramethylbutyl, 1-methylheptyl, 3-methylheptyl, n-octyl, 1,1,3,3-tetramethylbutyl and 2-ethylhexyl, n-nonyl, decyl, undecyl, dodecyl, tridecyl, tetradecyl, pentadecyl, hexadecyl, heptadecyl, octadecyl, eicosyl, heneicosyl, docosyl, tetracosyl or pentacosyl. $C_1$-$C_8$alkyl is typically methyl, ethyl, n-propyl, isopropyl, n-butyl, sec.-butyl, isobutyl, tert.-butyl, n-pentyl, 2-pentyl, 3-pentyl, 2,2-dimethyl-propyl, n-hexyl, n-heptyl, n-octyl, 1,1,3,3-tetramethylbutyl and 2-ethylhexyl. $C_1$-$C_4$alkyl is typically methyl, ethyl, n-propyl, isopropyl, n-butyl, sec.-butyl, isobutyl, tert.-butyl.

$C_1$-$C_{25}$alkoxy ($C_1$-$C_{18}$alkoxy) groups are straight-chain or branched alkoxy groups, e.g. methoxy, ethoxy, n-propoxy, isopropoxy, n-butoxy, sec-butoxy, tert-butoxy, amyloxy, iso-amyloxy or tert-amyloxy, heptyloxy, octyloxy, isooctyloxy, nonyloxy, decyloxy, undecyloxy, dodecyloxy, tetradecyloxy, pentadecyloxy, hexadecyloxy, heptadecyloxy and octadecyloxy. Examples of $C_1$-$C_8$alkoxy are methoxy, ethoxy, n-propoxy, isopropoxy, n-butoxy, sec.-butoxy, isobutoxy, tert.-butoxy, n-pentoxy, 2-pentoxy, 3-pentoxy, 2,2-dimethylpropoxy, n-hexoxy, n-heptoxy, n-octoxy, 1,1,3,3-tetramethylbutoxy and 2-ethylhexoxy, preferably $C_1$-$C_4$alkoxy such as typically methoxy, ethoxy, n-propoxy, isopropoxy, n-butoxy, sec.-butoxy, isobutoxy, tert.-butoxy. The term "alkylthio group" means the same groups as the alkoxy groups, except that the oxygen atom of the ether linkage is replaced by a sulfur atom.

$C_2$-$C_{25}$alkenyl ($C_2$-$C_{18}$alkenyl) groups are straight-chain or branched alkenyl groups, such as e.g. vinyl, allyl, methallyl, isopropenyl, 2-butenyl, 3-butenyl, isobutenyl, n-penta-2,4-dienyl, 3-methyl-but-2-enyl, n-oct-2-enyl, n-dodec-2-enyl, isododecenyl, n-dodec-2-enyl or n-octadec-4-enyl.

$C_2$-$C_{24}$alkynyl ($C_{2-18}$alkynyl) is straight-chain or branched and preferably $C_{2-8}$alkynyl, which may be unsubstituted or substituted, such as, for example, ethynyl, 1-propyn-3-yl, 1-butyn-4-yl, 1-pentyn-5-yl, 2-methyl-3-butyn-2-yl, 1,4-pentadiyn-3-yl, 1,3-pentadiyn-5-yl, 1-hexyn-6-yl, cis-3-methyl-2-penten-4-yn-1-yl, trans-3-methyl-2-penten-4-yn-1-yl, 1,3-hexadiyn-5-yl, 1-octyn-8-yl, 1-nonyn-9-yl, 1-decyn-10-yl, or 1-tetracosyn-24-yl.

$C_5$-$C_{12}$cycloalkyl is typically cyclopentyl, cyclohexyl, cycloheptyl, cyclooctyl, cyclononyl, cyclodecyl, cycloundecyl, cyclododecyl, preferably cyclopentyl, cyclohexyl, cycloheptyl, or cyclooctyl, which may be unsubstituted or substituted. The cycloalkyl group, in particular a cyclohexyl group, can be condensed one or two times by phenyl which can be substituted one to three times with $C_1$-$C_4$-alkyl, halogen and cyano. Examples of such condensed cyclohexyl groups are:

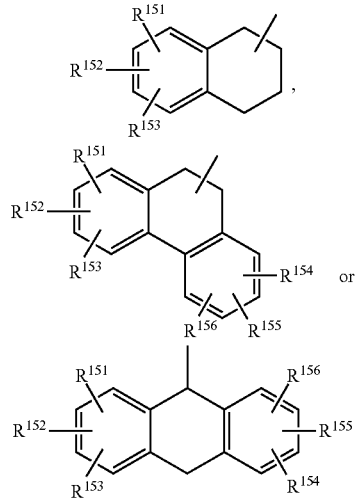

in particular

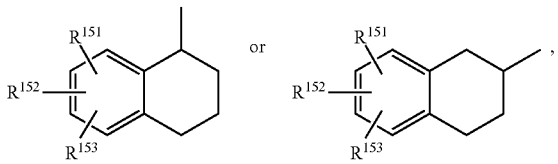

wherein $R^{151}$, $R^{152}$, $R^{153}$, $R^{154}$, $R^{155}$ and $R^{156}$ are independently of each other $C_1$-$C_8$-alkyl, $C_1$-$C_8$-alkoxy, halogen and cyano, in particular hydrogen.

$C_6$-$C_{24}$aryl ($C_6$-$C_{24}$aryl) is typically phenyl, indenyl, azulenyl, naphthyl, biphenyl, as-indacenyl, s-indacenyl, acenaphthylenyl, fluorenyl, phenanthryl, fluoranthenyl, triphenlenyl, chrysenyl, naphthacen, picenyl, perylenyl, pentaphenyl, hexacenyl, pyrenyl, or anthracenyl, preferably phenyl, 1-naphthyl, 2-naphthyl, 4-biphenyl, 9-phenanthryl, 2- or 9-fluorenyl, 3- or 4-biphenyl, which may be unsubstituted or substituted. Examples of $C_6$-$C_{12}$aryl are phenyl, 1-naphthyl, 2-naphthyl, 3- or 4-biphenyl, 2- or 9-fluorenyl or 9-phenanthryl, which may be unsubstituted or substituted.

$C_7$-$C_{25}$aralkyl is typically benzyl, 2-benzyl-2-propyl, β-phenyl-ethyl, α,α-dimethylbenzyl, ω-phenyl-butyl, ω,ω-dimethyl-ω-phenyl-butyl, ω-phenyl-dodecyl, ω-phenyl-octadecyl, ω-phenyl-eicosyl or ω-phenyl-docosyl, preferably $C_7$-$C_{18}$aralkyl such as benzyl, 2-benzyl-2-propyl, β-phenyl-ethyl, α,α-dimethylbenzyl, ω-phenyl-butyl, ω,ω-dimethyl-ω-phenyl-butyl, ω-phenyl-dodecyl or ω-phenyl-octadecyl, and particularly preferred $C_7$-$C_{12}$aralkyl such as benzyl, 2-benzyl-2-propyl, β-phenyl-ethyl, α,α-dimethylbenzyl, ω-phenyl-butyl, or ω,ω-dimethyl-ω-phenyl-butyl, in which both the aliphatic hydrocarbon group and aromatic hydrocarbon group may be unsubstituted or substituted. Preferred examples are benzyl, 2-phenylethyl, 3-phenylpropyl, naphthylethyl, naphthylmethyl, and cumyl.

The term "carbamoyl group" is typically a $C_{1-18}$-carbamoyl radical, preferably $C_{1-8}$-carbamoyl radical, which may be unsubstituted or substituted, such as, for example, carbamoyl, methylcarbamoyl, ethylcarbamoyl, n-butylcarbamoyl, tert-butylcarbamoyl, dimethylcarbamoyloxy, morpholinocarbamoyl or pyrrolidinocarbamoyl.

Heteroaryl is typically $C_2$-$C_{26}$heteroaryl ($C_2$-$C_{20}$heteroaryl), i.e. a ring with five to seven ring atoms or a condensed ring system, wherein nitrogen, oxygen or sulfur are the possible hetero atoms, and is typically an unsaturated heterocyclic group with five to 30 atoms having at least six conjugated π-electrons such as thienyl, benzo[b]thienyl, dibenzo[b,d]thienyl, thianthrenyl, furyl, furfuryl, 2H-pyranyl, benzofuranyl, isobenzofuranyl, dibenzofuranyl, phenoxythienyl, pyrrolyl, imidazolyl, pyrazolyl, pyridyl, bipyridyl, triazinyl, pyrimidinyl, pyrazinyl, pyridazinyl, indolizinyl, isoindolyl, indolyl, indazolyl, purinyl, quinolizinyl, chinolyl, isochinolyl, phthalazinyl, naphthyridinyl, chinoxalinyl, chinazolinyl, cinnolinyl, pteridinyl, carbazolyl, carbolinyl, benzotriazolyl, benzoxazolyl, phenanthridinyl, acridinyl, pyrimidinyl, phenanthrolinyl, phenazinyl, isothiazolyl, phenothiazinyl, isoxazolyl, furazanyl or phenoxazinyl, which can be unsubstituted or substituted.

Possible substituents of the above-mentioned groups are $C_1$-$C_8$alkyl, a hydroxyl group, a mercapto group, $C_1$-$C_8$alkoxy, $C_1$-$C_8$alkylthio, halogen, halo-$C_1$-$C_8$alkyl, a cyano group, a carbamoyl group, a nitro group or a silyl group, especially $C_1$-$C_8$alkyl, $C_1$-$C_8$alkoxy, $C_1$-$C_8$alkylthio, halogen, halo-$C_1$-$C_8$alkyl, or a cyano group.

As described above, aforementioned groups may be substituted by E' and/or, if desired, interrupted by D'. Interruptions are of course possible only in the case of groups containing at least 2 carbon atoms connected to one another by single bonds; $C_6$-$C_{18}$aryl is not interrupted; interrupted arylalkyl or alkylaryl contains the unit D' in the alkyl moiety. $C_1$-$C_{18}$alkyl substituted by one or more E' and/or interrupted by one or more units D' is, for example, $(CH_2CH_2O)_{1-9}$—$R^x$, where $R^x$ is H or $C_1$-$C_{10}$alkyl or $C_2$-$C_{10}$alkanoyl (e.g. CO—CH($C_2H_5$)$C_4H_9$), $CH_2$—CH(OR'")—$CH_2$—O—$R^y$, where $R^y$ is $C_1$-$C_{18}$alkyl, $C_5$-$C_{12}$cycloalkyl, phenyl, $C_7$-$C_{15}$-phenylalkyl, and $R'''$ embraces the same definitions as $R^y$ or is H; $C_1$-$C_8$alkylene-COO—$R^z$, e.g. $CH_2COOR^z$, $CH(CH_3)COOR^z$, $C(CH_3)_2COOR^z$, where $R^z$ is H, $C_1$-$C_{18}$alkyl, $(CH_2CH_2O)_{1-9}$—$R^x$, and $R^x$ embraces the definitions indicated above; $CH_2CH_2$—O—CO—CH=$CH_2$; $CH_2CH(OH)CH_2$—O—CO—C($CH_3$)=$CH_2$.

General Description of the Organic Diode and/or Organic Field Effect Transistor Device Common to all organic diode and organic field effect transistor devices is the presence of one or more semiconductor materials. Such devices include transistors, including the types p-n-p, n-p-n, and especially thin-film transistors [TFT] and field-effect transistors [FET], including organic field-effect transistor [OFET], metal-insulator field-effect transistor [MISFET], insulator-gate field-effect transistor [IGFET] and metal-semiconductor field-effect transistor [MESFET]. Further examples for devices of the invention are light emitting semiconductor devices (for example, organic light emitting diodes in display applications or backlight in e.g. liquid crystal displays), field-effect diodes, Schottky diodes, and so forth. In each semiconductor device, the semiconductor material is combined with one or more metals, metal oxides, such as, for example, indium tin oxide (ITO), polyaniline, PEDOT:PSS, other conducting monomers or polymers, alloys thereof, combinations thereof, and multilayers thereof, and/or insulatorsdielectrics (such as PMMA) to form the device. In particular, organic electronic components can be manufactured as described by D. R. Gamota et al. in Printed Organic and Molecular Electronics, Kluver Academic Publ., Boston, 2004.

A particularly useful type of transistor device, the thin-film transistor (TFT), generally includes a gate electrode, a gate dielectric on the gate electrode, a source electrode and a drain electrode adjacent to the gate dielectric, and a semiconductor layer adjacent to the gate dielectric and adjacent to the source and drain electrodes (see, for example, S. M. Sze, Physics of Semiconductor Devices, $2^{nd}$ edition, John Wiley and Sons, page 492, New York (1981)). These components can be assembled in a variety of configurations.

The semiconductor device according to the present invention is preferably an organic field effect transistor. The organic field effect transistor comprises a gate electrode, a gate insulating layer, a semiconductor layer, a source electrode, and a drain electrode, the semiconductor layer represents the layer comprising the DPP polymer and the stabilizing agent.

The organic material forming the semiconductive layer (DPP polymer with stabilizing agent, and optional further components such as acceptor compound) usually is solution processable, i.e. it may be deposited by, for example, coating or printing techniques.

Suitable coating techniques which can be used according to the present invention are, for example, spin-coating, slot-die coating (also called as extrusion coating), curtain coating, reverse gravure coating, blade coating, spray coating, and dip coating. Preferred coating techniques are, for example, slot-die (extrusion) coating or reverse gravure coating.

Suitable printing techniques which can be used according to the present invention are, for example, inkjet printing, flexography printing, (forward) gravure printing, screen printing, pad printing, offset printing, and reverse offset printing. Preferred printing techniques are, for example, flexography printing, (forward) gravure printing or inkjet printing.

An OFET device according to the present invention preferably comprises:
  a source electrode,
  a drain electrode,
  a gate electrode,
  a semiconducting layer,
  one or more gate insulator layers, and
  optionally a substrate, wherein the semiconducting layer comprises the DPP polymer and the stabilizing agent.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer.

Preferably the OFET comprises an insulator having a first side and a second side, a gate electrode located on the first side of the insulator, a layer comprising the DPP polymer and the stabilizing agent located on the second side of the insulator, and a drain electrode and a source electrode located on the polymer layer.

The OFET device can be a top gate device or a bottom gate device.

Suitable structures and manufacturing methods of an OFET device are known to the person skilled in the art and are described in the literature, for example in WO03/052841.

A semiconductor device of specific interest is a device comprising a vertical transistor structure based on DPP polymers as described in US patent appl. No. 61/425,777 and EP patent appl. No. 10196429.4.

Typically the semiconducting layer of the present invention is at most 1 micron (=1 µm) thick, although it may be thicker if required. For various electronic device applications, the thickness may also be less than about 1 micron thick. For example, for use in an OFET the layer thickness may typically be 100 nm or less. The exact thickness of the layer will depend, for example, upon the requirements of the electronic device in which the layer is used.

The insulator layer (dielectric layer) generally can be an inorganic material film or an organic polymer film. Illustrative examples of inorganic materials suitable as the gate dielectric layer include silicon oxide, silicon nitride, aluminum oxide, barium titanate, barium zirconium titanate and the like. Illustrative examples of organic polymers for the gate dielectric layer include polyesters, polycarbonates, poly (vinyl phenol), polyimides, polystyrene, poly(methacrylate)s [PMMA], poly(acrylate)s, epoxy resin, photosensitive resists as described in WO07/113107 and the like. In an exemplary embodiment, a thermally grown silicon oxide ($SiO_2$) or anodically oxidized alumina ($Al_2O_3$) on Al gate electrode may be used as the dielectric layer, each of which may be produced with especially low thickness.

The thickness of the dielectric layer is, for example from about 5 nanometers to about 2000 nanometers depending on the dielectric constant of the dielectric material used. A representative thickness of the dielectric layer is from about 100 nanometers to about 500 nanometers. The dielectric layer may have a conductivity that is for example less than about 10-12 S/cm.

The gate insulator layer may comprise, for example, a fluoropolymer, like e.g. the commercially available Cytop 809M®, or Cytop 107M® (from Asahi Glass). Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a per-fluorosolvent. A suitable perfluorosolvent is e.g. FC75® (available from Acros, catalogue number 12380). Other suitable fluoropolymers and fluorosolvents are known in prior art, like for example the perfluoropolymers Teflon AF® 1600 or 2400 (from DuPont), or Fluoro-pel® (from Cytonix) or the perfluorosolvent FC 43® (Acros, No. 12377).

In order to form the organic active layer using the DPP polymer, stabilizing agent and optional further component(s) such as the acceptor compound, a composition for the organic active layer including chloroform or chlorobenzene may be used. Suitable solvents for preparing the mixtures according to the present application are all common solvents in which the DPP polymer, stabilizing agents and acceptor compound have satisfactory solubility. Examples of common organic solvents include, but are not limited to, petroleum ethers, aromatic hydrocarbons such as benzene, chlorobenzene, dichlorobenzene, preferably 1,2-dichlorobenzene, trichlorobenzene, cyclohexylbenzene, toluene, anisole, xylene, naphthalene, chloronaphtalene, tetraline, indene, indane, cyclooctadiene, styrene, decaline and mesitylene;

halogenated aliphatic hydrocarbons such as dichloromethane, chloroform and ethylenechloride;

ethers such as dioxane and dioxolane;

ketones such as cyclopentanone and cyclohexanone;

aliphatic hydrocarbons such as hexanes and cyclohexanes; and suitable mixtures of two or more of said solvents.

Preferred solvents are dichlorobenzene, toluene, xylene, tetraline, chloroform, mesitylene and mixtures of two or more thereof.

Examples of the process of forming the organic semiconductor layer may include, but may not be limited to, screen printing, printing, spin coating, dipping or ink jetting. Further techniques include those described above.

As such, in the gate insulating layer (gate dielectric) included in the OFET any insulator having a high dielectric constant may be used as long as it is typically known in the art. Specific examples thereof may include, but may not be limited to, a ferroelectric insulator, including Ba0.33Sr0.66TiO3 (BST: Barium Strontium Titanate), Al2O3, Ta2O5, La2O5, Y2O5, or TiO2, an inorganic insulator, including PbZr0.33Ti0.66O3 (PZT), Bi4Ti3O12, BaMgF4, SrBi2(TaNb)2O9, Ba(ZrTi)O3(BZT), BaTiO3, SrTiO3, Bi4Ti3O12, SiO2, SiNx, or AlON, or an organic insulator, including polyimide, benzocyclobutane (BCB), parylene, polyvinylalcohol, polyvinylphenol, polyvinylpyrrolidine (PVP), acrylates such as polymethylmethacrylate (PMMA) and benzocyclobutanes (BCBs). The insulating layer may be formed from a blend of materials or comprise a multi-layered structure. The dielectric material may be deposited by thermal evaporation, vacuum processing or lamination techniques as are known in the art. Alternatively, the dielectric material may be deposited from solution using, for example, spin coating or ink jet printing techniques and other solution deposition techniques.

If the dielectric material is deposited from solution onto the organic semiconductor, it should not result in dissolution of the organic semiconductor. Likewise, the dielectric material should not be dissolved if the organic semiconductor is deposited onto it from solution. Techniques to avoid such dissolution include: use of orthogonal solvents, that is use of a solvent for deposition of the uppermost layer that does not dissolve the underlying layer, and crosslinking of the underlying layer. The thickness of the insulating layer is preferably less than 2 micrometres, more preferably less than 500 nm.

In the gate electrode and the source/drain electrodes included in the OFET of the present invention, a typical metal may be used, specific examples thereof include, but are not limited to, platinum (Pt), palladium (Pd), gold (Au), silver (Ag), copper (Cu), aluminum (Al), nickel (Ni). Alloys and oxides, such as molybdenum trioxide and indium tin oxide (ITO), may also be used. Preferably, the material of at least one of the gate, source and drain electrodes is selected from the group Cu, Ag, Au or alloys thereof. The source and drain electrodes may be deposited by thermal evaporation and patterned using standard photolithography and lift off techniques as are known in the art.

The substrate may be rigid or flexible. Rigid substrates may be selected from glass or silicon and flexible substrates may comprise thin glass or plastics such as poly (ethylene terephthalate) (PET), polyethylenenaphthalate (PEN), polycarbonate, polycarbonate, polyvinylalcohol, polyacrylate, polyimide, polynorbornene, and polyethersulfone (PES).

Alternatively, conductive polymers may be deposited as the source and drain electrodes. Examples of such conductive polymers are poly(ethylene dioxythiophene) (PEDOT), polyaniline (PANI) and other conductive polymers known in the art. Such conductive polymers may be deposited from solution using, for example, spin coating or ink jet printing techniques, as well as other solution deposition techniques as noted above for the active layer.

The source and drain electrodes are preferably formed from the same material for ease of manufacture. However, it will be appreciated that the source and drain electrodes may be formed of different materials for optimisation of charge injection and extraction respectively.

Typical thicknesses of source and drain electrodes are about, for example, from about 40 nanometers to about 1 micrometer with the more specific thickness being about 100 to about 400 nanometers.

The length of the channel defined between the source and drain electrodes may be up to 500 microns, but preferably the length is less than 200 microns, more preferably less than 100 microns, most preferably less than 20 microns.

Other layers may be included in the device architecture. For example, a self assembled monolayer (SAM) may be deposited on the gate, source or drain electrodes, substrate, insulating layer and organic semiconductor material to promote crystallity, reduce contact resistance, repair surface characteristics and promote adhesion where required. Exemplary materials for such a monolayer include chloro- or alkoxy-silanes with long alkyl chains, eg octadecyltrichlorosilane.

The method of fabricating an ambipolar organic thin film transistor may include forming a gate electrode, a gate insulating layer, an organic active layer, and source/drain electrodes on a substrate, wherein the organic active layer (semiconductor layer) includes the DPP polymer and the stabilizing agent. The organic active layer may be formed into a thin film through known techniques such as screen printing, printing, spin coating, dipping or ink jetting, as noted above.

The insulating layer may be formed using material selected from the group consisting of a ferroelectric insulator, including Ba0.33Sr0.66TiO3 (BST: Barium Strontium Titanate), Al2O3, Ta2O5, La2O5, Y2O5, or TiO2, an inorganic insulator, including PbZr0.33Ti0.66O3 (PZT), Bi4Ti3O12, BaMgF4, SrBi2(TaNb)2O9, Ba(ZrTi)O3(BZT), BaTiO3, SrTiO3, Bi4Ti3O12, SiO2, SiNx, or AlON, or an organic insulator, including polyimide, benzocyclobutane (BCB), parylene, polyvinylalcohol, or polyvinylphenol. The substrate may be formed using material selected from the group consisting of glass, polyethylenenaphthalate (PEN), polyethyleneterephthalate (PET), poly-carbonate, polyvinylalcohol, polyacrylate, polyimide, polynorbornene, and polyethersulfone (PES). The gate electrode and the source/drain electrodes may be formed using material selected from the group consisting of gold (Au), silver (Ag), copper (Cu), aluminum (Al), nickel (Ni), and indium tin oxide (ITO).

The method of manufacturing the organic thin film transistor may comprise: depositing a source and drain electrode; forming a semiconductive layer on the source and drain electrodes, the semiconductive layer of comprising the DPP polymer and the stabilizing agent in a channel region between the source and drain electrode. The organic semiconductive material is preferably deposited from solution. Preferred solution deposition techniques include spin coating and ink jet printing. Other solution deposition techniques include those noted further above, for example dip-coating, roll printing and screen printing.

A bottom-gate OFET device may be formed using the method illustrated below.

1. Gate deposition and patterning (e.g. patterning of an ITO-coated substrate).
2. Dielectric deposition and patterning (e.g. cross-linkable, photopatternable dielectrics).
3. Source-drain material deposition and patterning (e.g. silver, photolithography).
4. Source-drain surface treatment. The surface treatment groups could be applied by dipping the substrate into a solution of the self-assembled material, or applying by spin coating from a dilute solution. Excess (un-attached) material can be removed by washing.
5. Deposition of the organic semiconductive material (e.g. by ink jet printing).

This technique is also compatible with top-gate devices. In this case, the source-drain layer is deposited and patterned first. The surface treatment is then applied to the source-drain layer prior to organic semiconductive material, gate dielectric and gate deposition.

OFETs comprising the present DPP polymer and stabilizing agent have a wide range of possible applications. One such application is to drive pixels in an optical device (apparatus), preferably an organic optical device. Examples of such optical devices include photoresponsive devices, in particular photodetectors, and light-emissive devices, in particular organic light emitting devices, and reflective devices such as electrophoretic and electrochromic devices. High mobility OTFTs are particularly suited as backplanes for use with active matrix organic light emitting devices or reflective devices, e.g. for use in display applications.

The layer comprising the DPP polymer may contain further additives such as an acceptor compound, e.g. having an electron affinity in vacuum of 4.6 eV or more, as described in international patent application No. PCT/EP2011/060283.

The acceptor compounds may, for example, be selected from quinoid compounds, such as a quinone or quinone derivative, 1,3,2-dioxaborines, a 1,3,2-dioxaborine derivatives, oxocarbon-, pseudooxocarbon- and radialene compounds and imidazole derivatives. Such compounds have, for example, been described in K. Walzer, B. Maennig, M. Pfeiffer, and K. Leo, Chem. Rev. 107 (2007) 1233-1271, EP1596445A1 (quinone or a quinone derivative or a 1,3,2-dioxaborin or a 1,3,2-dioxaborin derivative), WO2009/003455A1 (quinoid compounds), WO2008/138580 (imidazole derivatives), and US2008/0265216 (oxocarbon-, pseudooxocarbon- and radialene compounds). Further preferred compounds are, for example, described in U.S. Pat. Nos. 5,281,730, 5,464,697 and WO2010/063609 (PCT/EP2009/065687); or EP860820.

the Mixture Comprising the at Least One DPP Polymer and the at Least One Stabilizing Agent According to the present invention, the semiconductor layer of the inventive organic diode and/or organic field effect transistor device comprises a mixture which comprises the at least one diketopyrrolopyrrole (DPP) polymer and the at least one stabilizing agent.

Therefore, according to the present invention, said mixture may comprise one or more of above-described DPP polymers and one or more of above-described stabilizing agents. For example, the mixture may comprise one or more DPP polymers and one or more UV absorbing agents and no anti-radical agent. Also, the mixture may comprise one or more DPP polymers and no UV absorbing agent and one or more antioxidants and/or anti-radical agents. Further, the mixture may comprise one or more DPP polymers and one or more UV absorbing agent and one or more antioxidants and/or anti-radical agents.

According to a preferred embodiment of the present invention, the at least one DPP polymer comprised in the at least one semiconductor region is a DPP polymer of structure (Ib), even more preferably of structure (Ib-1), (Ib-9), (Ib-10). Therefore, the present invention relates to above-described semiconductor structure, wherein the DPP polymer is, for example, a polymer according to formula (Ib-1)

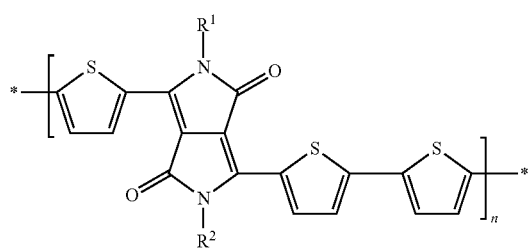

(Ib-1)

wherein $R^1$ and $R^2$ are independently from each other a $C_8$-$C_{36}$ alkyl group, with n=4 to 1000, preferably 4 to 200, more preferably 5 to 100, and a stabilizing agent selected from UV absorbers (UVAs), hindered amine light stabilizer (HALS) and phenolic antioxidants. For example, the stabilizing agent in the above embodiment comprises a HALS and no UVA and no phenolic antioxidant; or the stabilizing agent in the above embodiment comprises a UVA and no HALS and no phenolic antioxidant. In another example, the stabilizing agent in the above embodiment comprises a combination of a HALS and an UVA (without phenolic antioxidant); or the stabilizing agent in the above embodiment comprises a combination of a HALS and a phenolic antioxidant (without UVA); or the stabilizing agent in the above embodiment comprises a combination of a UVA and a phenolic antioxidant (without HALS).

According to an especially preferred embodiment of the present invention, the at least one DPP polymer comprised in the at least one semiconductor region is a DPP polymer of structure (Ib), even more preferably of structure (Ib-1), (Ib-9), (Ib-10), for example, a polymer according to formula (Ib-1) shown above, and one or more UV absorbing agents, preferably one UV absorbing agent, more preferably a UV absorbing agent of formula (IIa), (IIb), (IIc) or (III), as described above, more preferably a UV absorbing agent of formula (IIa), and a HALS and no antioxidant, or said UV absorbing agent or mixture of UV absorbing agents and no HALS and no anitoxidant.

Most preferred UV absorbing agents are hydroxyphenyl triazines such as Tinuvin® 1577, Tinuvin® 400, Tinuvin® 405, Tinuvin® 777, Tinosorb® S, Cyagard® 1164, CGX UVA 006. Preferred hindered amine light stabilizers (HALS) are of structure (a), (b), (c), (d) shown further above, such as the compound

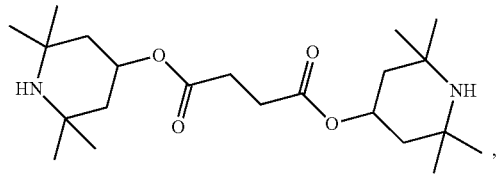

or further HALS of the Tinuvin® series including Tinuvin® 770, Tinuvin® 111, Tinuvin® 123, Tinuvin® 144, Tinuvin® 622, Tinuvin® 765.

As far as the amounts of respective DPP polymer and stabilizing agent comprised in the mixture are concerned, no specific restrictions exist with the proviso that the stabilization effect is achieved and the mixture is suitable for use in a semiconducting layer in the inventive organic diode and/or organic field effect transistor device.

Preferably, the mixture comprising the at least one DPP polymer and the at least one stabilizing agent, the weight ratio of stabilizing agent relative to the DPP polymer is in the range of from 0.0005:1 to 0.1:1 to, preferably from 0.001:1 to less than 0.05:1, more preferably from 0.005:1 to 0.025:1. In this context, and in the term "weight ratio of stabilizing agent relative to the DPP polymer", the term "stabilizing agent" relates to the sum of all stabilizing agents contained in the mixture, and the "DPP polymer" relates to the sum of all DPP polymers contained in the mixture.

If an electron acceptor material (or acceptor compound) is comprised in the semiconducting layer, its weight ratio relative to the DPP polymer usually is from the range 0.1:1 to 10:1, preferably from 0.5:1 to 3:1, more preferably from 0.8:1 to 2:1. In this context, and in the term "weight ratio of the electron acceptor material relative to the DPP polymer", the term "electron acceptor material" relates to the sum of all electron acceptor materials contained in the mixture, and the "DPP polymer" relates to the sum of all DPP polymers contained in the mixture.

According to an embodiment of the present invention, at least one of the device's semiconductor layer(s) essentially consists of the mixture comprising DPP polymer and stabilizing agent, and optionally an acceptor material or further additive.

According to the present invention, it was found that it is not necessary to apply, in addition to a semiconducting layer comprising a DPP polymer, a further layer which protects the semiconducting layer and, therefore, the device in total from degradation during usage. On the contrary, it was found that employing, as semiconducting layer, a mixture which contains the DPP polymer and, simultaneously, at least one stabilizing agent which is preferably a UV absorbing agent or antioxidant or an anti-radical agent, and which, according to an even more preferred embodiment, is not a hindered amine light stabilizer (HALS), preferably not a hindered amine, it is possible the increase the product life of the organic diode and/or organic field effect transistor device.

Therefore, the present invention also relates to the use of a mixture comprising at least one stabilizing agent (which is preferably a UV absorbing agent or antioxidant or an anti-radical agent) and at least one diketopyrrolopyrrole (DPP) polymer for increasing the product life of an organic diode and/or organic field effect transistor device containing the mixture in at least one semiconducting layer.

Accordingly, the present invention also relates to a method of increasing the product life of an organic diode and/or organic field effect transistor device by using a mixture comprising at least one stabilizing agent which is preferably a UV absorbing agent or antioxidant or an anti-radical agent, and at least one diketopyrrolopyrrole (DPP) polymer as mixture contained in at least one semiconductor layer of the device.

As already discussed above, application of such additional protecting layer usually requires harsh conditions which have a detrimental impact on the semiconducting layer onto which the protecting layer is applied. This significant disadvantage of the known technique can be overcome by the process according to the present invention and the organic diode and/or organic field effect transistor devices according to the present invention.

Therefore, the present invention also relates to the use of a mixture comprising at least one stabilizing agent which is preferably a UV absorbing agent or antioxidant or an anti-radical agent, and at least one diketopyrrolopyrrole (DPP) polymer for preventing the at least one DPP polymer from degradation during production of an organic diode and/or organic field effect transistor device containing the mixture in at least one semiconductor layer.

Accordingly, the present invention also relates to a method of preventing at least one DPP polymer from degradation during production of an organic diode and/or organic field effect transistor device containing said at least one DPP polymer by using a mixture comprising at least one stabilizing agent which is preferably a UV absorbing agent or antioxidant or an anti-radical agent, and said at least one diketopyrrolopyrrole (DPP) polymer, the organic diode and/or organic field effect transistor device containing said mixture in at least one semiconductor layer.

The present invention is illustrated by the following figures and examples.

BRIEF DESCRIPTION OF FIGURES

FIG. 3 The average field-effect mobility ($\mu$) measured for 24 OFETs of pristine (diamond) and degraded (square) OFETs respectively. $\mu$ are monitored for roughly one month after the photodegradation. The $\mu$ ratio (triangle) and the corresponding trend are also plotted. The estimated error bars are also indicated. Samples containing no stabilizing agent (a), or 1% of Tinuvin 780 (b), Chimassorb 81 (c), Tinuvin 1577 (d).

FIG. 4 The average on-current (i.e., drain-current at the on-state) measured for 24 OFETs of pristine (diamond) and degraded (square) respectively. The on-current values are monitored for roughly one month after the photodegradation. The on-current ratio (triangle) and the trend are also plotted. The estimated error bars are also indicated. Samples containing no stabilizing agent (a), or 1% of Tinuvin 780 (b), Chimassorb 81 (c), Tinuvin 1577 (d).

Where ever mentioned, room temperature denotes a temperature from the range 18-23° C., and percentages are given by weight, unless otherwise indicated.

ABBREVIATIONS

PTFE Polytetrafluoroethylene
HALS Hindered Amine Light Stabilizer
UVA Ultraviolet light absorber
PMMA Poly(methylmethacrylate)
OFET Organic field effect transistor
DPP Diketopyrrolopyrrole
W Transistor channel width
L Transistor channel length
Experimental
Preparation of Semiconductor Solutions The DPP semiconductor according to example 1 of WO10/049321 (see above for details) is blended in anhydrous toluene (>99.5%) to form a stock solution with a concentration of 1.0 wt-%. The solution is heated in oven at 80° C. for two hours. Afterwards the solution is allowed to cool down for one hour before filtering through PTFE-filters with pore diameters 1.0 and 0.45 μm.

After the filtration, the stock solution is divided into smaller parts and the additives are distributed accordingly and at concentrations of 0.1 wt-% and 1 wt-% relative to the DPP polymer. Additives used are known compounds (structures shown further below): Tinuvin 780 (T780, a HALS), Tinuvin 120 (T120, a hindered phenolic antioxidant), Tinuvin 1577 (T1577, a hydroxyphenyl triazine class UVA), Chimassorb 81 (C81, a benzophenone class UVA), Tinuvin 312 (T312, an oxanilide class UVA), Tinuvin 326 (T326, a benzotriazole class UVA) and the merocyanine class UVA of CAS-No. 1243654-84-3 (compound MC-03 of WO 09027258).

Fabrication of OFETs

Poly(ethylene terephtalate) (PET) substrates pre-patterned with gold source-drain structures (L=10 μm, W/L=1000) are carefully cleaned with acetone and ethanol and afterwards dried on a hotplate at 70° C. for three minutes. DPP polymer (with or without additive) is spin-coated to form a layer thickness of 50 nm. The film is annealed at 90° C. for 30 seconds and afterwards cooled down prior to spin-coating the dielectric. The dielectric is casted from a 4% b.w. solution of poly(methyl methacrylate) (PMMA; molecular weight 950 kD) in butyl acetate. It is spin-coated to form a 500 nm thick dielectric layer and dried for two minutes at 90° C. The devices are finalized by evaporating a 120 nm thick gold-structure to form the gate-electrode. The evaporation is done in vacuum through a shadow mask. The photodegraded devices are fabricated in parallel and with identical process steps. However, after spin-coating of PMMA and before evaporating the gate-electrode, the samples are irradiated with a 1000 W UV-lamp (CONVAC GmbH) for 10 s. All fabrication steps, except for the UV-irradiation, are performed in a clean-room facility.

Degrading and Measuring the OFETs

Figure 1:
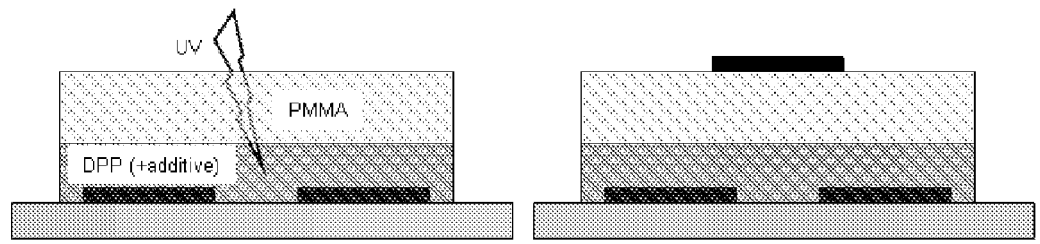
FIG. 1 UV light is irradiated through the PMMA layer (left) in order to mimic the photocrosslinking procedure. Immediately afterwards the gate electrode is evaporated to finalize the OFET-structure (right).

Photodegradation of the samples is performed using a 1000 W UV-lamp (CONVAC GmbH) before evaporating the gate electrode (FIG. 1). The irradiation is optimized to 10 s in order to cause photodegradation without significantly heating the samples. Two routes are employed for the photodegradation experiments. In one of the routes (Route 1), two samples for each solution are fabricated in parallel; the first sample is kept in darkness while the other sample is irradiated. Hence, more statistical data can be collected at once. Moreover, the established fabrication protocol can be followed without any additional interventions.

In the other route (Route 2), the original sample is cut in half in order to obtain 2 samples containing equal numbers of devices. One of these samples is kept in the dark while the other sample is irradiated. Thus, the comparability between the pristine and the degraded structure is improved, and more samples can be tested at once.

All organic field-effect transistors (OFETs) are measured the next day after fabrication. The devices are stored in the dark and in ambient air before the first measurement and between the measurements. Current-voltage (I-V) characterization is also performed in darkness and in air.

Results: Transfer Characteristics

Tables 1 and 2 show a statistical analysis of reference OFETs (without additive) and of stabilized OFETs (according to the invention). Two different sets of measurements were taken, each using an own reference recorded within the same set. The number of OFETs in each case varies between 10 and 24. The results in tables 1 and 2 show, that the additive effect on the electronic properties is small. The additive influence on the gate (leakage) current is also negligible. Furthermore, there is no systematic trend to the yield of functioning devices. In summary, no significant effect by the stabilizing agent on the device is observed in the absence of photodegradation.

TABLE 1

Average values for reference OFETs and OFETs containing additive.

| Stabilizing Additive | Conc. [%] | $I_{on}$ [×10$^{-4}$ A] | $\mu_{sat}$ [cm$^2$/Vs] | Leak [×10$^{-6}$ A] | On/off [×10$^4$] |
|---|---|---|---|---|---|
| none (Reference) | 0 | −2.77 | 0.325 | 0.715 | 3.12 |
| Tinuvin ® 120 | 0.1 | −0.93 | 0.10 | 0.85 | 6.9 |
| | 1 | −2.05 | 0.24 | 0.36 | 27 |
| Tinuvin ® 780 | 0.1 | −2.87 | 0.30 | 1.01 | 0.8 |
| | 1 | −1.39 | 0.13 | 0.12 | 0.8 |
| Tinuvin ® 234 | 0.1 | — | — | — | — |
| | 1 | −3.90 | 0.44 | 0.24 | 0.6 |
| Tinuvin ® 312 | 0.1 | −1.04 | 0.11 | 1.48 | 2.2 |
| | 1 | −2.25 | 0.28 | 6.83 | 1.3 |
| Tinuvin ® 326 | 0.1 | −1.80 | 0.21 | 0.87 | 5.8 |
| | 1 | −1.59 | 0.19 | 1.40 | 7.6 |
| Tinuvin ® 1577 | 0.1 | −2.77 | 0.32 | 1.86 | 7.3 |
| | 1 | −0.87 | 0.10 | 0.08 | 5.1 |
| Chimassorb ® 81 | 0.1 | −3.03 | 0.29 | 0.48 | 2.5 |
| | 1 | −1.25 | 0.14 | 0.07 | 7.8 |

$\mu_{sat}$ is the saturated field-effect mobility.
Leak is the gate current at $V_d$ = −20 V.
On/off is the on/off ratio between $V_d$ = 0 V and −20 V.

TABLE 2

Average values for reference OFETs and OFETs having different additives.

| Stabilizing Additive | Conc. [%] | $I_{on}$ [×10$^{-4}$ A] | $\mu_{sat}$ [cm$^2$/Vs] | Leak [×10$^{-6}$ A] | On/off [×10$^4$] |
|---|---|---|---|---|---|
| none (Reference) | 0 | −2.18 | 0.23 | 0.71 | 5.8 |
| Tinuvin ® 234 | 0.1 | −0.61 | 0.07 | 0.10 | 2.7 |
| merocyanine MC-03 | 0.1 | −1.56 | 0.19 | 0.22 | 5.8 |
| | 1 | −1.02 | 0.12 | 0.34 | 2.5 |

$\mu_{sat}$ is the saturated field-effect mobility.
Leak is the gate current at $V_d$ = −20 V.
On/off is the on/off ratio between $V_d$ = 0 V and −20 V.

Figure 2A:
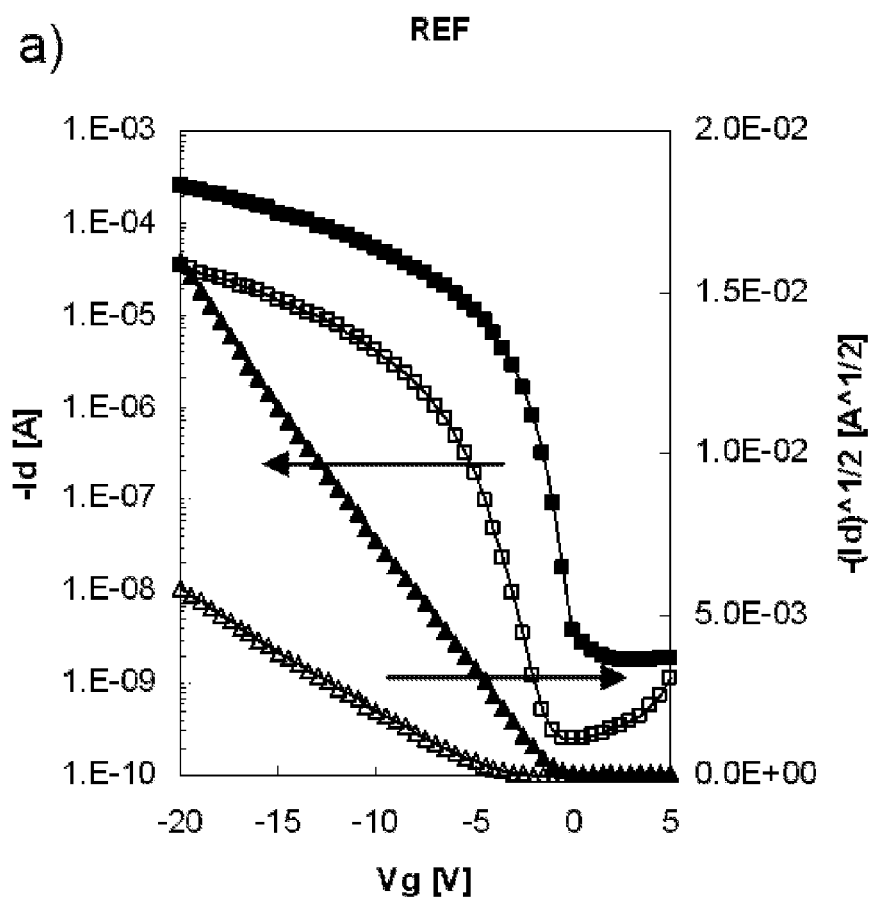
FIG. 2 Typical pristine (filled square) and degraded (open square) transfer characteristics of a) DPP OFETs without additives, b) DPP+1% T780 OFETs, and c) DPP+1% T1577 OFETs. The square-root of the drain currents are also shown for the pristine (filled triangle) and degraded (open triangle) OFETs. The arrows point to the corresponding axes. The curves are swept from $V_g$=+5 V to −20 V.
Figure 2B:
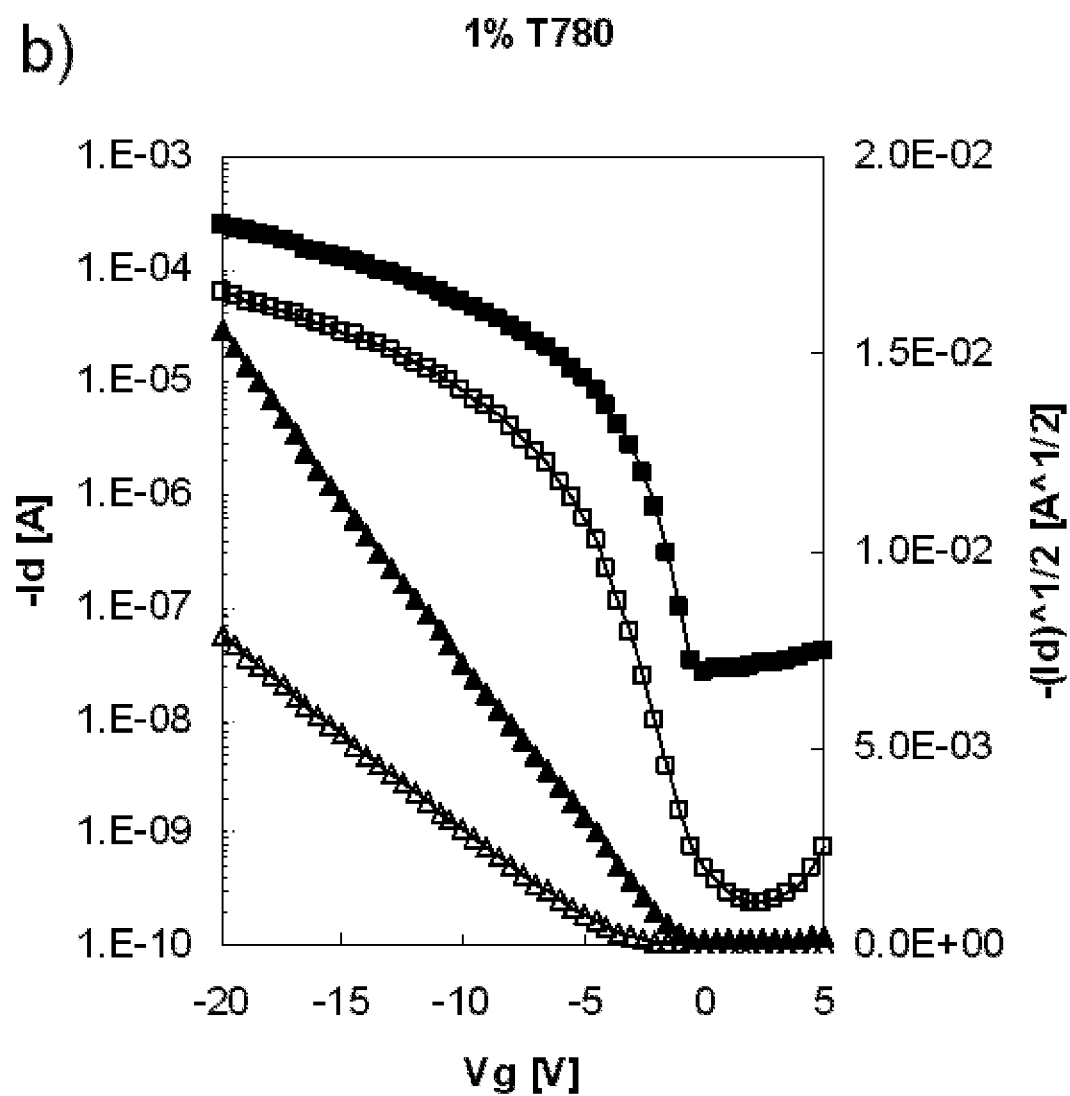
Figure 2C:
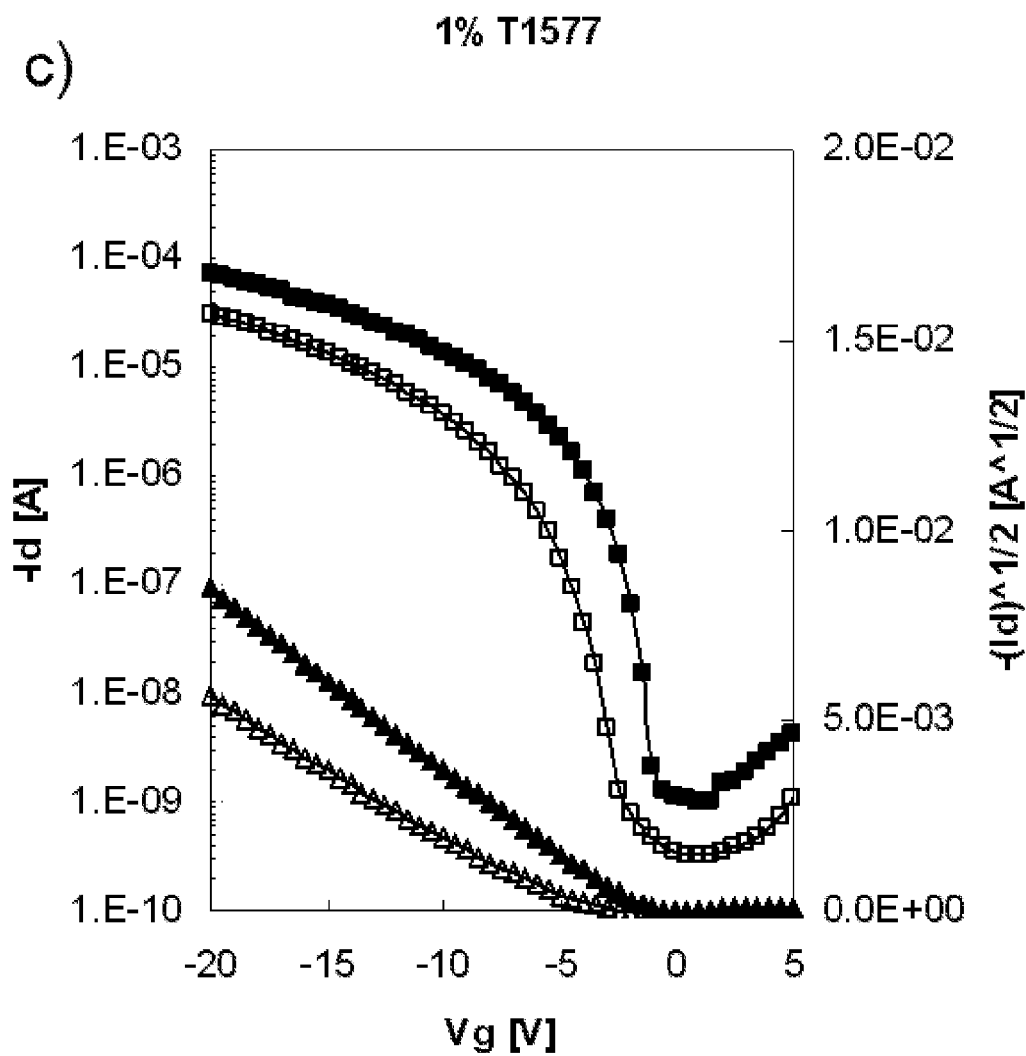

FIG. 2 shows typical transfer curves for an OFET without any additives included in the semiconductor (i.e., reference, FIG. 1a) and for two OFETs with 1 wt-% of either the additive T780 (HALS) and T1577 (UVA). Both the pristine (filled square) as well as the photodegraded (open square) devices are shown in each case. The corresponding $I_d^{1/2}$-$V_g$ characteristics (filled and open triangle respectively) are also displayed for each transfer curve. In this curve the slope corresponds to the field-effect mobility (µ). The gate (leakage) currents are generally 0.1% to 1% of the drain current for both the pristine and the photodegraded curves. It can be clearly seen from FIG. 1a) that the UV irradiation results in detrimental effects on the device performance, such as a negative shift in the threshold voltage, a decrease of the on-current and a decline in µ. These factors imply a worsened charge transport in the active channel, probably caused by the combined effect of UV-light and residual air in the DPP-polymer matrix.

Results shown in FIGS. 2 b) and c) have been obtained with OFETs stabilized 1% of T780 or T1577, respectively. The decrease in the on-current and the decline in µ (i.e., the slope of ($I_d^{1/2}$-$V_g$) are both smaller than in FIG. 2a). The decline in µ can be expressed numerically by comparing the values before and after the irradiation. In case of reference sample, the µ is 28% of the original after irradiation. In case of 1% T780 and 1% T1577, the values for µ are 53% and 49%, respectively. Similar effects are observed for other stabilizing agents as shown in Table 3.

TABLE 3

The µ ratio after/before the UV irradiation using various stabilizers at 1% concentration with DPP-polymer.

| | stabilizer | | | | | |
|---|---|---|---|---|---|---|
| | none | 1% T'780 | 1% T'326 | 1% T'312 | 1% T'324 | 1% Ch'81 | 1% T'1577 |
| µ(after)/µ(before) | 0.28 | 0.53 | 0.34 | 0.43 | 0.33 | 0.34 | 0.49 |

Hence, this is evidence for an immediate stabilizing effect of the respective additive.

Results: Mobility and On-current Kinetics

The I-V characteristics for OFETs with and without the respective additives are monitored regularly for one month. In FIG. 3, the data points represent an average value of 24 OFETs of pristine and photodegraded devices respectively. The reference OFET performance is fairly constant through the course of the study. This is naturally also reflected in the trend of the ratio between the photodegraded and pristine mobility (µ). For example, in FIG. 3a), µ falls to just below 20% of the pristine value one day after irradiation. One month later the ratio is just above 20%, i.e., there is hardly any change in either µ. This indicates that photodegradation of the DPP polymer has an irreversible effect on the device's electronic properties.

Unlike the reference OFETs, all stabilized OFETs in FIG. 3 display an upward trend in the µ ratio. This is mainly due to a slight recovery of µ in the irradiated samples. All stabilized OFETs display a similar effect. The µ ratio is always higher for the stabilized OFETs than for the reference OFETs, regardless of the identical photodegradation conditions. While the ratio is just below 20% for the reference OFETs, the ratio is about 30% for 1% T780, just below 50% for 1% C81 and above 70% for 1% T1577 blended in the semiconductor.

The on-current for samples of FIG. 3 is shown in FIG. 4. In general, the kinetics is similar to FIG. 3. The recovery effect is larger for the stabilized OFETs than for the reference OFETs. Again also the photodegradation is largest for the reference devices, in which the degraded on-current is about 15% of the pristine value after one day of fabrication. The same ratio is just above 20% for 1% T780, 40% for 1% C81 and 75% for 1% T1577 blended in the semiconductor.

FIGS. 3 and 4 thus show that the additives provide a distinct stabilization of the semiconductor while having very small or no negative impact on the long-term behavior of the OFETs.

Structures/chemical names of the stabilizing agents used:

Tinuvin® 234:

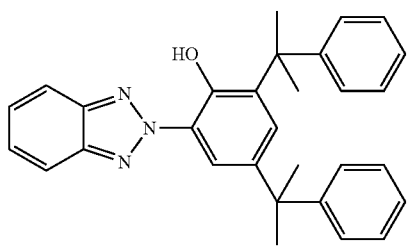

2-(2H-benzotriazol-2-yl)-
4,6-bis(1-methyl-1-phenylethyl)phenol

Tinuvin® 312:

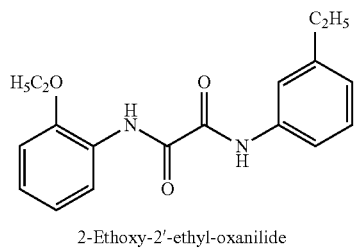

2-Ethoxy-2'-ethyl-oxanilide

Tinuvin® 326:

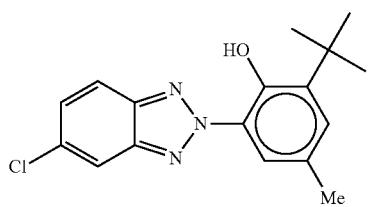

2-(2-hydroxy-3-t-butyl-5-
methylphenyl)-5-chlorobenzotriazole

Tinuvin® 1577:

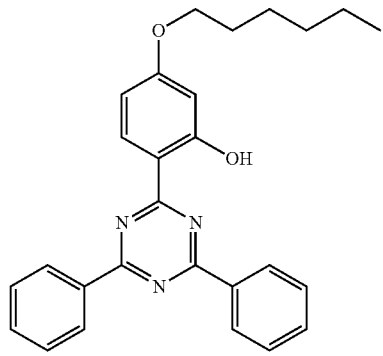

2-(2-hydroxy-4-hexyloxy)phenyl-
4,6-diphenyl-1,3,5-triazine

Chimassorb® 81:

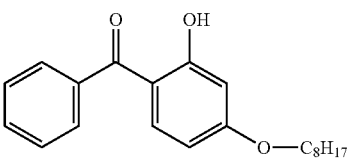

2-hydroxy-4-octyloxy-benzophenone

Tinuvin® 120:

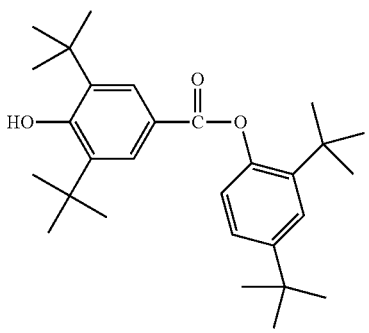

2',4'-Di-tert-butylphenyl 3,5-
di-tert-butyl-4-hydroxybenzoate

Tinuvin® 780:

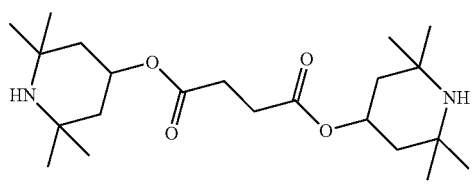

bis(2,2,6,6-tetramethylpiperidin-4-yl) butanedioate

Merocyanine CAS-No. 1243654-84-3:

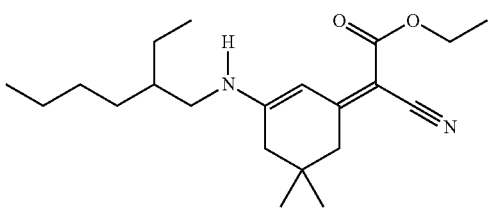

The invention claimed is:

1. An organic semiconductor device, comprising:
   at least one of an organic diode and an organic field effect transistor,
   wherein the at least one of the organic diode and the organic field effect transistor comprises a semiconducting layer comprising a mixture comprising a diketopyrrolopyrrole (DPP) polymer and a stabilizing agent, the stabilizing agent being included in the mixture in an amount of from 0.0005 to 0.1 parts by weight per 1 part by weight of the DPP polymer, and
   the stabilizing agent is selected from the group consisting of a UV absorbing agent, an antioxidant, and an antiradical agent.

2. The device of claim 1, wherein the stabilizing agent is at least one selected from the group consisting of a hydroxybenzophenone, a hydroxyphenyl benzotriazole, an oxalic acid anilide, a hydroxyphenyl triazine, a hindered phenole, and a merocyanine.

3. The device of claim 1, wherein the stabilizing agent comprises a UV absorbing agent selected from the group consisting of:

a 2-hydroxybenzophenone of formula I

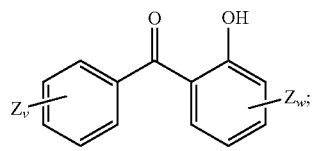
(I)

a 2-hydroxyphenylbenzotriazole of formula IIa, IIb or IIc

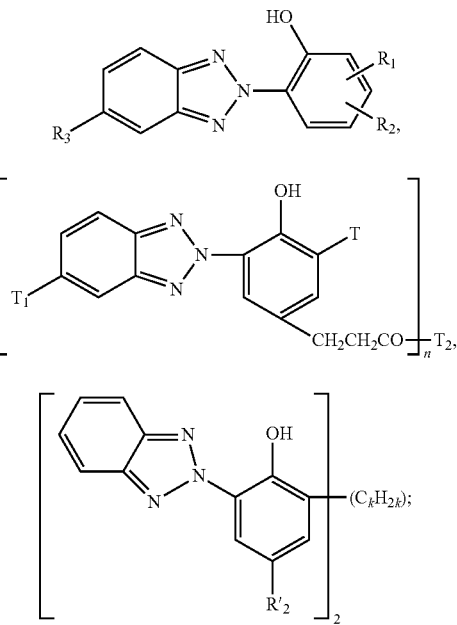

a 2-hydroxyphenyltriazine of formula III

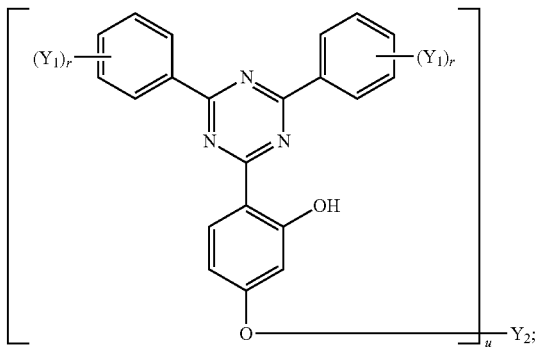
(III)

an oxanilide of formula IV

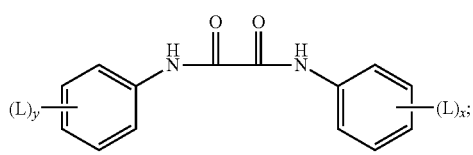
(IV)

and a merocyanine of formula V

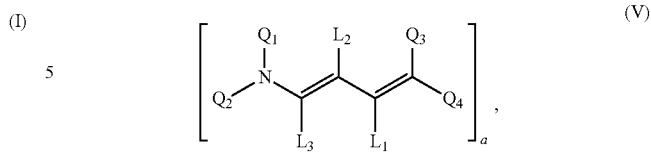
(V)

each including E,E-, E,Z- and Z,Z-geometrical isomers thereof;
wherein
in formula I,
v is an integer from 1 to 3, w is 1 or 2, and the substituents Z independently of one another are hydrogen, halogen, hydroxyl or alkoxy having 1 to 12 carbon atoms;
in formula IIa,
$R_1$ is hydrogen, alkyl having 1 to 24 carbon atoms, phenylalkyl having 1 to 4 carbon atoms in the alkyl moiety, cycloalkyl having 5 to 8 carbon atoms or a radical of formula

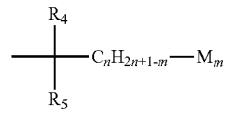

in which $R_4$ and $R_5$ independently of one another are alkyl having 1 to 5 carbon atoms, or $R_4$, together with the radical $C_nH_{2n+1-m}$, forms a cycloalkyl radical having 5 to 12 carbon atoms,
m is 1 or 2, n is an integer from 2 to 20, and
M is a radical of formula —$COOR_6$ in which $R_6$ is hydrogen, alkyl having 1 to 12 carbon atoms, alkoxyalkyl having in each case 1 to 20 carbon atoms in the alkyl moiety and in the alkoxy moiety or phenylalkyl having 1 to 4 carbon atoms in the alkyl moiety,
$R_2$ is hydrogen, halogen, alkyl having 1 to 18 carbon atoms, alkyl of 2 to 4 carbon atoms substituted by $C_2$-$C_6$alkanoyloxy or $C_3$-$C_6$alkenoyloxy, or phenylalkyl having 1 to 4 carbon atoms in the alkyl moiety, and
$R_3$ is hydrogen, halogen, alkyl or alkoxy having in each case 1to 4 carbon atoms or —$COOR_6$ in which $R_6$ is as defined above, at least one of the radicals $R_1$ and $R_2$ being other than hydrogen;
in formula IIb,
T is hydrogen or alkyl having 1 to 6 carbon atoms,
$T_1$ is hydrogen, chloro or alkyl or alkoxy having in each case 1to 4 carbon atoms,
n is 1 or 2 and,
if n is 1, $T_2$ is chloro or a radical of the formula —$OT_3$ or

and,
if n is 2, $T_2$ is a radical of the formula

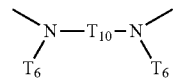

or —O-$T_9$-O—;

in which $T_3$ is hydrogen, alkyl which has 1 to 18 carbon atoms and is unsubstituted or substituted by 1 to 3 hydroxyl groups or by —OCOT$_6$, alkyl which has 3 to 18 carbon atoms, is interrupted once or several times by —O— or —NT$_6$- and is unsubstituted or substituted by hydroxyl or —OCOT$_6$, cycloalkyl which has 5 to 12 carbon atoms and is unsubstituted or substituted by hydroxyl and/or alkyl having 1 to 4 carbon atoms, alkenyl which has 2 to 18 carbon atoms and is unsubstituted or substituted by hydroxyl, phenylalkyl having 1 to 4 carbon atoms in the alkyl moiety, or a radical of formula
—CH$_2$CH(OH)-T$_7$ or

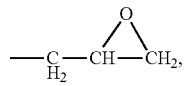

$T_4$ and $T_5$ independently of one another are hydrogen, alkyl having 1 to 18 carbon atoms, alkyl which has 3 to 18 carbon atoms and is interrupted once or several times by —O— or —NT$_6$-, cycloalkyl having 5 to 12 carbon atoms, phenyl, phenyl which is substituted by alkyl having 1 to 4 carbon atoms, alkenyl having 3 to 8 carbon atoms, phenylalkyl having 1 to 4 carbon atoms in the alkyl moiety or hydroxyalkyl having 2 to 4 carbon atoms, $T_6$ is hydrogen, alkyl having 1 to 18 carbon atoms, cycloalkyl having 5 to 12 carbon atoms, alkenyl having 3 to 8 carbon atoms, phenyl, phenyl which is substituted by alkyl having 1 to 4 carbon atoms, phenylalkyl having 1 to 4 carbon atoms in the alkyl moiety, $T_7$ is hydrogen, alkyl having 1 to 18 carbon atoms, phenyl which is unsubstituted or substituted by hydroxyl, phenylalkyl having 1 to 4 carbon atoms in the alkyl moiety, or —CH$_2$OT$_8$, $T_8$ is alkyl having 1 to 18 carbon atoms, alkenyl having 3 to 8 carbon atoms, cycloalkyl having 5 to 10 carbon atoms, phenyl, phenyl which is substituted by alkyl having 1 to 4 carbon atoms, or phenylalkyl having 1 to 4 carbon atoms in the alkyl moiety, $T_9$ is alkylene having 2 to 8 carbon atoms, alkenylene having 4 to 8 carbon atoms, alkynylene having 4 carbon atoms, cyclohexylene, alkylene which has 2 to 8 carbon atoms and is interrupted once or several times by —O—, or a radical of the formula —CH$_2$CH(OH)CH$_2$OT$_{11}$OCH$_2$CH(OH)CH$_2$— or —CH$_2$—C(CH$_2$OH)$_2$—CH$_2$—, $T_{10}$ is alkylene which has 2 to 20 carbon atoms and can be interrupted once or several times by —O—, or cyclohexylene, $T_{11}$ is alkylene having 2 to 8 carbon atoms, alkylene which has 2 to 18 carbon atoms and is interrupted once or several times by —O—, 1,3-cyclohexylene, 1,4-cyclohexylene, 1,3-phenylene or 1,4-phenylene, or $T_{10}$ and $T_6$, together with the two nitrogen atoms, are a piperazine ring;

in formula IIc,

R'$_2$ is C$_1$-C$_{12}$alkyl and k is a number from 1 to 4;

in formula III, u is 1 or 2 and r is an integer from 1 to 3, $Y_1$ independently of one another are hydrogen, hydroxyl, phenyl or halogen, halogenomethyl, alkyl having 1 to 12 carbon atoms, alkoxy having 1 to 18 carbon atoms, alkoxy having 1 to 18 carbon atoms which is substituted by a group —COO(C$_1$-C$_{18}$alkyl);

if u is 1, $Y_2$ is alkyl having 1 to 18 carbon atoms, phenyl which is unsubstituted or substituted by hydroxyl, halogen, alkyl or alkoxy having 1 to 18 carbon atoms;

alkyl which has 1 to 12 carbon atoms and is substituted by —COOH, —COOY$_8$, —CONH$_2$, —CONHY$_9$, —CONY$_9$Y$_{10}$, —NH$_2$, —NHY$_9$, —NY$_9$Y$_{10}$, —NHCOY$_{11}$, —CN and/or —OCOY$_{11}$;

alkyl which has 4 to 20 carbon atoms, is interrupted by one or more oxygen atoms and is unsubstituted or substituted by hydroxyl or alkoxy having 1 to 12 carbon atoms, alkenyl having 3 to 6 carbon atoms, glycidyl, cyclohexyl which is unsubstituted or substituted by hydroxyl, alkyl having 1 to 4 carbon atoms and/or —OCOY$_{11}$, phenylalkyl which has 1 to 5 carbon atoms in the alkyl moiety and is unsubstituted or substituted by hydroxyl, chlorine and/or methyl, —COY$_{12}$ or —SO$_2$Y$_{13}$, or, if u is 2, $Y_2$ is alkylene having 2 to 16 carbon atoms, alkenylene having 4 to 12 carbon atoms, xylylene, alkylene which has 3 to 20 carbon atoms, is interrupted by one or more —O— atoms and/or is substituted by hydroxyl, —CH$_2$CH(OH)CH$_2$—O—Y$_{15}$—OCH$_2$CH(OH)CH$_2$, —CO—Y$_{16}$—CO—, —CO—NH—Y$_{17}$—NH—CO— or —(CH$_2$)$_m$—CO$_2$—Y$_{18}$—OCO—(CH$_2$)$_m$, in which m is 1, 2 or 3, $Y_8$ is alkyl having 1 to 18 carbon atoms, alkenyl having 3 to 18 carbon atoms, alkyl which has 3 to 20 carbon atoms, is interrupted by one or more oxygen or sulfur atoms or —NT$_6$- and/or is substituted by hydroxyl, alkyl which has 1 to 4 carbon atoms and is substituted by —P(O)(OY$_{14}$)$_2$, —NY$_9$Y$_{10}$ or —OCOY$_{11}$ and/or hydroxyl, alkenyl having 3 to 18 carbon atoms, glycidyl, or phenylalkyl having 1 to 5 carbon atoms in the alkyl moiety, $Y_9$ and $Y_{10}$ independently of one another are alkyl having 1 to 12 carbon atoms, alkoxyalkyl having 3 to 12 carbon atoms, dialkylaminoalkyl having 4 to 16 carbon atoms or cyclohexyl having 5 to 12 carbon atoms, or Y$_9$ and Y$_{10}$ together are alkylene, oxaalkylene or azaalkylene having in each case 3 to 9 carbon atoms, $Y_{11}$ is alkyl having 1 to 18 carbon atoms, alkenyl having 2 to 18 carbon atoms or phenyl, $Y_{12}$ is alkyl having 1 to 18 carbon atoms, alkenyl having 2 to 18 carbon atoms, phenyl, alkoxy having 1 to 12 carbon atoms, phenoxy, alkylamino having 1 to 12 carbon atoms or phenylamino, $Y_{13}$ is alkyl having 1 to 18 carbon atoms, phenyl or alkylphenyl having 1 to 8 carbon atoms in the alkyl radical, $Y_{14}$ is alkyl having 1 to 12 carbon atoms or phenyl, $Y_{15}$ is alkylene having 2 to 10 carbon atoms, phenylene or a group -phenylene-M-phenylene- in which M is —O—, —S—, —SO$_2$—, —CH$_2$— or —C(CH$_3$)$_2$—, $Y_{16}$ is alkylene, oxaalkylene or thiaalkylene having in each case 2 to 10 carbon atoms, phenylene or alkenylene having 2 to 6 carbon atoms, $Y_{17}$ is alkylene having 2 to 10 carbon atoms, phenylene or alkylphenylene having 1 to 11 carbon atoms in the alkyl moiety, and $Y_{18}$ is alkylene having 2 to 10 carbon atoms or alkylene which has 4 to 20 carbon atoms and is interrupted once or several times by oxygen;

in formula IV x is an integer from 1 to 3 and the substituents L independently of one another are hydrogen, alkyl, alkoxy or alkylthio having in each case 1 to 22 carbon atoms, phenoxy or phenylthio; and in formula V, $Q_1$ and $Q_2$ independently of each other are hydrogen; $C_1$-$C_{22}$alkyl; $C_2$-$C_{22}$ alkenyl, $C_2$-$C_{22}$alkinyl, $C_3$-$C_{12}$cycloalkyl, $C_3$-$C_{12}$cycloalkenyl, $C_7$-$C_{20}$aralkyl, $C_1$-$C_{20}$heteroalkyl, $C_3$-$C_{12}$cycloheteroalkyl, $C_5$-$C_{11}$heteroaralkyl, $C_6$-$C_{20}$aryl, $C_4$-$C_9$heteroaryl, $COQ_{13}$ or $CONQ_{13}Q_{14}$;

$Q_3$ is CN; —$COOQ_5$; —$CONHQ_5$; —$COQ_5$; —$SO_2Q_5$; —$CONQ_5Q_6$; $C_6$-$C_{20}$aryl; or $C_4$-$C_9$ heteroaryl;

$Q_4$ is CN; —$COOQ_7$; —$CONHQ_7$; —$COQ_7$; —$SO_2Q_7$; —$CONQ_7Q_8$; $C_1$-$C_{22}$ alkyl; $C_2$-$C_{22}$alkenyl; $C_2$-$C_{22}$alkinyl; $C_3$-$C_{12}$cycloalkyl; $C_3$-$C_{12}$cycloalkenyl; $C_7$-$C_{20}$aralkyl; $C_1$-$C_{20}$heteroalkyl; $C_3$-$C_{12}$cycloheteroalkyl; $C_5$-$C_{11}$heteroaralkyl; $C_6$-$C_{20}$ aryl; or $C_4$-$C_9$ heteroaryl;

$Q_5$, $Q_6$, $Q_7$ and $Q_8$ independently of each other are hydrogen; $C_1$-$C_{22}$alkyl; $C_2$-$C_{22}$alkenyl; $C_2$-$C_{22}$ alkinyl; $C_3$-$C_{12}$cycloalkyl; $C_3$-$C_{12}$cycloalkenyl; $C_7$-$C_{20}$aralkyl; $C_1$-$C_{20}$heteroalkyl; $C_3$-$C_{12}$cycloheteroalkyl; $C_5$-$C_{11}$heteroaralkyl; $C_6$-$C_{20}$aryl; $C_4$-$C_9$heteroaryl; $SiQ_{15}Q_{16}Q_{17}$; $Si(OQ_{15})(OQ_{16})(OQ_{17})$; $SiQ_{15}(OQ_{16})(OQ_{17})$; $SiQ_{15}Q_{16}(OQ_{17})$; or a radical —XS;

$L_1$, $L_2$ or $L_3$ independently of each other are hydrogen, $C_1$-$C_{22}$alkyl; $C_2$-$C_{22}$alkenyl, $C_2$-$C_{22}$alkinyl; $C_3$-$C_{12}$cycloalkyl; $C_3$-$C_{12}$cycloalkenyl; $C_7$-$C_{20}$aralkyl; $C_1$-$C_{20}$heteroalkyl; $C_3$-$C_{12}$cycloheteroalkyl; $C_5$-$C_{11}$heteroaralkyl; $C_6$-$C_{20}$ aryl; $C_4$-$C_9$heteroaryl; CN; OH; $OQ_9$; or $COOQ_9$;

$Q_9$ is hydrogen; $C_1$-$C_{22}$alkyl; $C_2$-$C_{22}$alkenyl; $C_2$-$C_{22}$alkinyl; $C_3$-$C_{12}$cycloalkyl; $C_3$-$C_{12}$cycloalkenyl; $C_7$-$C_{20}$aralkyl; $C_1$-$C_{20}$heteroalkyl; $C_3$-$C_{12}$cycloheteroalkyl; $C_5$-$C_{11}$hetero-aralkyl; $C_6$-$C_{20}$ aryl; or $C_4$-$C_9$heteroaryl;

$L_1$ and $L_2$, $L_1$ and $L_3$, $L_2$ and $L_3$, $L_1$ and $Q_4$, $L_2$ and $Q_4$, $L_1$ and $Q_1$, $L_2$ and $Q_1$, $L_3$ and $Q_1$, $L_3$ and $Q_5$, $Q_3$ and $Q_4$, $Q_1$ and $Q_2$, $Q_7$ and $Q_8$, $Q_5$ and $Q_6$ may be linked together to form 1, 2, 3 or 4 carbocyclic or N, O and/or S-heterocyclic rings, which may be further fused with other aromatic rings;

$Q_{10}$ represents $Q_{13}$; $COQ_3$; $COOQ_{13}$; $CONH_2$; $CONHQ_{13}$; or $CONQ_{13}Q_{14}$;

$Q_{11}$ represents halogen; OH; $NH_2$; $NHQ_{15}$; $NQ_{15}Q_{16}$; $NQ_{15}OQ_{16}$; O-$Q_{15}$; O—CO-$Q_{15}$; S-$Q_{15}$; CO-$Q_{15}$; oxo; thiono; CN; COOH; $CONH_2$; $COOQ_{15}$; $CONHQ_{15}$; $CONQ_{15}Q_{16}$; $SO_2NH_2$; $SO_2NHQ_{15}$; $SO_2NQ_{15}Q_{16}$; $SO_2Q_{15}$; $SO_3Q_{15}$; $SiQ_{15}Q_{16}Q_{17}$; $SiOQ_{15}(OQ_{16})(OQ_{17})$; $SiQ_{15}(OQ_{16})(OQ_{17})$; $SiQ_{15}Q_{16}(OQ_{17})$; O—Si-$Q_{15}Q_{16}Q_{17}$; O—Si—$OQ_{15}(OQ_{16})(OQ_{17})$; O—Si-$Q_{15}Q_{16}(OQ_{17})$; O—$SiQ_{15}(OQ_{16})(OQ_{17})$; $PO(OQ_{15})(OQ_{16})$; or a radical *—XS;

$Q_{12}$ represents halogen, CN, SH, OH, CHO, $Q_{18}$; $OQ_{18}$; $SQ_{18}$; $C(Q_{18})$=$CQ_{19}Q_{20}$; O—CO-$Q_{19}$; $NHQ_{19}$; $NQ_{18}Q_{19}$; $CONH_2$; $CONHQ_{18}$; $CONQ_{18}Q_{19}$; $SO_2NH_2$; $SO_2NHQ_{18}$; $SO_2NQ_{18}Q_{19}$; $SO_2Q_{18}$; COOH; $COOQ_{18}$; $OCOOQ_{18}$; $NHCOQ_{18}$; $NQ_{18}COQ_{19}$; $NHCOOQ_{19}$; $NQ_{19}COOQ_{20}$; $SiQ_{15}Q_{16}Q_{17}$; $SiOQ_{15}(OQ_{16})(OQ_{17})$; $SiQ_{15}(OQ_{16})(OQ_{17})$; $SiQ_{15}Q_{16}(OQ_{17})$; $OSi Q_{15}Q_{16}Q_{17}$; $OSiOQ_{15}(OQ_{16})(OQ_{17})$; $OSiQ_{15}Q_{16}(OQ_{17})$; $OSiQ_{15}(OQ_{16})(OQ_{17})$; P(=O)$OQ_{19}OQ_{20}$; P(=O)$Q_{19}OQ_{20}$; P(=O)$Q_{19}OQ_{20}$; or a radical —XS; or is selected from the group consisting of $C_1$-$C_{22}$alkyl; $C_3$-$C_{12}$cycloalkyl; $C_1$-$C_{12}$alkenyl; $C_3$-$C_{12}$cycloalkenyl; $C_1$-$C_{12}$alkylthio; $C_3$-$C_{12}$cycloalkylthio; $C_1$-$C_{12}$alkenylthio; $C_3$-$C_{12}$cycloalkenylthio; $C_1$-$C_{12}$alkoxy; $C_3$-$C_{12}$cycloalkoxy; $C_1$-$C_{12}$alkenyloxy; or $C_3$-$C_{12}$cycloalkenyloxy, which may be unsubstituted or substituted by one or more, identical or different $Q_{11}$;

$Q_{13}$, $Q_{14}$, $Q_{15}$, $Q_{16}$, $Q_{17}$, $Q_{18}$, $Q_{19}$ and $Q_{20}$ independently of each other are $C_1$-$C_{22}$alkyl; $C_3$-$C_{12}$cycloalkyl; $C_2$-$C_{12}$alkenyl; $C_3$-$C_{12}$cycloalkenyl; $C_6$-$C_{14}$aryl; $C_4$-$C_{12}$heteroaryl; $C_7$-$C_{18}$aralkyl or $C_5$-$C_{16}$heteroaralkyl; or $Q_{13}$ and $Q_{14}$, $Q_{15}$ and $Q_{16}$, $Q_{16}$ and $Q_{17}$ and/or $Q_{18}$ and $Q_{19}$ may be linked together to form unsubstituted or with $C_1$-$C_4$alkyl substituted pyrrolidine, piperidine, piperazine or morpholine;

X represents a linker;

S signifies a silane-, oligosiloxane- or polysiloxane-moiety;

the oligosiloxane is a group of formula $Si(Q_{15})_m[OSi(Q_{16})]_o$ wherein m has a value of 0, 1 or 2, o has a value of 3, 2 or 1; and m+o have a value of 3 or refers to groups of

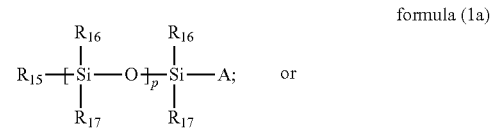

formula (1a)

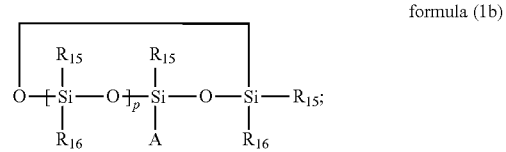

formula (1b)

wherein

A represents a bond to the linker X; and p has a value of 1 to 9;

the polysiloxane is a group of

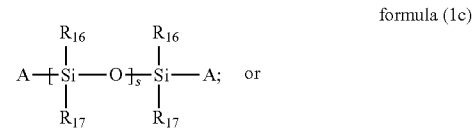

formula (1c)

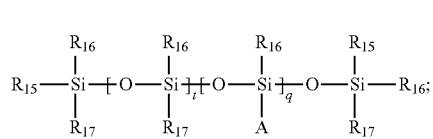

formula (1d)

wherein

A represents a bond to the linker X;

s has a value of 4 to 250;

t has a value of 5 to 250;

q has a value of 1 to 30;

n is 1 or integer;

n is from 1 to 6;

when n=2, $Q_1$, $Q_5$ or $Q_4$ is a bivalent alkyl group; or $Q_1$ and $Q_2$ together with the 2 nitrogen atoms linking them form a unsubstituted or alkyl-substituted

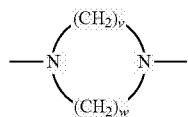

-ring;

v is from 1 to 4, w is from 1 to 4;

when n=3, $Q_1$, $Q_5$ or $Q_4$ is a trivalent alkyl group;

when n=4, $Q_1$, $Q_5$ or $Q_4$ is a tetravalent alkyl group; and $Q_1$ and $Q_2$ in formula V are not simultaneously hydrogen.

4. The device of claim 1, wherein the UV absorbing agent is a 2-hydroxybenzophenone derivative selected from the group consisting of a 4-hydroxy, 4-methoxy, 4-octyloxy, 4-decyloxy, 4-dodecyloxy, 4-benzyloxy, and 2'-hydroxy-4,4'-dimethoxy derivative of 2-hydroxybenzophenone;

a 2-hydroxyphenylbenzotriazole selected from the group consisting of 2-(2'-hydroxy-5'-methylphenyl)-benzotriazole, 2-(3',5'-di-tert-butyl-2'-hydroxyphenyl)benzotriazole, 2-(5'-tert-butyl-2'-hydroxyphenyl)benzotriazole, 2-(2'-hydroxy-5'-(1,1,3,3-tetramethylbutyl)phenyl) benzotriazole, 2-(3',5'-di-tert-butyl-2'-hydroxyphenyl)-5- chloro-benzotriazole, 2-(3'-tert-butyl- 2'-hydroxy-5'-methylphenyl)-5- chloro-benzotriazole, 2-(3'-sec-butyl-5'-tert-butyl-2'-hydroxypheny)benzotriazole, 2-(2'-hydroxy-4'-octyloxyphenyl)benzotriazole, 2-(3', 5'-di-tert-amyl-2'-hydroxyphenyl)benzotriazole, 2-(3', 5'-bis-(alpha,alpha-dimethylbenzyl)-2'-hydroxyphenyl)benzotriazole, 2-(3'-tert-butyl-2'-hydroxy-5'-(2-octyloxycarbonylethyl)phenyl)-5-chloro-benzotriazole, 2-(3'-tert-butyl-5'-[2-(2-ethylhexyloxy)-carbonylethyl]-2'-hydroxyphenyl)-5-chloro-benzotriazole, 2-(3'-tert-butyl-2'-hydroxy-5'(2-methoxycarbonylethyl)phenyl)-5-chloro-benzotriazole, 2-(3'-tert-butyl-2'-hydroxy-5'-(2-methoxycarbonylethyl)phenyl)benzotriazole, 2-(3'-tert-butyl-2'-hydroxy-5'-(2-octyloxycarbonylethyl) phenyl)benzotriazole, 2-(3'-tert-butyl-5'-[2-(2-ethylhexyloxy)carbonylethyl]-2'-hydroxyphenyl) benzotriazole, 2-(3'-dodecyl-2'-hydroxy-5'-methylphenyl)benzotriazole, 2-(3'-tert-butyl-2'-hydroxy-5'-(2-isooctyloxycarbonylethyl) phenylbenzotriazole, 2,2'-methylene-bis[4-(1,1,3,3-tetramethylbutyl)-6-benzotriazole-2-yl-phenol]; a transesterification product of 2-[3'-tert-butyl-5'-(2-methoxycarbonylethyl)-2'-hydroxyphenyl]-2H-benzotriazole with polyethylene glycol 300;

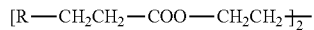

where R=3'-tert-butyl-4'-hydroxy-5'-2H-benzotriazol-2-ylphenyl, 2-[2'-hydroxy-3'-(alpha,alpha-dimethylbenzyl)-5'-(1,1,3,3-tetramethylbutyl)-phenyl]benzotriazole; 5-trifluoromethyl-2-(2-hydroxy-3-alpha-cumyl-5-tert-octylphenyl)-2H-benzotriazole; and 2-[2'-hydroxy-3'-(1,1,3,3-tetramethylbutyl) -5'-(alpha,alpha-dimethylbenzyl)-phenyl]benzotriazole;

a 2-hydroxyphenyltriazine selected from the group consisting of 2,4,6-tris(2-hydroxy -4-octyloxyphenyl)-1,3, 5-triazine, 2-(2-hydroxy-4-octyloxyphenyl)-4,6-bis(2, 4-dimethylphenyl)-1,3,5-triazine, 2-(2,4-dihydroxyphenyl)-4,6-bis(2,4-dimethylphenyl)-1,3,5-triazine, 2,4-bis(2-hydroxy-4-propyloxyphenyl)-6-(2, 4-dimethylphenyl)-1,3,5-triazine, 2-(2-hydroxy-4-octyloxyphenyl)-4,6-bis(4-methylphenyl)-1,3,5-triazine, 2-(2-hydroxy-4-dodecyloxyphenyl)-4,6-bis(2, 4-dimethylphenyl)-1,3,5-triazine, 2-(2-hydroxy-4-tridecyloxyphenyl)-4,6-bis(2,4-dimethylphenyl)-1,3,5-triazine, 2-[2-hydroxy-4-(2-hydroxy-3-butyloxy-propoxy)phenyl]-4,6-bis(2,4-dimethylphenyl)-1,3,5-triazine, 2-[2-hydroxy-4-(2-hydroxy-3-octyloxy-propyloxy)phenyl]-4,6-bis(2,4-dimethylphenyl)-1,3,5-triazine, 2-[4-(3-dodecyloxy/tridecyloxy-2-hydroxypropoxy)-2-hydroxy-phenyl]-4,6-bis(2,4-dimethylphenyl)-1,3,5-triazine, 2-[2-hydroxy-4-(2-hydroxy-3-dodecyloxy-propoxy)phenyl]-4,6-bis(2,4-dimethylphenyl)-1,3,5-triazine, 2-(2-hydroxy-4-hexyloxy)phenyl-4,6-diphenyl-1,3,5-triazine, 2-(2-hydroxy-4-methoxyphenyl)-4,6-diphenyl-1,3,5-triazine, 2, 4,6-tris[2-hydroxy-4-(3-butoxy-2-hydroxypropoxy)phenyl]-1,3,5-triazine, 2-(2-hydroxyphenyl)-4-(4-methoxyphenyl)-6-phenyl-1,3,5-triazine, 2-{2-hydroxy-4-[3-(2-ethylhexyl-1-oxy)-2-hydroxypropyloxy]phenyl}-4,6-bis(2,4-dimethylphenyl)-1,3,5-triazine, 2-(2-hydroxy-4-(2-ethylhexyl)oxy)phenyl-4,6-di(4-phenyl)phenyl-1,3,5-triazine, 2,4-bis-[(4-(2-ethylhexyloxy)-2-hydroxyphenyl)]-6-(4-methoxyphenyl)-1,3,5-triazine), 2,4-bis-[(4-(2-hydroxyethyloxy)-2-hydroxyphenyl)]-6-(4-chlorophenyl)-1,3,5-triazine), 2,4-bis-(4-butyloxy-2-hydroxyphenyl)-6-(2,4-dibutyloxyphenyl)-1,3,5-triazine), 2-(2-hydroxy-4-[2-ethylhexyloxy]phenyl)-4,6-di(4-phenyl)phenyl-1,3,5-triazine, 2-(2-hydroxy-4-[1-octyloxycarbonyl-ethyl]oxy-phenyl)-4,6-di(4-phenyl) phenyl-1,3,5-triazine, 2,4-bis-(4-[1-octyloxycarbonyl]-ethyloxy-2-hydroxyphenyl)-6-(2,4-dihydroxyphenyl)-1,3,5-triazine), 2,4,6-tris-(4-[1-octyloxycarbonyl]-ethyloxy-2-hydroxyphenyl)-1,3,5-triazine), and 2,4-bis-(4-[1-octyloxycarbonyl]-ethyloxy-2-hydroxyphenyl)-6-(4-[1-octyloxycarbonyl]-ethyloxy-2-hydroxyphenyl)-1,3,5-triazine); or a merocyanine having a formula selected from the group consisting of:

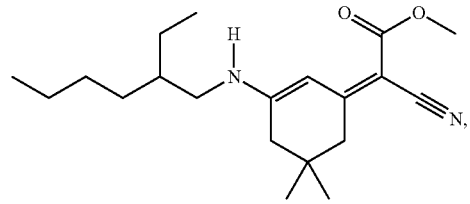

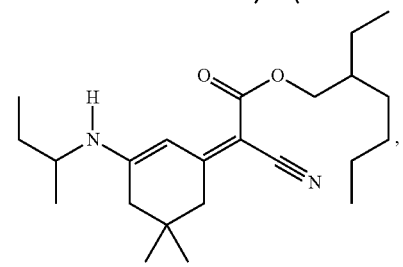

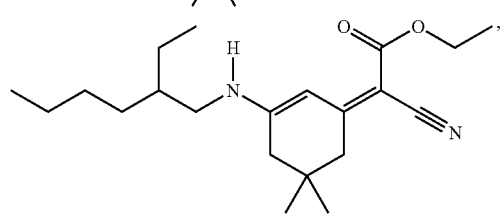

-continued

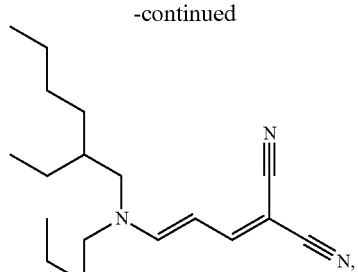

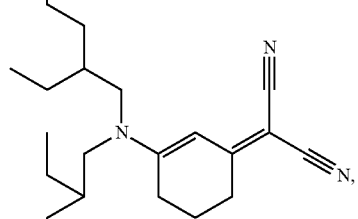

CAS-No. 160306-22-9

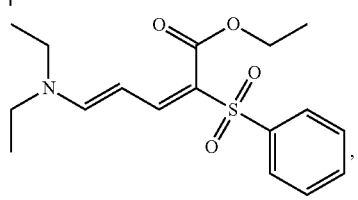

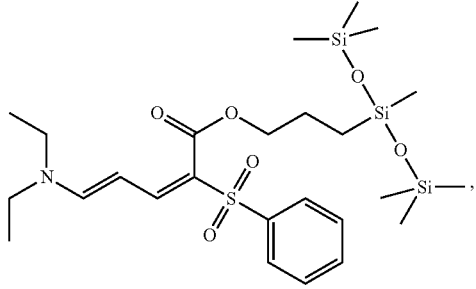

CAS-No. 98835-90-6

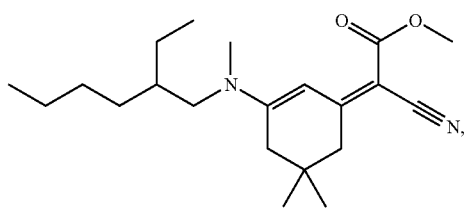

-continued

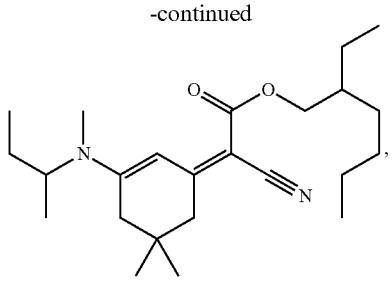

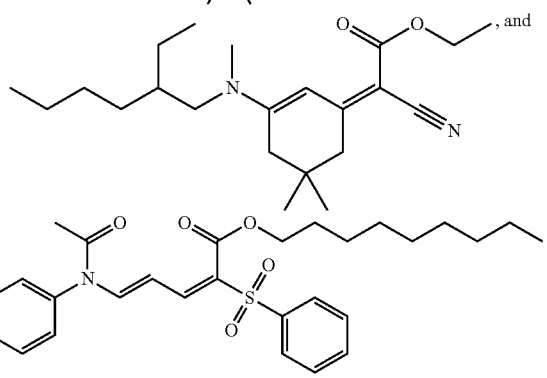

each including E/Z-isomers thereof.

5. The device of claim 1, wherein the stabilizing agent comprises an antioxidant, which is a compound of formula (1)

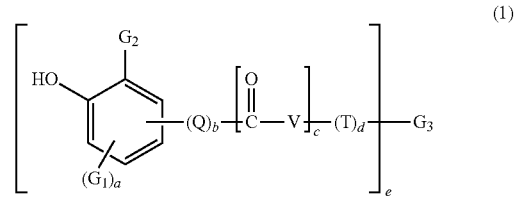

(1)

wherein
G$_1$ is hydrogen; C$_1$-C$_{22}$alkyl; C$_1$-C$_{22}$alkylthio; C$_2$-C$_{22}$alkylthioalkyl; C$_5$-C$_7$cycloalkyl; phenyl; C$_7$-C$_9$phenylalkyl; or SO$_3$M;
G$_2$ is C$_1$-C$_{22}$alkyl; C$_5$-C$_7$cycloalkyl; phenyl; or C$_7$-C$_9$phenylalkyl;
Q is —C$_m$H$_{2m}$—;

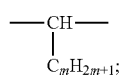

—C$_m$H$_{2m}$—NH; a radical of formula

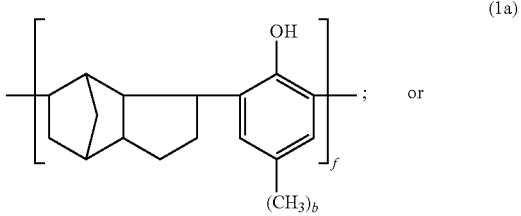

(1a)

-continued

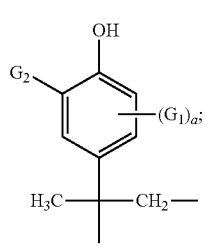
(1b)

T is —C$_n$H$_{2n}$—; —(CH$_2$)$_n$—O—CH$_2$—; phenylene;

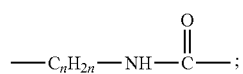

or a radical of formula (1c)

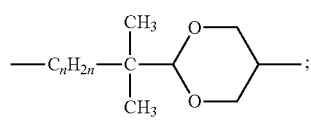

V is —O— or —NH—;
a is 0, 1, or 2;
b, c, d and g are each independently of one another 0 or 1;
e is an integer from 1 to 4;
f is an integer from 1 to 3; and
m, n and p are each independently of one another an integer from 1 to 3;
q is 0 or an integer from 1 to 3;
if e=1,
G$_3$ is hydrogen; C$_1$-C$_{22}$alkyl; C$_5$-C$_7$cycloalkyl; C$_1$-C$_{22}$alkylthio; C$_2$-C$_{22}$alkylthioalkyl; C$_2$-C$_{18}$alkenyl; C$_1$-C$_{18}$phenylalkyl; M; SO$_3$M; a radical of formula

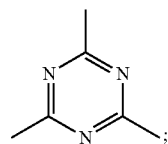
(1d)

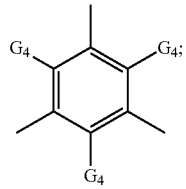
(1e)

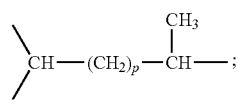
(1f)

or G$_3$ is propyl substituted by OH and/or by C$_2$-C$_{22}$alkanoyloxy;
M is alkali; ammonium; H;
if e=2, then each of b and c independently is 0 or 1;
G$_3$ is a direct bond; —CH$_2$—;

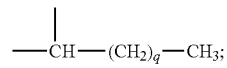

or —S—; or G$_3$ is propyl substituted by OH or C$_2$-C$_{22}$alkanoyloxy;
if e=3, then each of b and c independently is 0 or 1;
G$_3$ is the radical of formula

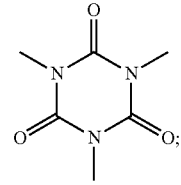

(1h)
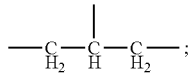

(1i)
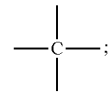

(1k)
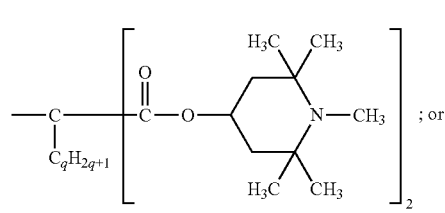

(1j)
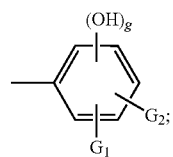

if e=4, then each of b and c independently is 0 or 1;
G$_3$ is

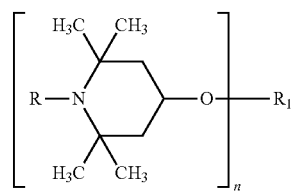

G$_4$ are each independently of the other hydrogen; or C1-C22alkyl.

6. The device of claim 1, wherein the stabilizing agent is a compound having formula A or B (A)
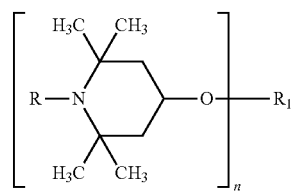

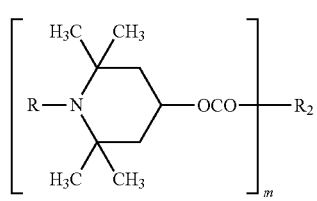

wherein R is H or an organic residue, m is 1 or 2, n is 1 or 2, $R_1$, when n is 1, is hydrogen, alkyl of 1 to 18 carbon atoms, alkenyl of 2-18 carbon atoms, propargyl, glycidyl, alkyl of 2 to 20 carbon atoms interrupted by oxygen and/or substituted by hydroxy, or $R_1$ is alkyl of 1 to 4 carbon atoms substituted by a carboxy group or by —COOZ where Z is hydrogen, alkyl of 1 to 4 carbon atoms or phenyl, when n is 2, $R_1$ is alkylene of 1 to 12 carbon atoms, alkenylene of 4 to 12 carbon atoms, xylylene, or alkylene of 1 to 20 carbon atoms interrupted by oxygen and/or substituted by hydroxy or phenyl, which phenyl is substituted by hydroxy and/or one to four alkyl groups of 1 to 4 carbon atoms; or $R_1$ is CO;

when m is 1, $R_2$ is alkyl of 1 to 18 carbon atoms, alkyl of 3 to 18 carbon atoms interrupted by —COO—, or $R_2$ is —CH$_2$(OCH$_2$CH$_2$)$_p$OCH$_3$ where p is 1 to 12, or $R_2$ is cycloalkyl of 5 to 12 carbon atoms, phenyl or said phenyl substituted by one to four alkyl groups of 1 to 4 carbon atoms, or $R_2$ is —NHR$_3$ where $R_3$ is alkyl of 1 to 18 carbon atoms, cycloalkyl of 5 to 12 carbon atoms, phenyl or said phenyl substituted by one to four alkyl of 1 to 4 carbon atoms, or $R_2$ is —N($R_3$)$_2$ where $R_3$ is as defined above, and when m is 2, $R_2$ is a direct bond, alkylene of 1 to 12 carbon atoms, alkenylene of 4 to 12 carbon atoms, O-alkylene-O of 2 to 12 carbon atoms xylylene, alkylene of 2 to 12 carbon atoms interrupted by —COO—, or $R_2$ is —CH$_2$(OCH$_2$CH$_2$)$_n$OCH$_2$— where n is 1 to 12, or $R_2$ is cycloalkylene of 5 to 12 carbon atoms, phenylalkylene of 7 to 15 carbon atoms or phenylene, or $R_2$ is —NHR$_4$NH— where $R_4$ is alkylene of 2 to 18 carbon atoms, cycloalkylene of 5 to 12 carbon atoms, phenylalkylene of 8 to 15 carbon atoms or phenylene, or $R_2$ is —N($R_3$)R$_4$N($R_3$)—where $R_3$ and $R_4$ are as defined above, or $R_2$ is —NH—;

or the stabilizing agent is selected from the group consisting of: 2,2,6,6-tetramethylpiperidine, 2,2,6,6-tetramethyl-4-hydroxy-piperidine, 2,2,6,6-tetramethyl-4-oxo-piperidine, 1-oxyl-2,2,6,6-tetramethylpiperidine (TEMPO), 1-oxyl-2,2,6,6-tetramethyl-4-hydroxy-piperidine (TEMPOL), bis(2,2,6,6-tetramethyl-4-piperidyl)sebacate, bis(2,2,6,6-tetramethyl-4-piperidyl)succinate, bis(1,2,2,6,6-pentamethyl-4-piperidyl)sebacate, bis(1-octyloxy-2,2,6,6-tetramethyl-4-piperidyl)sebacate, bis(1,2,2,6,6-pentamethyl-4-piperidyl) n-butyl-3,5-di-tert-butyl-4-hydroxybenzylmalonate, the condensate of 1-(2-hydroxyethyl)-2,2,6,6-tetramethyl-4-hydroxypiperidine and succinic acid, linear or cyclic condensates of N,N'-bis(2,2,6,6-tetramethyl-4-piperidyl)hexamethylenediamine and 4-tert-octylamino-2,6-dichloro-1,3,5-triazine, tris(2,2,6,6-tetramethyl-4-piperidyl)nitrilotriacetate, tetrakis(2,2,6,6-tetramethyl-4-piperidyl)-1,2,3,4-butane-tetracarboxylate, 1,1'-(1,2-ethanediyl)-bis(3,3,5,5-tetramethylpiperazinone), 4-benzoyl-2,2,6,6-tetramethylpiperidine, 4-stearyloxy-2,2,6,6-tetramethylpiperidine, bis(1,2,2,6,6-pentamethylpiperidyl)-2-n-butyl-2-(2-hydroxy-3,5-di-tert-butyl-benzyl)malonate, 3-n-octyl-7,7,9,9-tetramethyl-1,3,8-triazaspiro[4.5]decane-2,4-dione, bis(1-octyloxy-2,2,6,6-tetramethylpiperidyl)sebacate, bis(1-octyloxy-2,2,6,6-tetramethylpiperidyl)succinate, linear or cyclic condensates of N,N'-bis-(2,2,6,6-tetramethyl-4-piperidyl)hexamethylenediamine and 4-morpholino-2,6-dichloro-1,3,5-triazine, the condensate of 2-chloro-4,6-bis(4-n-butylamino-2,2,6,6-tetramethylpiperidyl)-1,3,5-triazine and 1,2-bis(3-aminopropylamino)ethane, the condensate of 2-chloro-4,6-di-(4-n-butylamino-1,2,2,6,6-pentamethylpiperidyl)-1,3,5-triazine and 1,2-bis-(3-aminopropylamino)ethane, 8-acetyl-3-dodecyl-7,7,9,9-tetramethyl-1,3,8-triazaspiro[4.5]decane-2,4-dione, 3-dodecyl-1-(2,2,6,6-tetramethyl-4-piperidyl)pyrrolidine-2,5-dione, 3-dodecyl-1-(1,2,2,6,6-pentamethyl-4-piperidyl)pyrrolidine-2,5-dione, a mixture of 4-hexadecyloxy- and 4-stearyloxy-2,2,6,6-tetramethylpiperidine, a condensation product of N,N'-bis(2,2,6,6-tetramethyl-4-piperidyl) hexamethylenediamine and 4-cyclohexylamino-2,6-dichloro-1,3,5-triazine, a condensation product of 1,2-bis(3-aminopropylamino)ethane and 2,4,6-trichloro-1,3,5-triazine as well as 4-butylamino-2,2,6,6-tetramethylpiperidine (CAS Reg. No. [136504-96-6]); a condensation product of 1,6-hexanediamine and 2,4,6-trichloro-1,3,5-triazine as well as N,N-dibutylamine and 4-butylamino-2,2,6,6-tetramethylpiperidine (CAS Reg. No. [192268-64-7]); N-(2,2,6,6-tetramethyl-4-piperidyl)-n-dodecylsuccinimide, N-(1,2,2,6,6-pentamethyl-4-piperidyl)-n-dodecylsuccinimide, 2-undecyl-7,7,9,9-tetramethyl-1-oxa-3,8-diaza-4-oxo-spiro[4,5]decane, a reaction product of 7,7,9,9-tetramethyl-2-cycloundecyl-1-oxa-3,8-diaza-4-oxospiro- [4,5]decane and epichlorohydrin, 1,1-bis(1,2,2,6,6-pentamethyl-4-piperidyloxycarbonyl)-2-(4-methoxyphenyl)ethene, N,N'-bis-formyl-N,N-bis(2,2,6,6-tetramethyl-4-piperidyl)hexamethylenediamine, a diester of 4-methoxymethylene-malonic acid with 1,2,2,6,6-pentamethyl-4-hydroxypiperidine, poly[methylpropyl-3-oxy-4-(2,2,6,6-tetramethyl-4-piperidyl)]siloxane, and a reaction product of maleic acid anhydride-α-olefin-copolymer with 2,2,6,6-tetramethyl-4-aminopiperidine or 1,2,2,6,6-pentamethyl-4-aminopiperidine.

7. The device of claim 1, wherein the DPP polymer is a polymer comprising a repeating unit of formula

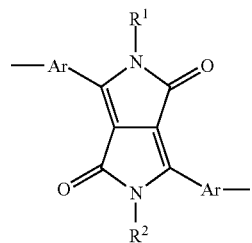

wherein $R^1$ and $R^2$ independently are hydrogen, a $C_1$-$C_{100}$alkyl group optionally substituted by one or more halogen atoms, hydroxyl groups, nitro groups, —CN, $C_6$-$C_{18}$ aryl groups and/or interrupted by —O—, —COO—, —OCO—, or —S—; COO—$C_1$-$C_{50}$alkyl; a $C_7$-$C_{100}$arylalkyl group; a carbamoyl group; $C_5$-$C_{12}$cycloalkyl which can be substituted one to three times with $C_1$-$C_8$alkyl and/or $C_1$-$C_8$alkoxy; $C_6$-$C_{24}$aryl, which can be substituted with $C_1$-$C_8$alkyl, $C_1$-$C_8$thioalkoxy, and/or $C_1$-$C_8$alkoxy, or pentafluorophenyl;

Ar independently stands for 2,5-thienylene, which may be unsubstituted or substituted by $R^{3'}$, or for a divalent thiophene or thiazole moiety of the formula

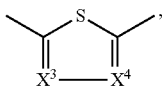

wherein one of $X^3$ and $X^4$ is N and the other is CH or $CR^{3'}$, and $R^{3'}$ each independently represents $C_1$-$C_{25}$alkyl, which may optionally be interrupted by one or more oxygen atoms.

8. The device according to claim 1, wherein the DPP polymer has a formula (Ia), (Ib), (Ic) or (Id):

 (Ia)

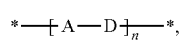 (Ib)

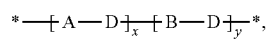 (Ic)

 (Id)

wherein
x=0.995 to 0.005, y=0.005 to 0.995, and x+y=1;
r=0.985 to 0.005, s=0.005 to 0.985, t=0.005 to 0.985, u=0.005 to 0.985, and r+s+t+u=1;
n is 4 to 1000,
A is a group of formula (X)

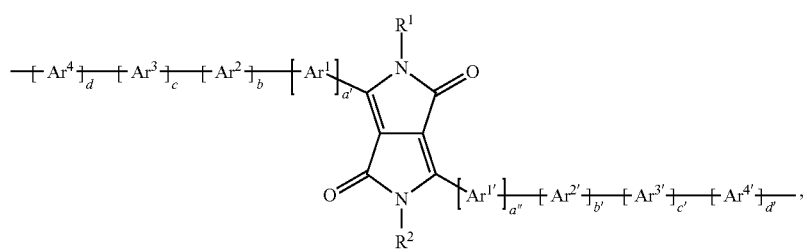

wherein a' is 1, 2, or 3; a" is, 1, 2, or 3; b is 0, 1, 2, or 3; b'is, 1, 2, or 3; c is 0, 1, 2, or 3; c'is 0, 1, 2, or 3; d is 0, 1, 2, or 3; d'is 0, 1, 2, or 3; with the proviso that b'is not 0, if a" is 0;

$R^1$ and $R^2$ are the same or different and hydrogen, a $C_1$-$C_{100}$alkyl group, —COOR$^{106''}$, a $C_1$-$C_{100}$alkyl group which is substituted by one or more halogen atoms, hydroxyl groups, nitro groups, —CN, or $C_6$-$C_{18}$aryl groups and/or interrupted by —O—, —COO—, —OCO—, or —S—; a $C_7$-$C_{100}$arylalkyl group, a carbamoyl group, $C_5$-$C_{12}$cycloalkyl, which can be substituted one to three times with $C_1$-$C_8$alkyl and/or $C_1$-$C_8$alkoxy, a $C_6$-$C_{24}$aryl group, in particular phenyl or 1- or 2-naphthyl which can be substituted one to three times with $C_1$-$C_8$alkyl, $C_1$-$C_{25}$thioalkoxy, and/or $C_1$-$C_{25}$alkoxy, or pentafluorophenyl, $R^{106''}$ is $C_1$-$C_{50}$alkyl;

$Ar^1$, $Ar^{1'}$, $Ar^2$, $Ar^{2'}$, $Ar^3$, $Ar^{3'}$, $Ar^4$ and $Ar^{4'}$ are independently of each other heteroaromatic, or aromatic rings, which optionally can be condensed and/or substituted, and B, D and E are independently of each other a group of formula

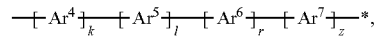

or formula X, with the proviso that in case B, D and E are a group of formula X, they are different from A, wherein k is 1,
l is 0, or 1,
r is 0, or 1,
z is 0, or 1, and
$Ar^4$, $Ar^5$, $Ar^6$ and $Ar^7$ are independently of each other a group of formula

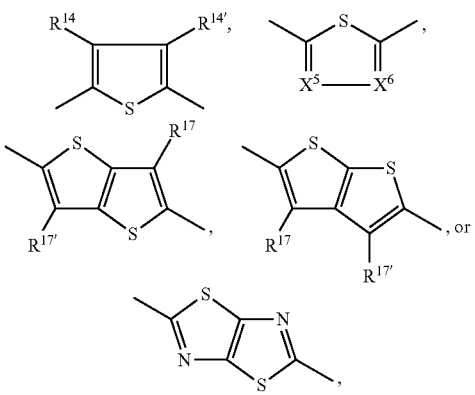

wherein one of $X^5$ and $X^6$ is N and the other is $CR^{14}$, $R^{14}$, $R^{14'}$, $R^{17}$ and $R^{17'}$ are independently of each other H, or a $C_1$-$C_{25}$alkyl group, which may optionally be interrupted by one or more oxygen atoms.

9. The device of claim 1, wherein the DPP polymer is a polymer comprising a repeating unit of formula

and at least one repeating unit having a formula ${+B{-}D{+}}$, ${+A{-}E{+}}$, or ${+B{-}E{+}}$, wherein
A is a group of formula
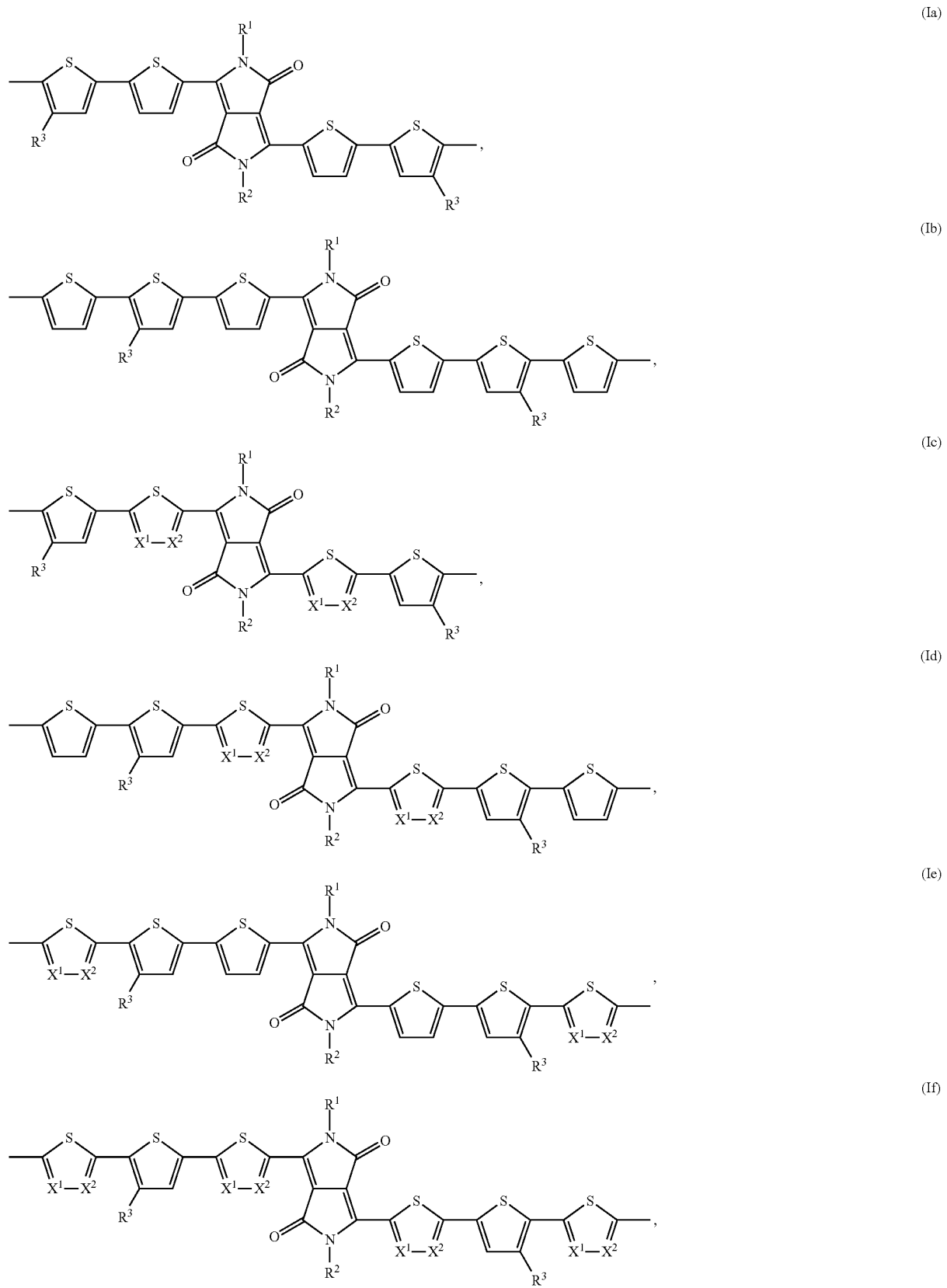

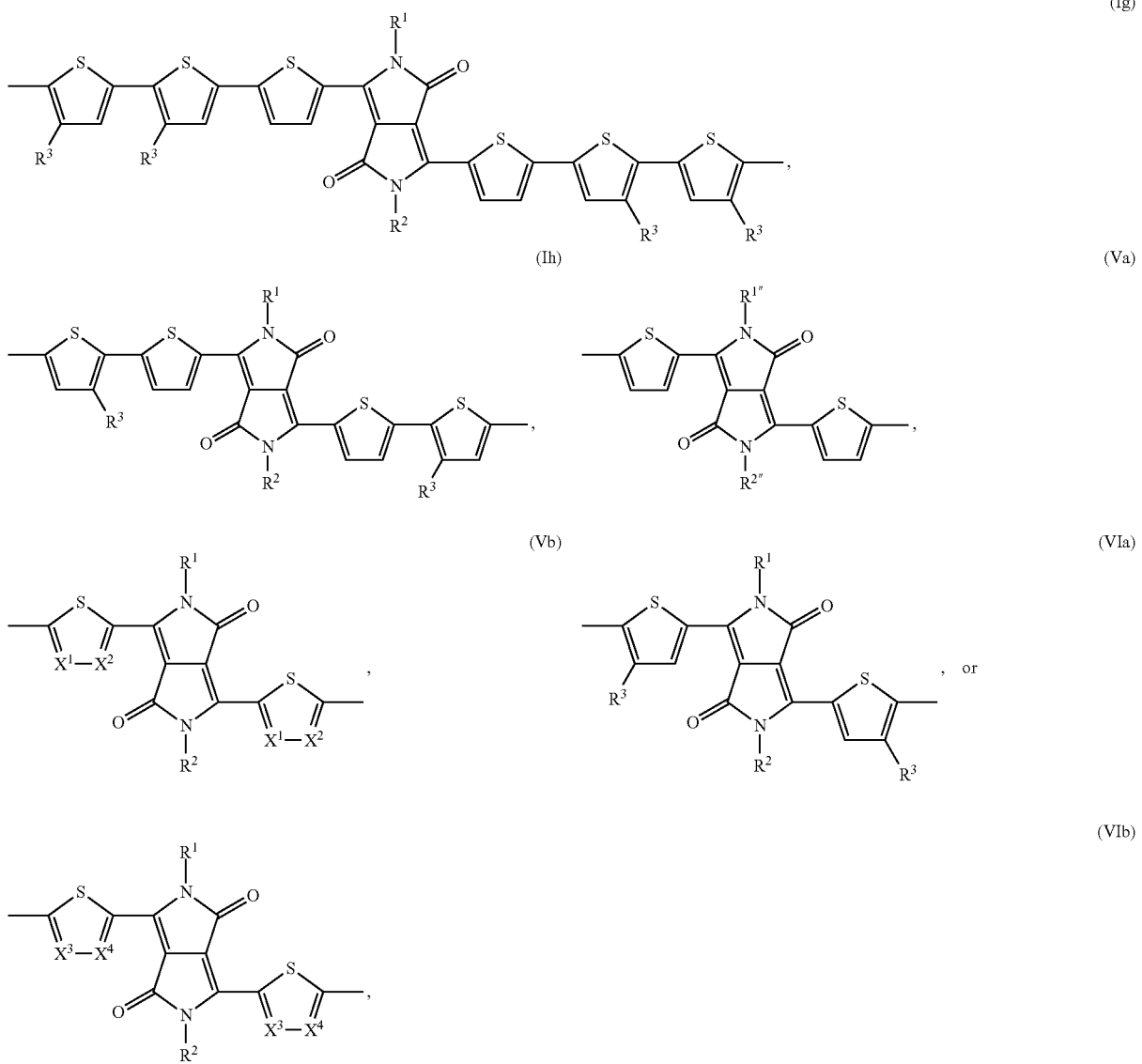

where R³ is a $C_1$-$C_{18}$alkyl group, and

B, D and E are independently of each other a group of formula

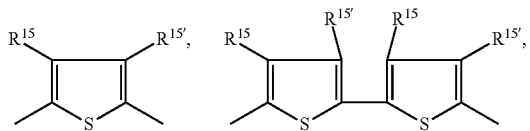

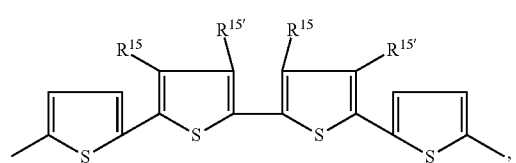

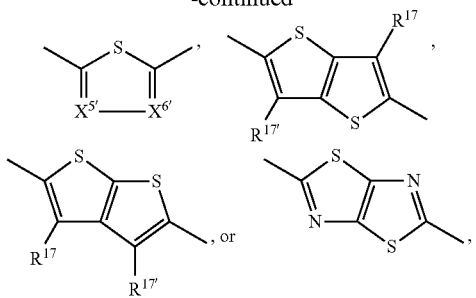

wherein one of $X^{5'}$ and $X^{6'}$ is N and the other is $CR^{14}$, or CH, $R^{15}$, $R^{15'}$, $R^{17}$ and $R^{17'}$ are independently of each other H, or a $C_1$-$C_{25}$alkyl group, which may optionally be interrupted by one or more oxygen atoms, and $R^{14}$ is a $C_1$-$C_{25}$alkyl group, which may optionally be interrupted by one or more oxygen atoms.

10. The device of claim 1, wherein the DPP polymer has a formula of
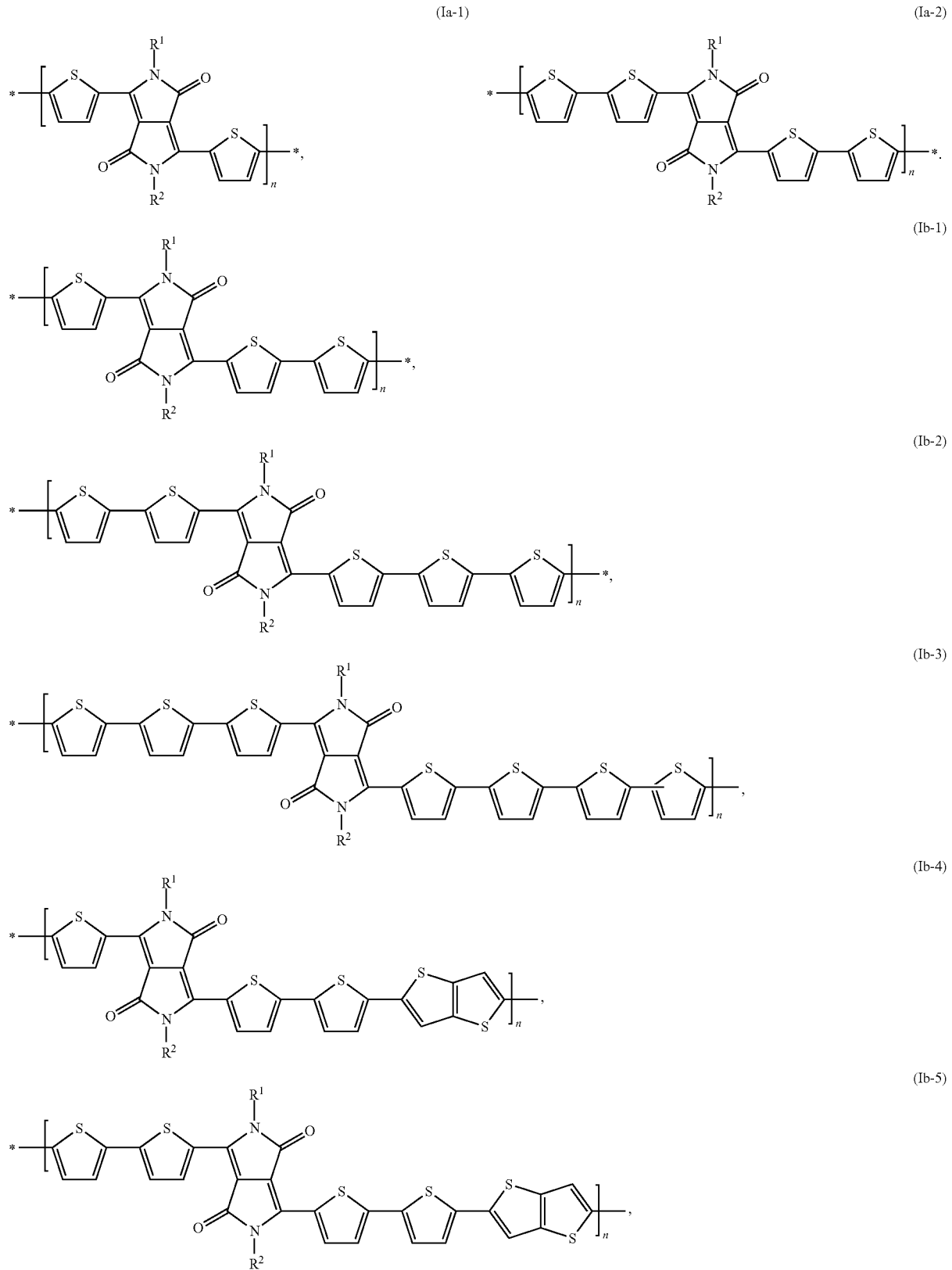

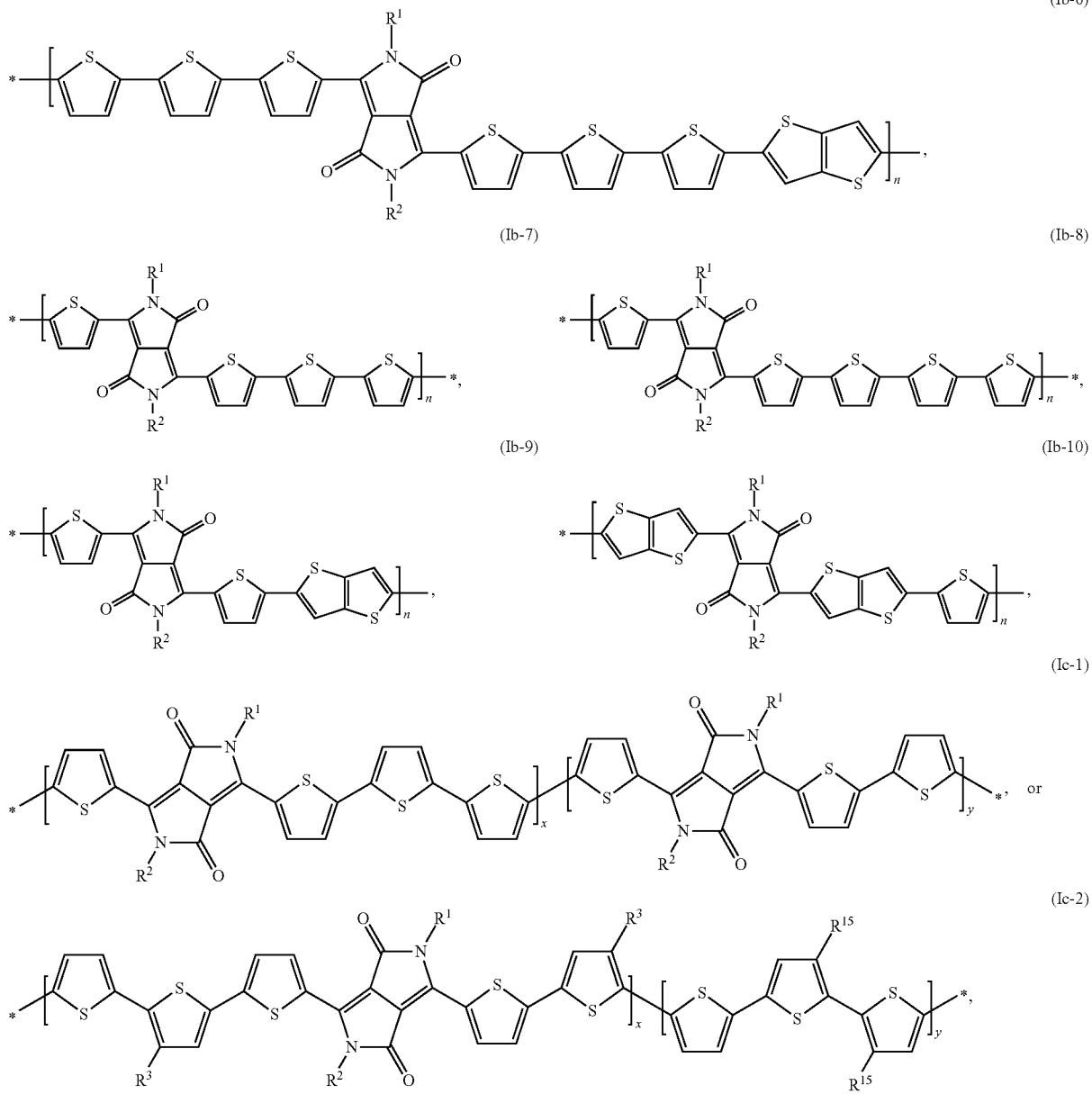

where n is 4 to 1000, $R^1$ and $R^2$ are a $C_1$-$C_{36}$alkyl group, $R^3$ is a $C_1$-$C_{18}$alkyl group, $R^{15}$ is a $C_4$-$C_{18}$alkyl group, x=0.995 to 0.005, y=0.005 to 0.995, and x+y=1.

11. The device of claim 1, wherein the stabilizing agent is included in the mixture in the amount of from 0.001 to 0.05 parts by weight per 1 part by weight of the DPP polymer.

12. The device of claim 1, wherein the device comprises the organic field effect transistor comprising the semiconducting layer, and the device further comprises:
(a) a source electrode,
(b) a drain electrode,
(c) a gate electrode,
(d) one or more gate insulator layers, and
(e) optionally a substrate.

13. A process for producing the organic semiconductor device of claim 1, the process comprising:
(aa) mixing the DPP polymer, the stabilizing agent, and a solvent, such that a mixture including 0.0005 to 0.1 parts by weight of the stabilizing agent per 1 part by weight of the DPP polymer is formed; and
(bb) applying the mixture onto an electrode, or onto a smoothing layer disposed on the electrode, wherein the electrode is disposed on a substrate.

14. A method for increasing a product life and/or performance of an organic semiconductor device, comprising:
including a stabilizing agent selected from the group consisting of a UV absorbing agent, an antioxidant, and an anti-radical agent, into a semiconductor layer comprising—a DPP polymer, such that the semiconductor layer comprises the stabilizing agent in an amount of from 0.0005 to 0.1 parts by weight per 1 part by weight of the DPP polymer.

15. The organic semiconductor device of claim 1, comprising the organic diode.

16. The organic semiconductor device of claim 1, comprising the organic field effect transistor.

17. The organic semiconductor device of claim 1, comprising the organic diode and the organic field effect transistor.

18. A method for protecting the device from degradation by light and/or oxygen during production and/or product life of the device, comprising:
   including a stabilizing agent selected from the group consisting of a UV absorbing agent, an antioxidant, and an anti-radical agent, into a semiconductor layer comprising a DPP polymer, such that the semiconductor layer comprises the stabilizing agent in an amount of from 0.0005 to 0.1 parts by weight per 1 part by weight of the DPP polymer.

19. The device of claim 3, wherein the stabilizing agent is the UV absorbing agent and is the 2-hydroxyphenyltriazine of formula III.

20. The device of claim 19, wherein the stabilizing agent is included in the mixture in the amount of from 0.001 to 0.05 parts by weight per 1 part by weight of the DPP polymer.

* * * * *